United States Patent
Mikami et al.

(10) Patent No.: US 8,648,610 B2
(45) Date of Patent: Feb. 11, 2014

(54) SIGNAL INPUT CIRCUIT AND INTEGRATED CIRCUIT

(75) Inventors: Yuuki Mikami, Kariya (JP); Toru Itabashi, Anjo (JP); Yoshiharu Takeuchi, Kariya (JP); Kenji Mochizuki, Chita-gun (JP); Naoya Tsuchiya, Kariya (JP)

(73) Assignee: Denso Corporation, Kariya (JP)

( * ) Notice: Subject to any disclaimer, the term of this patent is extended or adjusted under 35 U.S.C. 154(b) by 245 days.

(21) Appl. No.: 13/304,944

(22) Filed: Nov. 28, 2011

(65) Prior Publication Data

US 2012/0176141 A1   Jul. 12, 2012

(30) Foreign Application Priority Data

Jan. 11, 2011 (JP) .................................... 2011-3172
Jan. 11, 2011 (JP) .................................... 2011-3173
Jan. 11, 2011 (JP) .................................... 2011-3174

(51) Int. Cl.
 *G01R 31/00* (2006.01)
 *G01R 31/08* (2006.01)

(52) U.S. Cl.
 USPC .......................................... 324/555; 324/500

(58) Field of Classification Search
 USPC ........ 324/500, 382, 410, 403, 678, 76.32, 89, 324/555, 509, 512, 528, 531, 541, 544
 See application file for complete search history.

(56) References Cited

U.S. PATENT DOCUMENTS

| | | | |
|---|---|---|---|
| 5,203,868 A * | 4/1993 | Ono | 73/114.45 |
| 7,202,688 B2 * | 4/2007 | Choi | 324/750.3 |
| 7,969,167 B2 * | 6/2011 | Khanna et al. | 324/686 |
| 8,030,893 B2 * | 10/2011 | Nakatsuji | 320/116 |
| 2002/0169524 A1 | 11/2002 | Nakamoto et al. | |
| 2010/0245141 A1 | 9/2010 | Ushie et al. | |

FOREIGN PATENT DOCUMENTS

| | | | |
|---|---|---|---|
| JP | 02264874 A * | 10/1990 | G01R 31/02 |
| JP | 8-23074 | 1/1996 | |
| JP | 11-278237 | 10/1999 | |
| JP | 2000-55966 | 2/2000 | |
| JP | 2000-209090 | 7/2000 | |
| JP | 3372866 | 11/2002 | |
| JP | 2007-147363 | 6/2007 | |
| JP | 2010-93538 | 4/2010 | |
| JP | 2010-154441 | 7/2010 | |
| JP | 2012-127803 | 7/2012 | |

* cited by examiner

*Primary Examiner* — Hoai-An D Nguyen

(74) *Attorney, Agent, or Firm* — Nixon & Vanderhye PC

(57) ABSTRACT

A signal input circuit includes: a signal input device having a signal input terminal; an inspection capacitor connected between the signal input terminal and a reference potential; a connection unit connecting/disconnecting an inspection path between the inspection capacitor and the signal input terminal; a charge and discharge unit charging/discharging the inspection capacitor; and a determination processing unit carrying out a terminal failure detection processing. The determination processing unit controls the connection unit to disconnect the inspection path and controls the charge and discharge unit to set the voltage of the inspection capacitor to a terminal inspection voltage in a charge and discharge procedure, controls the connection unit to connect the inspection path in a continuity establishing procedure, and detects the terminal failure at the signal input terminal or a communication path from the signal input terminal based on a voltage of the inspection path.

26 Claims, 45 Drawing Sheets

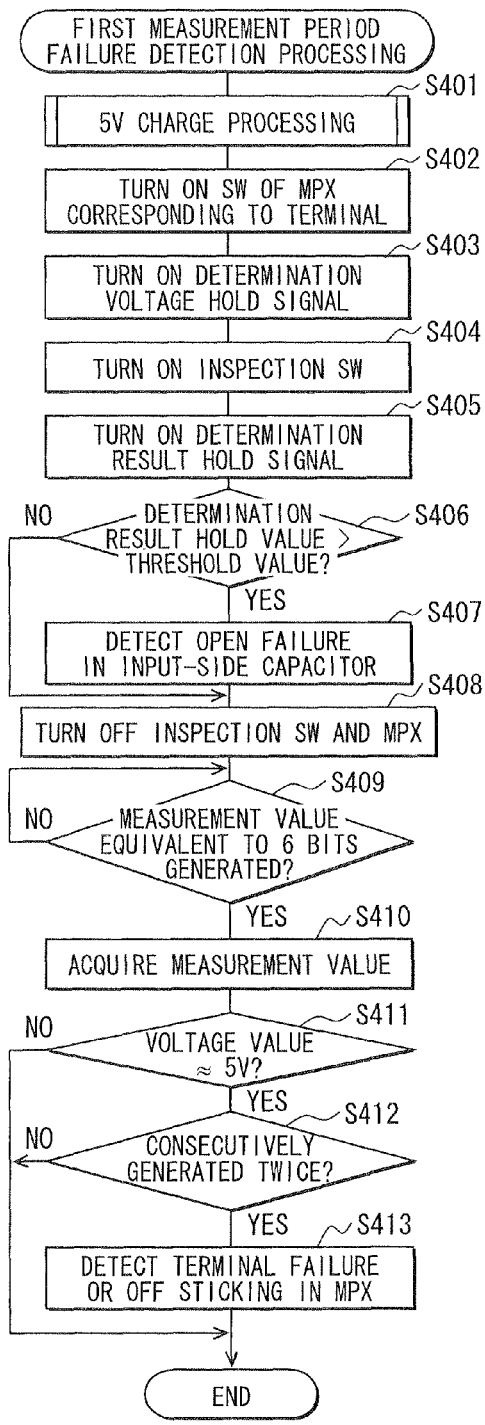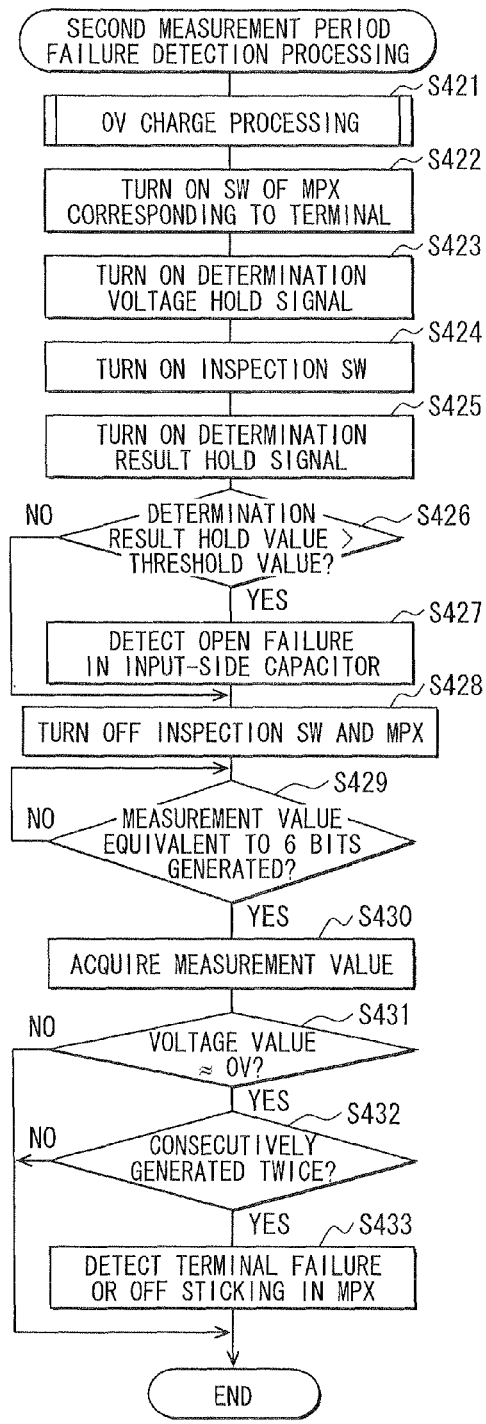

FIG. 23

| | VOL AFTER 5V CHARGE | VOL AFTER 0V CHARGE | INS SW ON STICK | INS SW OFF STICK | INS VOL SOURCE 5V SW ON STICK | INS VOL SOURCE 5V SW OFF STICK | INS VOL SOURCE 0V SW ON STICK | INS VOL SOURCE 0V SW OFF STICK | INS VOL SOURCE 5V P SUPPLY | INS VOL SOURCE GND | INSP C OPEN | MPX ON STICK | MPX OFF STICK | BREAK BET SIG INPUT TERM AND INSP SW | NO FAIL |
|---|---|---|---|---|---|---|---|---|---|---|---|---|---|---|---|
| S1401–S1407 | ≈5V | ≈0V | ○ | — | — | — | — | — | — | — | — | — | — | — | |
| | ≈5V | ≠0V | — | — | — | — | — | — | — | — | — | — | — | — | |
| | ≠5V | ≈0V | — | — | — | — | — | — | — | — | — | — | — | — | |
| | ≠5V | ≠0V | — | ○ | — | — | — | — | — | — | — | — | — | — | |
| S1408–S1422 | ≈5V | ≈0V | — | — | ○ | — | — | — | — | — | — | — | — | — | |
| | ≈5V | ≠0V | — | — | — | ○ | — | — | — | — | — | — | — | — | |
| | ≠5V | ≈0V | — | — | — | — | ○ | — | — | — | — | — | — | — | |
| | ≠5V | ≠0V | — | — | — | — | — | ○ | — | ○ | — | — | — | — | |
| S1423–S1434 | ≈5V | ≈0V | — | — | — | — | — | — | ○ | — | ○ | ○ | — | — | |
| | ≈5V | ≠0V | — | — | — | — | — | — | — | — | — | — | ○ | ○ | |
| | ≠5V | ≈0V | — | — | — | — | — | — | — | — | — | — | — | — | NO FAIL |
| | ≠5V | ≠0V | — | — | — | — | — | — | — | — | — | — | — | — | |

FIG. 41

| 5V VOL APPL | 0V VOL APPL | DET |
|---|---|---|
| ○ | ○ | OPEN FAIL IN TERM OR BREAK BET TERM AND INSP C |
| ○ | × | NOR (SENS SIG CLOSE TO 5V) |
| × | ○ | NOR (SENS SIG CLOSE TO 0V) |
| × | × | NOR (SENS SIG AT 0 TO 5V) |

○: SAME VOL AS APPLIED VOL DETECTED BY AD CONV

×: VOL DIF FROM APPLIED VOL DETECTED BY AD CONV

FIG. 45

| COMP OUT AFTER 5V APPL | COMP OUT AFTER 0V APPL | DET |
|---|---|---|
| HI LEVEL OUT | LO LEVEL OUT | OPEN FAIL IN TERM OR BREAK BET TERM AND INSP C |
| HI LEVEL OUT | HI LEVEL OUT | NOR (SENS SIG AT COMP VOL TO 5V) |
| LO LEVEL OUT | LO LEVEL OUT | NOR (SENS SIG AT 0V TO COMP VOL) |
| LO LEVEL OUT | HI LEVEL OUT | NOR (SENS SIG INDETERMINATE) | ns
SIGNAL INPUT CIRCUIT AND INTEGRATED CIRCUIT

CROSS REFERENCE TO RELATED APPLICATIONS

This application is based on Japanese Patent Applications No. 2011-3172 filed on Jan. 11, 2011, No. 2011-3173 filed on Jan. 11, 2011, and No. 2011-3174 filed on Jan. 11, 2011, the disclosures of which are incorporated herein by reference.

TECHNICAL FIELD

The present invention relates to a signal input circuit and an integrated circuit that carry out processing in accordance with input signals inputted from external sources.

BACKGROUND

A vehicle is mounted with many sensors, including a temperature sensor that measures the temperature of the interior of an engine, a throttle position sensor that detects a throttle opening, and the like. In on-board units, various measurements are carried out by detecting the voltage levels of input signals from these sensors by AD conversion or carrying out other like processing. In these on-board units, any sensor failure has been conventionally detected based on the voltage level of an input signal detected by AD conversion. In in-vehicle applications, sensors are in such an environment that they are susceptible to external noise; therefore, it is necessary to widen the dynamic range of each sensor to minimize the influence of external noise. If an open failure occurs in an input terminal for input signals of IC that carries out AD conversion, the following will take place: the voltage level of input to the AD conversion circuit is made undefined by parasitic capacitance produced in the IC; and as a result, the open failure in the input terminal cannot be detected from the result of AD conversion. One of methods for detecting an input terminal open failure and the like is such that: multiplexing is implemented using multiple sensors, multiple input circuits, and multiple AD converters and it is determined from the relation between multiple AD conversion results. However, this inevitably leads to an increased cost.

To cope with this, Patent Document 1 describes a break detector including: an input terminal to which input signals are inputted from a sensor and the like; an AD converter connected to the input terminal through a signal line; a capacitor provided between the signal line and another line; and SW provided on the signal line for controlling the connection between the capacitor and the input terminal. In this break detector, the capacitor and the input terminal are disconnected from each other by the SW during periods for which AD conversion is not carried out; and the capacitor is connected to a negative power supply and the voltage across the capacitor is set to a negative voltage out of a variation range of the voltages of input signals. When AD conversion is carried out, the capacitor, input terminal, and AD converter are connected together by the SW. During the AD conversion, the voltage value of the input terminal is detected at normal times and a negative voltage generated by the capacitor is detected when an open failure occurs in the input terminal. In the invention described in Patent Document 1, therefore, the AD converter must be capable of detecting a wider range of voltages than the variation range of input signals and this complicates the configuration of the AD converter and increases its size.

With the break detector described in Patent Document 1, any open failure in the input terminal can be detected. However, it is necessary to apply negative voltage to the capacitor for a certain time to set a negative voltage in the capacitor before starting AD conversion. This delays detection of the voltage value of an input signal.

According to the invention described in Patent Document 1, any open failure in an input terminal and the like can be detected. However, it is necessary to detect a voltage value out of the variation range of an input signal by an AD converter. For this reason, it is necessary to adjust a sensor and the like that generate input signals to make the variation range of the input signals narrower than the range of voltage that can be detected with the AD converter. Or, it is necessary to configure the AD converter so that it can detect a wider range of voltage than the variation range of input signals. For this reason, there is a possibility that a used sensor and the like are limited or the configuration of the AD converter is complicated or the size thereof is increased.

Especially, with respect to AD converters for in-vehicle applications that are susceptible to external noise, as already mentioned above, it is necessary to widen the dynamic range of each sensor to minimize the influence of external noise. It is difficult to narrow the variation range of input signals from each sensor. For this reason, it is necessary to configure an AD converter so that it can detect a wider range of voltage than the variation range of input signals. This causes the problem of the complicated configuration and increased size of the AD converter.

Further, according to the invention described in Patent Document 1, an open failure in an input terminal and the like can be detected. However, since electric charges are charged in a capacitor connected to an input terminal to detect any open failure in the input terminal or the like, a problem arises. The voltage value of an input signal is varied and there is a possibility that an error is produced in a measurement value of the voltage of the input signal.

[Patent Document 1] JP-A-2000-55966

SUMMARY

In view of the above-described problem, it is an object of the present disclosure to provide a signal input circuit. It is another object of the present disclosure to provide an integrated circuit.

The following can be detected by the signal input circuit and the integrated circuit without delaying detection of the voltage value of an input signal: an open failure in a signal input terminal to which input signals are inputted and a break in a communication path for communicating input signals.

According to a first aspect of the present disclosure, a signal input circuit includes: a signal input device having a signal input terminal, through which an input signal is input into the signal input device, the input signal having a voltage variable within a predetermined variation range; an inspection capacitor having one end connected to the signal input terminal and the other end connected to a reference potential; a connection unit arranged in the signal input device and connecting and disconnecting an inspection path between the inspection capacitor and the signal input terminal; a charge and discharge unit arranged in the signal input device and charging and discharging the inspection capacitor so that a voltage between both ends of the inspection capacitor is set to be within the predetermined variation range; and a determination processing unit arranged in the signal input device and carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed, and the terminal failure occurs at the signal input terminal or a communication path of the input signal input from the signal input terminal.

With the signal input circuit described above, it is possible to suppress variation in the voltage of an input signal and detect any open failure in the signal input terminal to which an input signal is inputted and any break in a communication path for transmitting input signals.

According to a second aspect of the present disclosure, an integrated circuit having a signal input terminal, through which an input signal is input into the integrated circuit, the input signal having a voltage variable within a predetermined variation range, the integrated circuit includes: an input-side capacitor arranged between the signal input terminal and a reference potential; a connection unit for connecting and disconnecting an inspection path, which connects an inspection capacitor and the signal input terminal, the inspection capacitor arranged on an outside of the integrated circuit and having one end connected to the reference potential; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed, and the terminal failure occurs at the signal input terminal or a communication path of the input signal input from the signal input terminal.

With the integrated circuit described above, it is possible to suppress variation in the voltage of an input signal and detect any open failure in the signal input terminal to which an input signal is inputted and any break in a communication path for transmitting input signals.

According to a third aspect of the present disclosure, an integrated circuit having a signal input terminal, through which an input signal is input into the integrated circuit, the input signal having a voltage variable within a predetermined variation range, the integrated circuit includes: an input-side capacitor arranged between the signal input terminal and a reference potential; an inspection capacitor having one end connected to the signal input terminal and the other end connecting to the reference potential; a connection unit for connecting and disconnecting an inspection path, which connects the inspection capacitor and the signal input terminal; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed, and the terminal failure occurs at the signal input terminal or a communication path of the input signal input from the signal input terminal.

With the integrated circuit described above, it is possible to suppress variation in the voltage of an input signal and detect any open failure in the signal input terminal to which an input signal is inputted and any break in a communication path for transmitting input signals.

BRIEF DESCRIPTION OF THE DRAWINGS

The above and other objects, features and advantages of the present invention will become more apparent from the following detailed description made with reference to the accompanying drawings. In the drawings:

FIG. 8A is a flowchart of first measurement period failure detection processing in the first embodiment;

FIG. 8B is a flowchart of second measurement period failure detection processing in the first embodiment;

FIG. 23 is a diagram listing the failures detected by the IC failure detection processing in the fourth embodiment;

FIG. 41 is a table illustrating a determination method for an open failure in a signal input terminal and the like;

FIG. 45 is a table illustrating a determination method for an open failure in a signal input terminal and the like.

DETAILED DESCRIPTION (Description of Configuration)

Figure 1:
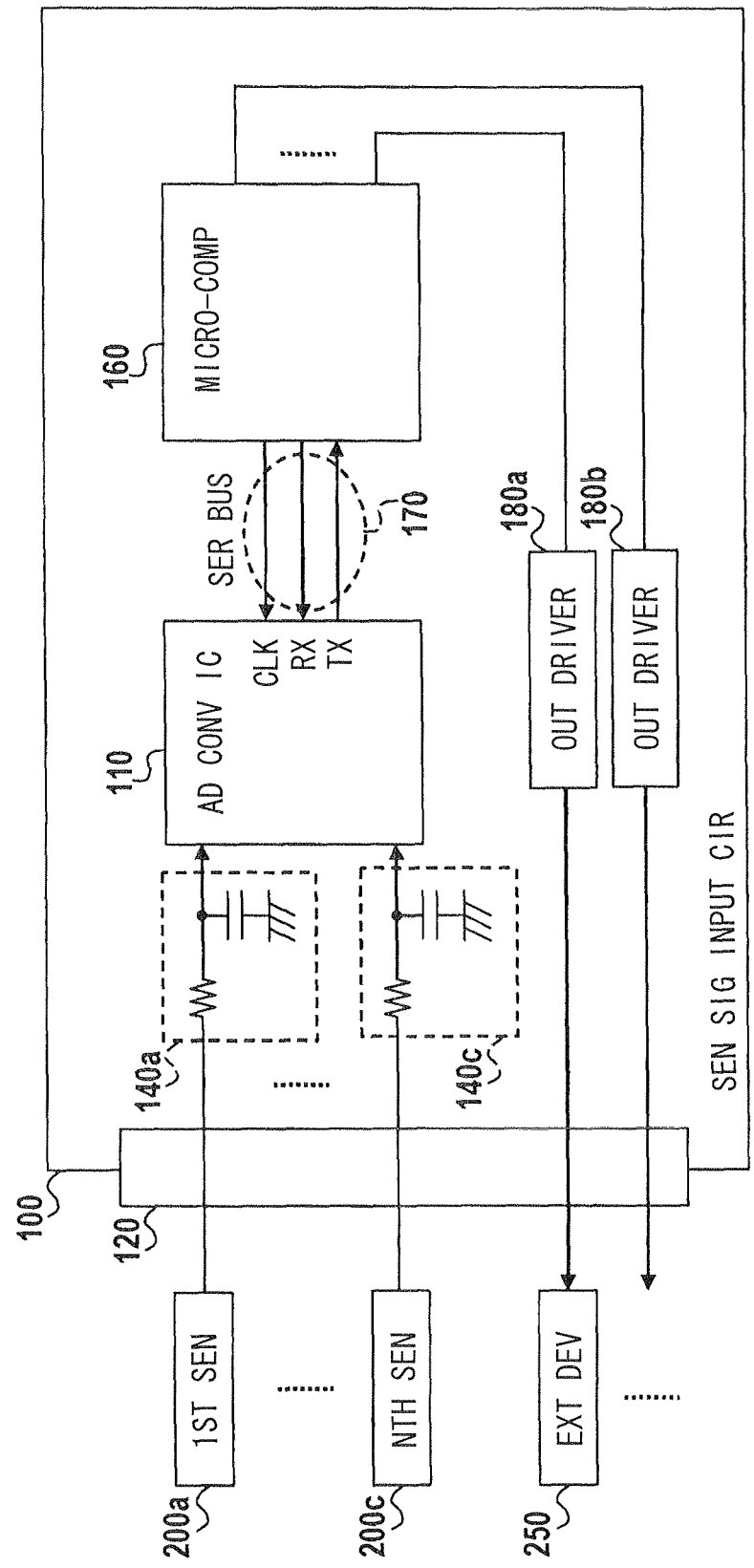
FIG. 1 is a block diagram illustrating the configuration of a sensor signal input circuit.

FIG. 1 is a block diagram illustrating the configuration of a sensor signal input circuit 100 in an embodiment. The sensor signal input circuit 100 is connected with first to Nth sensors 200a to 200c that generate sensor signals whose voltage value varies within a range of 0V to 5V according to the state of a measuring object and a user's operation. Examples of these sensors are a temperature sensor and a throttle position sensor that detects the state of operation of the accelerator of the relevant vehicle. The sensor signal input circuit 100 detects the voltage values of sensor signals inputted from these sensors by AD conversion. Then it transmits various signals to external devices 250 connected to the circuit according to these voltage values to control them.

Specifically, the sensor signal input circuit 100 includes: a connector 120 that connects the first to Nth sensors 200a to 200c and external devices 250; first to Nth filter circuits 140a to 140c for removing noise from sensor signals inputted from the first to Nth sensors 200a to 200c through the connector 120; and an AD conversion IC 110 that carries out AD conversion on sensor signals. The sensor signal input circuit 100 further includes: a microcomputer 160 that acquires the voltage values of sensor signals from the AD conversion IC 110 through serial buses 170 and carries out varied processing based on the voltage values; and output drivers 180 for transmitting various signals generated by the microcomputer 160 to external devices 250.

Figure 2:
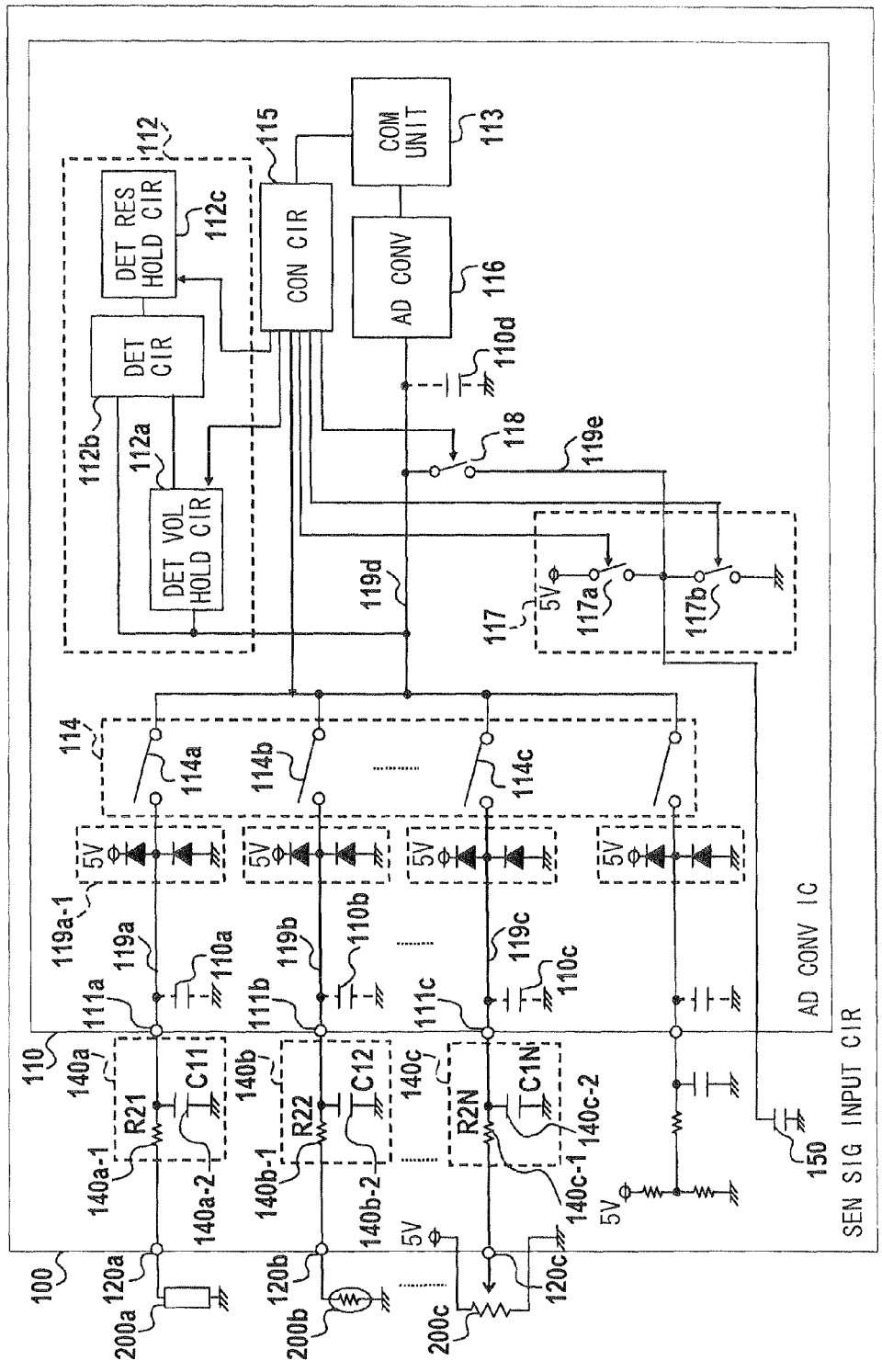
FIG. 2 is a block diagram illustrating the configuration of an AD conversion IC and the like in a sensor signal input circuit.

Description will be given to the configuration of the peripherals of the AD conversion IC 110 and the configuration of the interior of the AD conversion IC 110 with reference to the block diagram in FIG. 2. The connector 120 of the sensor signal input circuit 100 is provided with first to Nth external input terminals 120a to 120c respectively connected to the first to Nth sensors 200a to 200c. At the same time, the AD conversion IC 110 is provided with first to Nth signal input terminals 111a to 111c respectively connected to the first to Nth external input terminals 120a to 120c. Sensor signals are inputted to the AD conversion IC 110 through these terminals.

The first filter circuit 140a includes: an input-side resistor 140a-1 provided on the line connecting the first external input terminal 120a and the first signal input terminal 111a; and an input-side capacitor 140a-2 provided between the first signal input terminal 111a and reference potential. The other filter circuits are similarly configured. The input-side capacitors and input-side resistors connected to the first to Nth external input terminals 120a to 120c will be respectively referred to as C1x (or C11 to C1N) and R2x (or R21 to R2N).

Further, the sensor signal input circuit 100 includes an inspection capacitor 150 one end of which is connected to a terminal of the AD conversion IC 110 and the other end of which is connected to reference potential. The inspection capacitor 150 is used to inspect the first to Nth signal input terminals 111a to 111c and the like. (Details will be described later.)

The AD conversion IC 110 includes: a multiplexer 114 (also referred to as MPX) comprised of first to Nth switches 114a to 114c that respectively control the connection between the first to Nth signal input terminals 111a to 111c and a signal line 119d; and an AD converter 116 that detects the voltage value of the signal line 119d within a range of 0 to 5V by AD conversion. The AD converter 116 is provided with a sampling capacitor (not shown) connected to the signal line 119d. The voltage value of the signal line 119d is detected by detecting the voltage value of the sampling capacitor charged with signals transmitted through the signal line 119d by sequential AD conversion.

The AD conversion IC 110 further includes a first surge protection circuit 119a-1 provided between the first signal input terminal 111a and the multiplexer 114 for protecting the circuit from surge current. The first surge protection circuit 119a-1 is comprised of: a diode whose anode is connected to a first input line 119a connecting the first signal input terminal 111a and the multiplexer 114 and whose cathode is connected to a 5V power supply; and a diode whose cathode is connected to the first input line 119a and whose anode is connected to reference potential. Similarly configured surge protection circuits are also provided between the other signal input terminals and the multiplexer 114.

Further, the AD conversion IC 110 includes: an inspection switch 118 that is provided on an inspection line 119e connecting the signal line 119d and the above-mentioned inspection capacitor 150 and establishes or breaks continuity in the inspection line 119e; an inspection power supply 117 that applies voltage to the inspection capacitor 150; a voltage change detection circuit 112 that detects to what extent the voltage value has changed in the signal line 119d during a predetermined period; and a control circuit 115 that controls the multiplexer 114, AD converter 116, inspection power supply 117, inspection switch 118, and voltage change detection circuit 112.

The inspection power supply 117 is comprised of: a 5V switch 117a for setting the state of connection with the 5V power supply; and a 0V switch 117b for setting the state of connection with reference potential. By turning ON either of these switches, voltage of 5V or 0V is applied to the inspection capacitor 150.

Further, the voltage change detection circuit 112 includes: a determination voltage hold circuit 112a configured as a latch circuit for holding the voltage value of the signal line 119d according to a determination voltage hold signal from the control circuit 115; a determination circuit 112b that determines the difference between the voltage value held in the determination voltage hold circuit 112a and the voltage value of the signal line 119d; and a determination result hold circuit 112c that holds the difference detected by the determination circuit 112b as a determination result hold value according to a determination result hold signal from the control circuit 115.

Further, the AD conversion IC 110 is provided with a communication unit 113 that communicates with the microcomputer 160 through serial buses 170. The communication unit 113 transmits the voltage values of sensor signals detected by the AD converter and various failures (Details will be described later) detected by the control circuit 115 to the microcomputer 160.

In the AD conversion IC 110, parasitic capacitances 110a to 110d of 5 pF or so are generated between the first to Nth signal input terminals 111a to 111c and reference potential and between the signal line 119d and reference potential. The capacitance of the input-side capacitor provided in each signal input terminal is larger than the capacitance of the inspection capacitor 150. For example, the capacitance of each input-side capacitor may be 0.1 μF and the capacitance of the inspection capacitor 150 may be 0.01 μF.

The first to Nth signal input terminals 111a to 111c will also be referred to as ch1 to chN.

DESCRIPTION OF OPERATION

First Embodiment

Description will be given to the operation of the AD conversion IC 110 of the sensor signal input circuit 100 in the first embodiment.

(1) Overview

The AD conversion IC 110 measures the voltage values of sensor signals inputted to ch1 to chN by AD conversion in accordance with an instruction from the microcomputer 160 and transmits the obtained measurement values to the microcomputer 160.

Further, the AD conversion IC 110 detects the following failures in parallel to AD conversion carried out in accordance with an instruction from the microcomputer 160: an open failure in ch (signal input terminal) as the target of AD conversion; a terminal failure that is a break in the path from this ch to the inspection switch 118; and an open failure (C1x failure) in the input-side capacitor provided in this ch. In addition, the AD conversion IC 110 detects the following before the start of AD conversion or after the termination thereof: a failure (SW, etc. failure) in the multiplexer 114, inspection power supply 117, inspection switch 118, reference potential, or 5V power supply and an open failure (R2x failure) in an input-side resistor.

Hereafter, description will be given to the processing of detecting these failures.

(2) Communication Between Microcomputer and AD Conversion IC

Description will be given to the communication processing between the microcomputer 160 and the AD conversion IC 110 with reference to the timing chart in FIG. 3.

Figure 3:
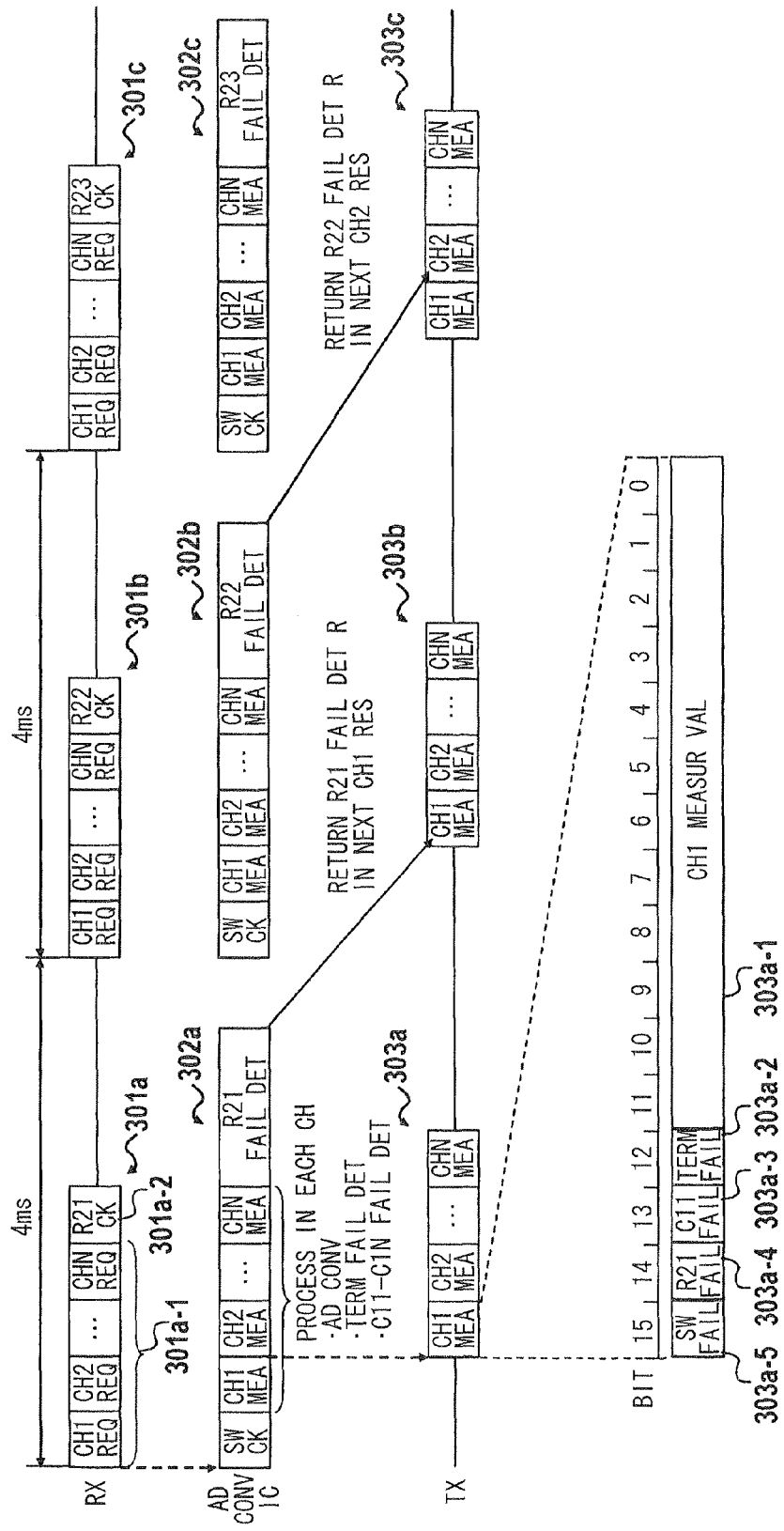
FIG. 3 is a timing chart of communication between a microcomputer and an AD conversion IC in a first embodiment.

The timing chart in FIG. 3 indicates the following timing: the timing with which the AD conversion IC 110 receives a command 301 instructing AD conversion or the like from the microcomputer 160; the timing with which the AD conversion IC 110 carries out processing 302, such as AD conversion, in accordance with these commands; and the timing with which response data 303 indicating a measurement value obtained by AD conversion and the like is transmitted from the AD conversion IC 110 to the microcomputer 160.

The microcomputer 160 requests the AD conversion IC 110 to carry out AD conversion with respect to ch1 to chN and further transmits a command 301 instructing R2x failure detection at intervals of 4 ms. The microcomputer 160 instructs R2x failure detection in any one input-side resistor by each command 301 and the target input-side resistor is cyclically switched in the order of R21 to R2N. As shown in FIG. 3 as an example, the command 301a instructing R21 failure detection is composed of: a block 301a-1 comprised of measurement instruction code instructing AD conversion on ch1 to chN; and R2x failure detection instruction code 301a-2 instructing R21 failure detection. The other commands are also similarly composed.

When the AD conversion IC 110 starts the reception of a command 301, it first carries out SW, etc. failure detection processing (referred to as "SW, etc. check" in the drawing) for detecting any SW, etc. failure. When it sequentially receives a measurement instruction code with respect to each ch, it carries out AD conversion on the ch corresponding to the received measurement instruction code (referred to as "chx measurement" in the drawing). Further, it carries out measurement period failure detection processing to detect any terminal failure in the ch and any C1x failure in the input-side capacitor provided in the ch in parallel to this AD conversion. When AD conversion on chN is terminated, it carries out input-side resistor failure detection processing to detect an R2x failure in the input-side resistor indicated by the received R2x failure detection instruction code. The SW, etc. failure detection processing, measurement period failure detection processing, and input-side resistor failure detection processing will be described in detail later.

Each time AD conversion on ch is terminated, the AD conversion IC 110 generates two-byte measurement data (referred to as "chx measurement" in the drawing) composed of measurement data and the like pertaining to the ch. Then it transmits measurement data of ch1 to chN as response data 303 to the microcomputer 160. Each piece of measurement data contains: data indicating the presence or absence of a terminal failure and the presence or absence of C1x failure with respect to the corresponding ch; data indicating the presence or absence of a SW, etc. failure detected before the start of AD conversion; and data indicating the presence or absence of R2x failure with respect to the ch detected in input-side resistor failure detection processing carried out in accordance with a previously received command. The presence or absence of R2x failure detected by the command received this time is reflected in measurement data transmitted in accordance with a command received next.

As an example, measurement data corresponding to ch1 in response data 303a contains: 12-bit measurement data 303a-1; a terminal failure bit 303a-2 indicating the presence or absence of a terminal failure with respect to ch1; and a C11 failure bit 303a-3 indicating the presence or absence of a C11 failure. Further, it contains: a SW, etc. failure bit 303a-5 indicating the present or absence of a SW, etc. failure; and an R21 failure bit 303a-4 indicating the presence or absence of an R21 failure detected in accordance with a previously received command. The measurement data with respect to the other chs and measurement data composing the other response data are also similarly composed.

(3) Detection of Terminal Failure and C1x Failure

Description will be given to the detection of terminal failure and C1x failure in the first embodiment.

With the inspection capacitor 150 is disconnected from all the chs, an inspection voltage value within the variation range of a sensor signal is applied to the inspection capacitor 150. Then the voltage across the inspection capacitor 150 is set to the inspection voltage value (referred to as charge processing) and thereafter continuity is established between the inspection capacitor 150 and any ch. When the voltage value of the signal line 119d is kept close to the inspection voltage value generated by the inspection capacitor 150 at this time, it is guessed that the inspection capacitor 150 is not charged or discharged and a terminal failure has occurred.

However, when the sensor signal itself is close to the inspection voltage value, the signal line 119d is brought close to the inspection voltage value even though a terminal failure has not occurred. Therefore, it cannot be determined that a terminal failure has occurred. In the first embodiment, consequently, the voltage value of the signal line 119d is detected by taking the following measure: charge processing is carried out with two different voltage values, 5V and 0V and thereafter, continuity is established between the inspection capacitor 150 and any target ch. When the signal line 119d takes the inspection voltage value both after charge processing with 5V and after charge processing with 0V, it is considered that a terminal failure has occurred.

When continuity is established between the inspection capacitor 150 and a target ch after the execution of charge processing, charging/discharging of electric charges of the inspection capacitor 150 is caused and the voltage of the target ch temporarily varies. When an open failure has occurred in C1x, the range of variation in the voltage of the target ch is widened as compared with normal times; therefore, a C1x failure can be detected based on this range of variation.

However, when the voltage value of a sensor signal is close to the inspection voltage value, sufficient variation is not caused even though an open failure in C1x has occurred and the C1x failure cannot be detected. In the first embodiment, consequently, the following measure is taken: charge processing is carried out with two voltage values, 5V and 0V; after the execution of each charge processing, continuity is established between the inspection capacitor 150 and the target ch; and the range of variation in the voltage value of the signal line 119d between before and after the establishment of continuity. When the range of variation exceeds a threshold value, it is considered that a C1x failure has occurred.

Figure 4:
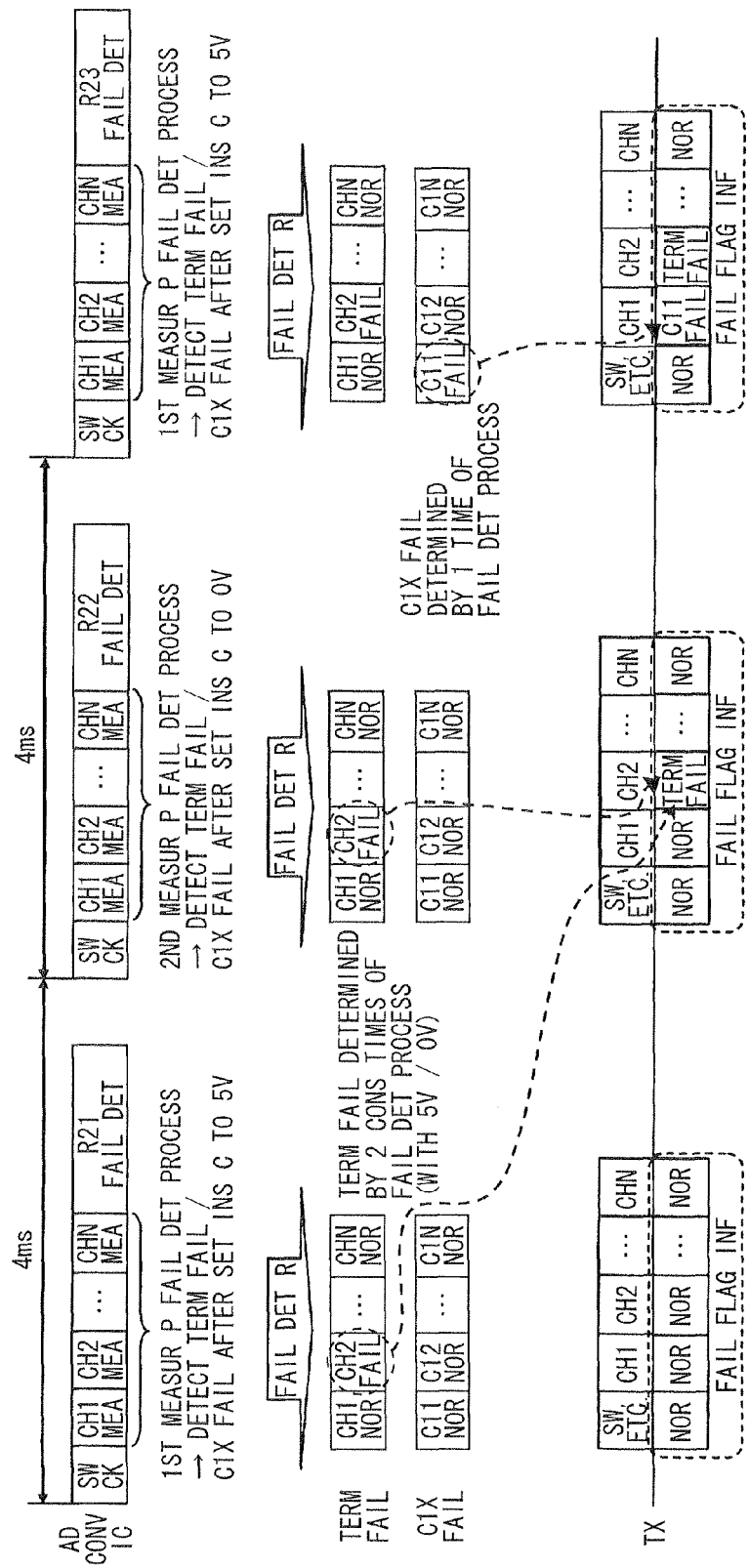
FIG. 4 is a timing chart of the timing of execution of AD conversion and the like and the timing of transmission of response data in the first embodiment.

In the AD conversion IC 110 in the first embodiment, as mentioned above, the above-mentioned terminal failure detection and C1x failure detection are carried out in parallel to AD conversion. As indicated in the timing chart in FIG. 4, the AD conversion IC 110 carries out SW, etc. failure detection processing (referred to as "SW, etc. check" in the drawing) first after the start of reception of a command from the microcomputer 160. Thereafter, it sequentially carries out AD conversion (referred to as "chx measurement" in the drawing) on ch1 to chN and carries out measurement period failure detection processing in parallel to AD conversion to detect a terminal failure and a C1x failure with respect to the target ch. In the first embodiment, the following pieces of processing are carried out as this measurement period failure detection processing: first measurement period failure detection processing involving 5V charge processing and second measurement period failure detection processing involving 0V charge processing. Each time the AD conversion IC 110 newly receives a command 301, it alternately switches between first measurement period failure detection processing and second measurement period failure detection processing to detect a terminal failure and a C1x failure with respect to ch1 to chN. When it is consecutively determined by first and second measurement period failure detection processing that there is a possibility of a terminal failure, it is considered that a terminal failure has occurred. Meanwhile, a C1x failure is detected by one cycle of measurement period failure detection processing.

(4) Measurement Period Failure Detection Processing (4-1) Overview

Description will be given to the overview of the first and second measurement period failure detection processing with reference to the timing charts in FIGS. 5 and 6.

Figure 5:
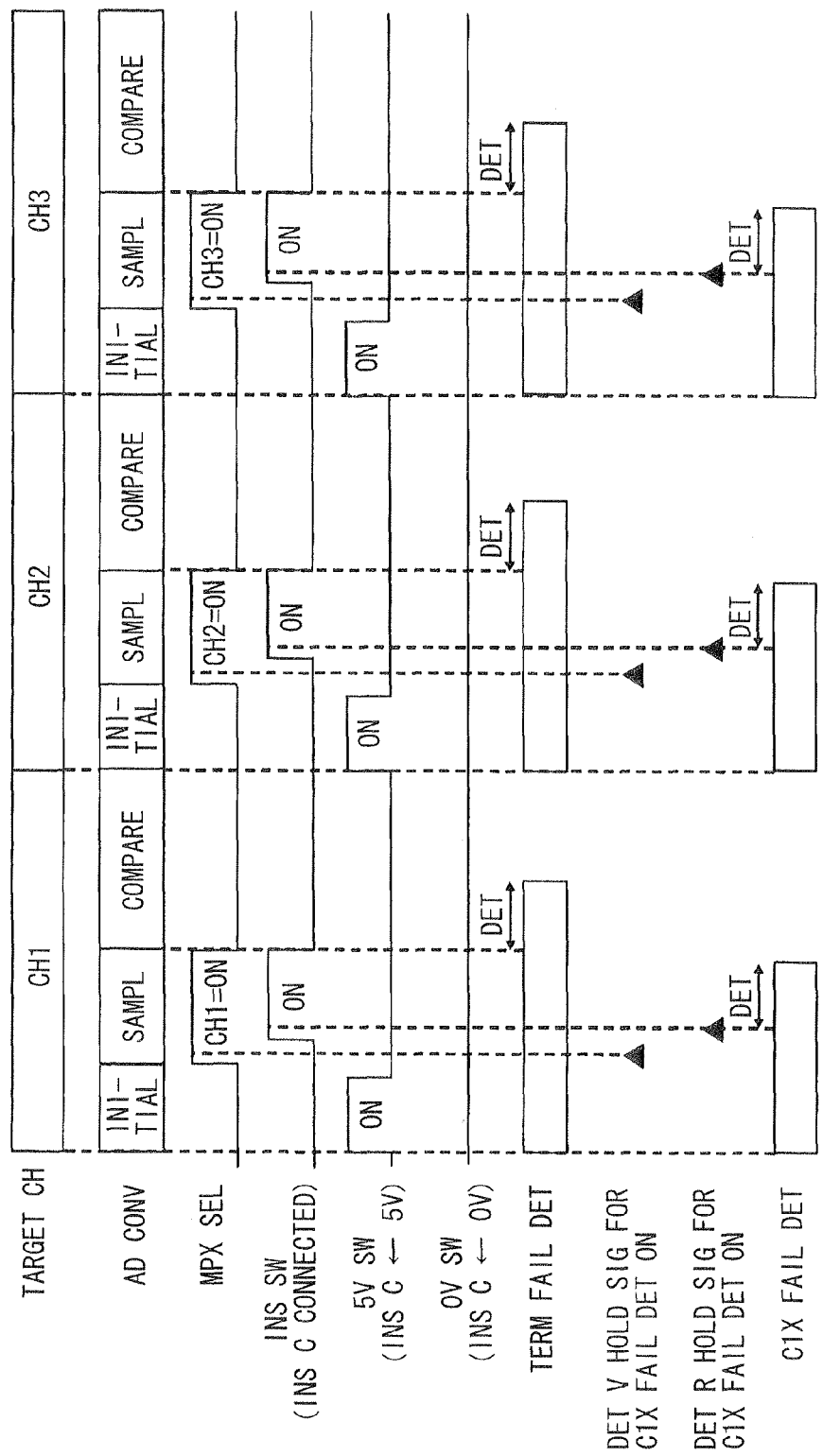
FIG. 5 is a timing chart of first measurement period failure detection processing in the first embodiment.

FIG. 5 is a timing chart of the first measurement period failure detection processing. When the AD conversion IC 110 receives a command from the microcomputer 160, it carries out AD conversion on ch1 to chN by the AD converter 116. The AD conversion is carried out through three procedures: initialization in which the voltage of the sampling capacitor provided in the AD converter 116 is set to 0V; sampling in which continuity is established between the target ch of AD conversion and the sampling capacitor by the multiplexer 114 to set the sampling capacitor to the voltage value of the target ch; and comparison in which measurement data (12 bit) indicating the voltage value of the sampling capacitor is generated by sequential conversion.

In the first measurement period failure detection processing, 5V charge processing is carried out. In the 5V charge processing, the 5V switch 117a of the inspection power supply 117 is turned ON at the same time as the start of initialization in AD conversion and kept ON for a certain period to apply voltage of 5V to the inspection capacitor 150. (Details will be described later.)

Then the switch corresponding to the target ch in the multiplexer 114 is turned ON and sampling is started. Thereafter, the inspection switch 118 is turned ON and continuity is established between the inspection capacitor 150 and the signal line 119d. At the same time as the termination of sampling, the inspection switch 118 is turned OFF and continuity is broken between the inspection capacitor 150 and the signal line 119d.

In cases where a terminal failure has not occurred, the following takes place when the inspection switch 118 is turned ON: the electric charges are discharged from the inspection capacitor 150 and the voltage of the signal line 119d temporarily rises; and thereafter, this voltage becomes equal to the voltage value of a sensor signal inputted through the target ch. For this reason, the sampling capacitor takes the voltage value of the sensor signal. Meanwhile, in cases where a terminal failure has occurred, the voltage value of the signal line 119d is made equal to 5V or a value close to 5V by the inspection capacitor 150; and the sampling capacitor is set to 5V or a value close to 5V.

For this reason, when a voltage value of 5V or close to 5V is detected, it is determined that there is a possibility of a terminal failure. When it has been already determined by second measurement period failure detection processing carried out immediately before with respect to the target ch that there is a possibility of a terminal failure, it is considered that a terminal failure has occurred.

To determine the presence or absence of a terminal failure, it only has to be detected that the voltage value of the sampling capacitor is at least close to 5V. For this reason, it is unnecessary to wait until measurement data equivalent to 12 bits is generated by comparison; and at the point of time when measurement data equivalent to six bits is generated, a possibility of a terminal failure is determined.

A determination voltage hold signal is outputted from the control circuit 115 to the voltage change detection circuit 112 immediately before the inspection switch 118 is turned ON. A determination result hold signal is outputted from the control circuit 115 to the voltage change detection circuit 112 immediately after the inspection switch 118 is turned ON. Then the voltage value (determination result hold value) of the signal line 119d that changed between before and after the inspection switch 118 is turned ON is detected by the voltage change detection circuit 112. A C1x failure with respect to the target ch is detected based on whether or not this determination result hold value is higher than a threshold value (for example, 2.5V).

Figure 6:
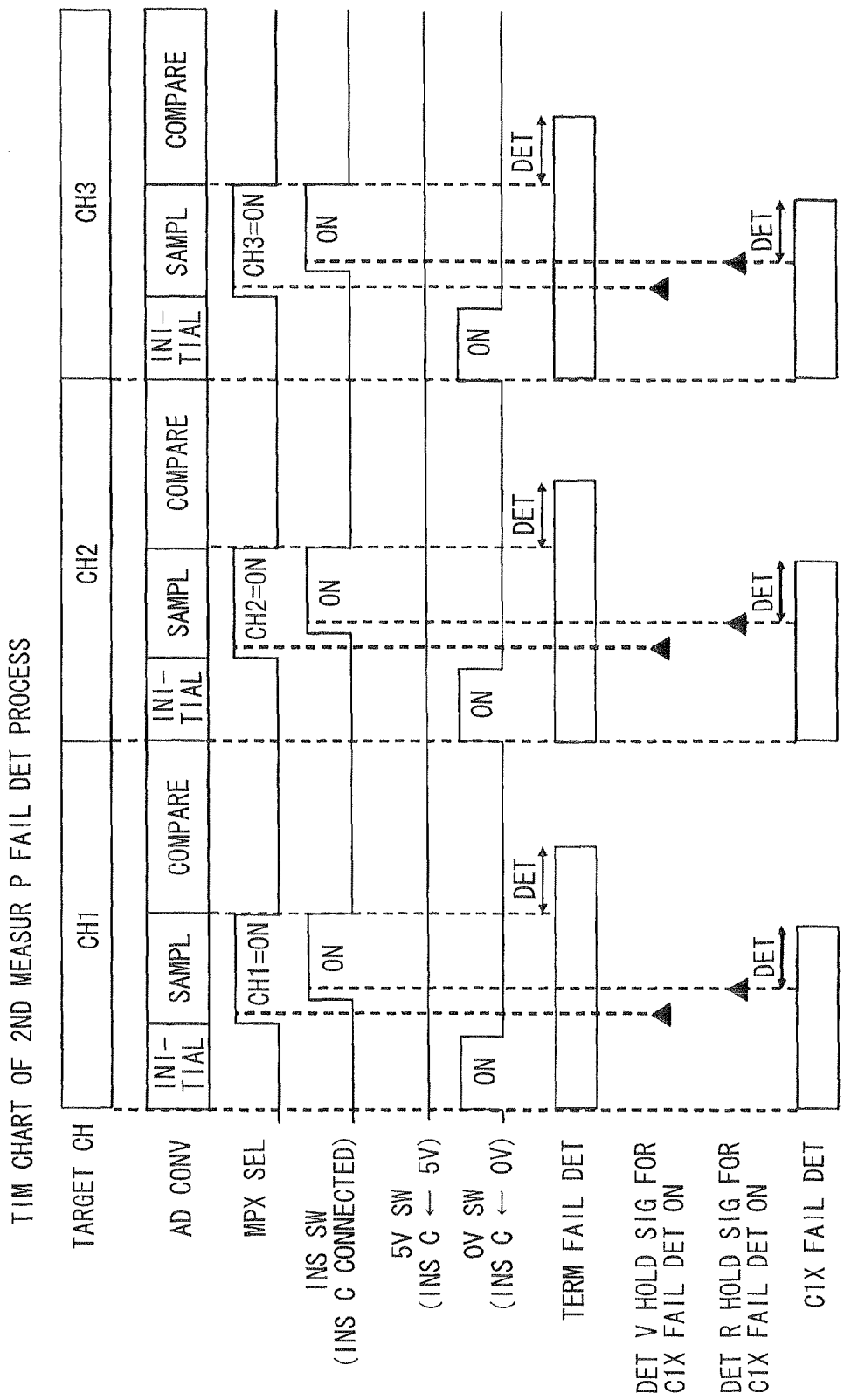
FIG. 6 is a timing chart of second measurement period failure detection processing in the first embodiment.

FIG. 6 is a timing chart of the second measurement period failure detection processing. In the second measurement period failure detection processing, 0V charge processing is carried out. In the 0V charge processing, the 0V SW 117b of the inspection power supply 117 is turned ON at the same time as the start of initialization of AD conversion and kept ON for a certain period to apply voltage of 0V to the inspection capacitor 150. Thereafter, a possibility of a terminal failure is similarly determined and a C1x failure is detected as in the first measurement period failure detection processing.

(4-2) Details

Figure 7A:
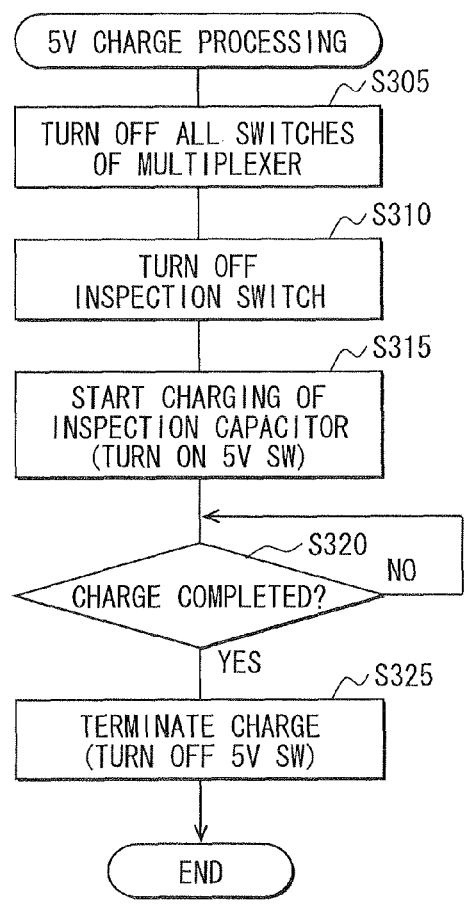
FIG. 7A is a flowchart of 5V charge processing in the first embodiment.
Figure 7B:
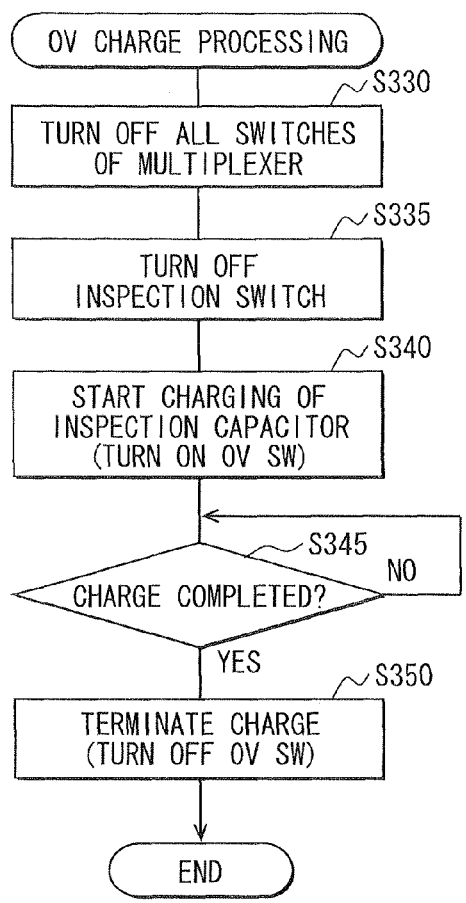
FIG. 7B is a flowchart of 0V charge processing in the first embodiment.

First, description will be given to 5V charge processing and 0V charge processing with reference to the flowcharts in FIGS. 7A and 7B. In these pieces of processing, a voltage of 5V or 0V is applied to the inspection capacitor 150 to set the voltage value of the inspection capacitor 150 to 5V or 0V. These pieces of processing are carried out by the control circuit 115 of the AD conversion IC 110 when failure detection is carried out.

(a) 5V Charge Processing

At Step S305, the control circuit 115 of the AD conversion IC 110 turns OFF all the switches of the multiplexer 114 to disconnect all the chs and the signal line 119d from each other and the flow proceeds to the processing of Step S310.

At Step S310, the control circuit 115 turns OFF the inspection switch 118 to disconnect the signal line 119d and the inspection capacitor 150 from each other. Then the flow proceeds to the processing of Step S315.

At Step S315, the control circuit 115 turns ON the 5V switch 117a of the inspection power supply 117 and turns OFF the 0V switch 117b thereof to apply a voltage of 5V to the inspection capacitor 150. Then the flow proceeds to the processing of Step S320.

At Step S320, the control circuit 115 determines whether or not a predetermined time has passed after the start of voltage application. When an affirmative determination is made (Step S320: Yes), the flow proceeds to the processing of Step S325; and when a negative determination is made (Step S320: No), the flow proceeds to the processing of Step S320.

At Step S325, the control circuit 115 turns OFF the 5V switch 117a to terminate voltage application to the inspection capacitor 150 and terminates this series of processing.

(b) 0V Charge Processing

The 0V charge processing is similar to the 5V charge processing and description will be given mainly to a difference from the 5V charge processing.

In the 0V charge processing, Step S330 to Step S350 respectively corresponding to Step S305 to Step S325 of the 5V charge processing are carried out.

At Step S340 corresponding to Step S315 of 5V charge processing, the control circuit 115 turns OFF the 5V switch 117a of the inspection power supply 117 and turns ON the 0V switch 117b thereof to apply a voltage of 0V to the inspection capacitor 150. Then the flow proceeds to the processing of Step S345.

At Step S350 corresponding to Step S325 of the 5V charge processing, the control circuit 115 turns OFF the 0V switch 117b to terminate voltage application to the inspection capacitor 150 and terminates this series of processing.

At the other steps than Step S340 and Step S350, the same processing as that of the corresponding steps of the 5V charge processing is carried out.

(c) Details of First Measurement Period Failure Detection Processing

Description will be given to the details of the first measurement period failure detection processing with reference to the flowchart in FIG. 8A. As already mentioned above, this processing is carried out by the control circuit 115 in parallel to AD conversion.

At Step S401, the control circuit 115 carries out 5V charge processing to set the voltage of the inspection capacitor 150 to 5V. This step is carried out when the initialization in AD conversion is started. Then the flow proceeds to the processing of Step S402.

At Step S402, the control circuit 115 turns ON the switch of the multiplexer 114 connected to the target ch of AD conversion carried out in parallel to this processing to establish continuity between the target ch and the signal line 119d. As a result, sampling in AD conversion is started. Then the flow proceeds to the processing of Step S403.

At Step S403, the control circuit 115 outputs a determination voltage hold signal to cause the determination voltage hold circuit 112a to hold the voltage value of the signal line 119d. Then the flow proceeds to the processing of Step S404.

At Step S404, the control circuit 115 turns ON the inspection switch 118 and the flow proceeds to the processing of Step S405.

At Step S405, the control circuit 115 outputs a determination result hold signal to the determination result hold circuit 112c to cause the determination result hold circuit 112c to hold the following difference (determination result hold value): the difference between the voltage value of the signal line 119d detected by the determination circuit 112b and the voltage value held at the determination voltage hold circuit 112a. Then the flow proceeds to the processing of Step S406.

At Step S406, the control circuit 115 determines whether or not the determination result hold value held at the determination result hold circuit 112c is higher than a predetermined threshold value. When an affirmative determination is made (Step S406: Yes), the flow proceeds to the processing of Step S407; and when a negative determination is made (Step S406: No), the flow proceeds to the processing of Step S408.

At Step S407, the control circuit 115 considers that an open failure has occurred in C1x on the target ch and the flow proceeds to the processing of Step S408.

At Step S408, the control circuit 115 turns OFF the inspection switch 118 and all the switches of the multiplexer 114 and the flow proceeds to the processing of Step S409. This processing is carried out when sampling is terminated in AD conversion at the AD converter 116.

At Step S409, the control circuit 115 determines whether or not measurement data equivalent to six bits has been generated during comparison in AD conversion at the AD converter 116. When an affirmative determination is made (Step S409: Yes), the flow proceeds to the processing of Step S410; and when a negative determination is made (Step S409: No), the flow proceeds to the processing of Step S409.

At Step S410, the control circuit 115 acquires measurement data equivalent to six bits from the AD converter 116 and the flow proceeds to the processing of Step S411.

At Step S411, the control circuit 115 determines whether or not the voltage value of the signal line 119d is close to 5V based on the acquired measurement data. When an affirmative determination is made (Step S411: Yes), it is considered that there is a possibility of a terminal failure with respect to the target ch and the flow proceeds to the processing of Step S412; and when a negative determination is made (Step S411: No), this series of processing is terminated.

At Step S412, the control circuit 115 determines whether or not it was determined that there was a possibility of a terminal failure in the second measurement period failure detection processing with respect to the target ch carried out immediately before. When an affirmative determination is made (Step S412: Yes), the flow proceeds to the processing of Step S413; and when a negative determination is made (Step S412: No), this series of processing is terminated.

At Step S413, the control circuit 115 determines that a terminal failure or OFF sticking of the switch of the multiplexer 114 connected to the target ch has occurred and terminates this series of processing.

(d) Details of Second Measurement Period Failure Detection Processing

Description will be given to the details of the second measurement period failure detection processing. As shown in the flowchart in FIG. 8B, the second measurement period failure detection processing is substantially the same as the first measurement period failure detection processing and description will be given mainly to a difference.

In the second measurement period failure detection processing, Step S421 to Step S433 respectively corresponding to Step S401 to Step S413 of the first measurement period failure detection processing are carried out.

At Step S421 corresponding to Step S401 of the first measurement period failure detection processing, the control circuit 115 carries out 0V charge processing to set the voltage of the inspection capacitor 150 to 0V. This step is carried out when initialization in AD conversion is started. Then the flow proceeds to the processing of Step S422.

At Step S431 corresponding to Step S411 of the first measurement period failure detection processing, the control circuit 115 determines whether or not the voltage value of the signal line 119d is close to 0V based on the acquired measurement data. When an affirmative determination is made (Step S431: Yes), it is considered that there is a possibility of a terminal failure with respect to the target ch and the flow proceeds to the processing of Step S432; and when a negative determination is made (Step S431: No), this series of processing is terminated.

At Step S432 corresponding to Step S412 of the first measurement period failure detection processing, the control circuit 115 determines the following: whether or not it was determined that there was a possibility of terminal failure in the first measurement period failure detection processing with respect to the target ch carried out immediately before. When an affirmative determination is made (Step S432: Yes), the flow proceeds to the processing of Step S433; and when a negative determination is made (Step S432: No), this series of processing is terminated.

[138521-0105]

(5) SW, Etc. Failure Detection Processing

Figure 9:
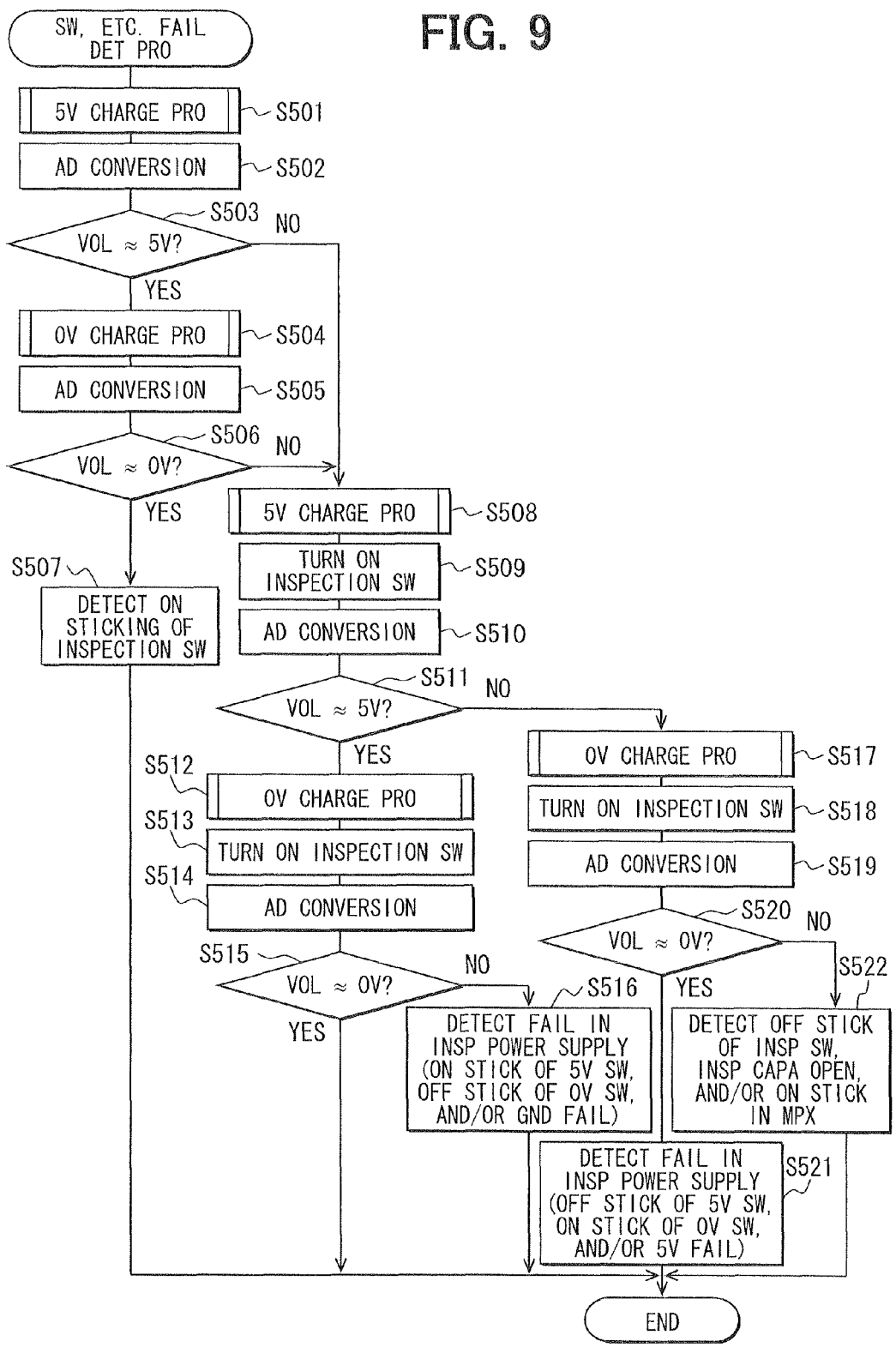
FIG. 9 is a flowchart of failure detection processing for SW and the like in the first embodiment.

Description will be given to SW, etc. failure detection processing for detecting a SW, etc. failure that is a failure in the multiplexer 114, inspection power supply 117, inspection switch 118, reference potential, or 5V power supply with reference to the flowchart in FIG. 9. As already mentioned above, this processing is carried out by the control circuit 115 of the AD conversion IC 110 after a command is received from the microcomputer 160.

At Step S501, the control circuit 115 carries out 5V charge processing and the flow proceeds to the processing of Step S502.

At Step S502, the control circuit 115 causes the AD converter 116 to carry out AD conversion to detect the voltage of the signal line 119d. Then the flow proceeds to the processing of Step S503.

At Step S503, the control circuit 115 determines whether or not the detected voltage value is 5V or a value close to 5V. When an affirmative determination is made (Step S503: Yes), the flow proceeds to the processing of Step S504; and when a negative determination is made (Step S503: No), the flow proceeds to the processing of Step S508.

At Step S504, the control circuit 115 carries out 0V charge processing and the flow proceeds to the processing of Step S505.

At Step S505, the control circuit 115 causes the AD converter 116 to carry out AD conversion to detect the voltage of the signal line 119d. Then the flow proceeds to the processing of Step S506.

At Step S506, the control circuit 115 determines whether or not the detected voltage value is 0V or a value close to 0V. When an affirmative determination is made (Step S506: Yes), the flow proceeds to the processing of Step S507; and when a negative determination is made (Step S506: No), the flow proceeds to the processing of Step S508.

At Step S507, the control circuit 115 considers that the inspection switch 118 is stuck in ON position and terminates this series of processing.

At Step S508, the control circuit 115 carries out 5V charge processing and the flow proceeds to the processing of Step S509.

At Step S509, the control circuit 115 turns ON the inspection switch 118 and the flow proceeds to the processing of Step S510.

At Step S510, the control circuit 115 causes the AD converter 116 to carry out AD conversion to detect the voltage of the signal line 119d. Then the flow proceeds to the processing of Step S511.

At Step S511, the control circuit 115 determines whether or not the detected voltage value is 5V or a value close to 5V. When an affirmative determination is made (Step S511: Yes), the flow proceeds to the processing of Step S512; and when a negative determination is made (Step S511: No), the flow proceeds to the processing of Step S517.

At Step S512, the control circuit 115 carries out 0V charge processing and the flow proceeds to the processing of Step S513.

At Step S513, the control circuit 115 turns ON the inspection switch 118 and the flow proceeds to the processing of Step S514.

At Step S514, the control circuit 115 causes the AD converter 116 to carry out AD conversion to detect the voltage of the signal line 119d. Then the flow proceeds to the processing of Step S515.

At Step S515, the control circuit 115 determines whether or not the detected voltage value is 0V or a value close to 0V. When an affirmative determination is made (Step S515: Yes), this series of processing is terminated; and when a negative determination is made (Step S515: No), the flow proceeds to the processing of Step S516.

At Step S516, the control circuit 115 considers that a failure (at least any one of ON sticking of the 5V switch 117a, OFF sticking of the 0V switch 117b, and reference potential failure) has occurred in the inspection power supply 117 and terminates this series of processing.

At Step S517 to which the flow proceeds when a negative determination is made at Step S511, the control circuit 115 carries out 0V charge processing and the flow proceeds to the processing of Step S518.

At Step S518, the control circuit 115 turns ON the inspection switch 118 and the flow proceeds to the processing of Step S519.

At Step S519, the control circuit 115 causes the AD converter 116 to carry out AD conversion to detect the voltage of the signal line 119d. Then the flow proceeds to the processing of Step S520.

At Step S520, the control circuit 115 determines whether or not the detected voltage value is 0V or a value close to 0V. When an affirmative determination is made (Step S520: Yes), the flow proceeds to the processing of Step S521; and when a negative determination is made (Step S520: No), the flow proceeds to the processing of Step S522.

At Step S521, the control circuit 115 considers that a failure (at least any one of OFF sticking of the 5V switch 117a, ON sticking of the 0V switch 117b, and a failure in the 5V power supply) has occurred in the inspection power supply 117. Then it terminates this series of processing.

At Step S522, meanwhile, the control circuit 115 considers that at least any one of OFF sticking of the inspection switch 118, an open failure in the inspection capacitor 150, and ON sticking of a switch of the multiplexer 114 has occurred. Then it terminates this series of processing.

(6) Input-Side Resistor Failure Detection Processing

Description will be given to input-side resistor failure detection processing for detecting an open failure ($R2x$ failure) in an input-side resistor.

In the AD conversion IC 110 of the sensor signal input circuit 100, the following takes place when processing of establishing continuity between any ch and the inspection capacitor 150 is carried out after the execution of 5V charge processing or 0V charge processing: migration of electric charges is caused between the $C1x$ connected to this ch and the inspection capacitor 150 and the voltage of the ch varies. (The above processing of establishing continuity will be referred to as continuity establishment processing.) At normal times, electric charges migrate between the sensor signal input circuit 100 and an external source; therefore, the voltage value of the ch becomes equal to the voltage value of a sensor signal. When an $R2x$ failure has occurred, migration is not caused between the sensor signal input circuit and an external source and the varied voltage is maintained. For this reason, when 5V charge processing or the like and continuity establishment processing are repeated with the presence of an $R2x$ failure, the voltage value of the ch is varied stepwise and approaches 5V or 0V.

When the voltage value of a sensor signal is close to 5V or 0V, the voltage value of the ch after the above pieces of processing are repeated becomes close to 5V or 0V even though an $R2x$ failure has not occurred.

Consequently, the sensor signal input circuit 100 carries out input-side resistor failure detection processing. In the input-side resistor failure detection processing, it is considered that an $R2x$ failure has occurred in cases where: the voltage value of a signal input terminal is close to 5V after 5V charge processing and continuity establishment processing are carried out more than once; and at the same time, the voltage value of the signal input terminal is close to 0V after 0V charge processing and continuity establishment processing are carried out more than once.

Figure 10:
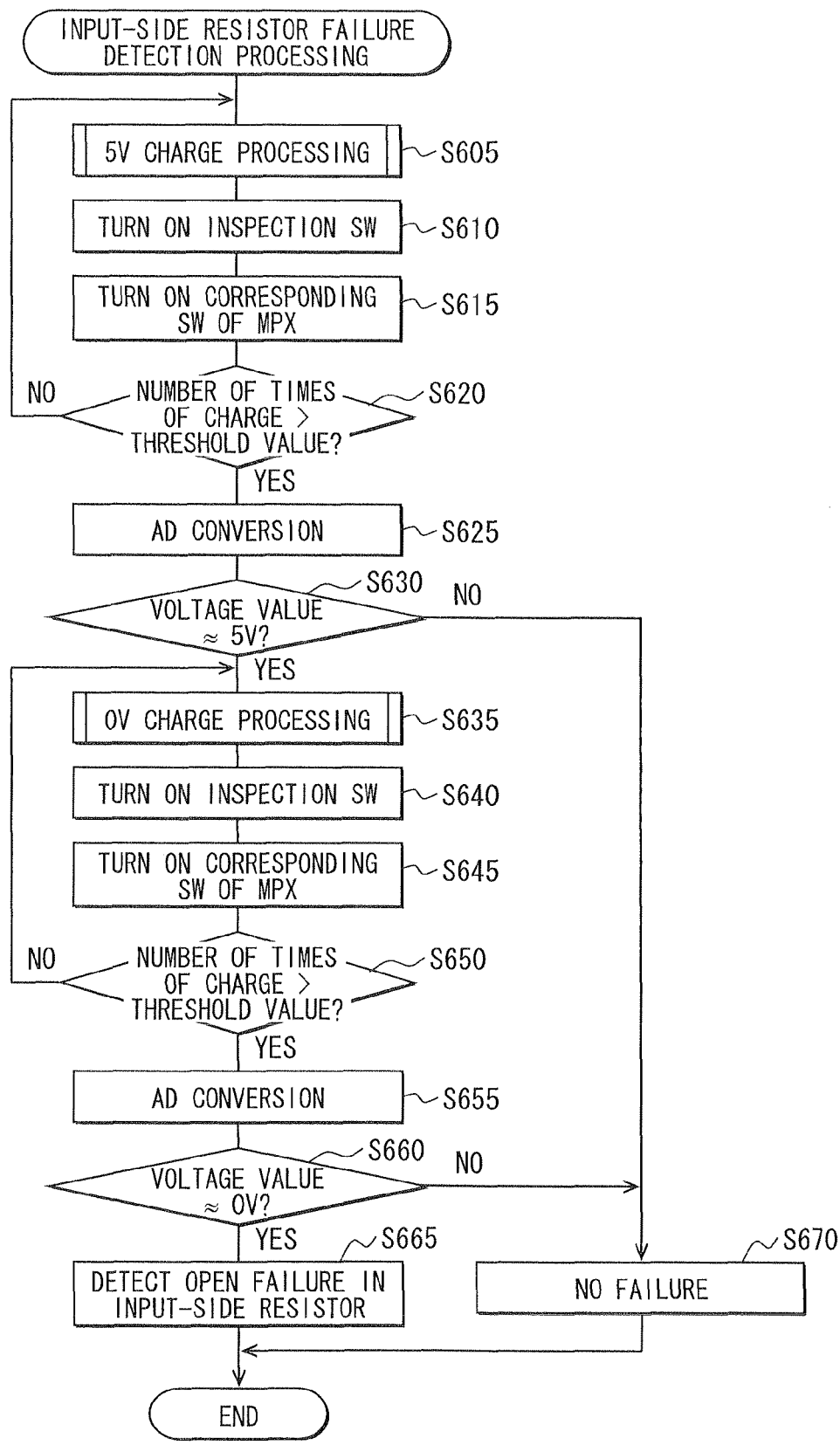
FIG. 10 is a flowchart of an input-side resistor failure detection processing in the first embodiment.

Description will be given to the details of input-side resistor failure detection processing with reference to the flowchart in FIG. 10. As already mentioned above, this series of processing is carried out by the control circuit 115 of the AD conversion IC 110. After AD conversion on ch1 to chN is carried out in accordance with a command from the microcomputer 160, this series of processing is carried out with an input-side resistor specified by this command taken as the test object.

At Step S605, the control circuit 115 carries out 5V charge processing and the flow proceeds to the processing of Step S610.

At Step S610, the control circuit 115 turns ON the inspection switch 118 and the flow proceeds to the processing of Step S615.

At Step S615, the control circuit 115 turns ON a switch of the multiplexer 114 connected to the ch leading to the input-side resistor as the test object and the flow proceeds to the processing of Step S620.

At Step S620, the control circuit 115 determines whether or not the number of times of the execution of 5V charge processing has become higher than a predetermined threshold value. When an affirmative determination is made (Step S620: Yes), the flow proceeds to the processing of Step S625; and when a negative determination is made (Step S620: No), the flow proceeds to the processing of Step S605.

At Step S625, the control circuit 115 causes the AD converter 116 to carry out AD conversion to detect the voltage of the signal line 119d. Then the flow proceeds to the processing of Step S630.

At Step S630, the control circuit 115 determines whether or not the detected voltage value is 5V or a value close to 5V. When an affirmative determination is made (Step S630: Yes), the flow proceeds to the processing of Step S635; and when a negative determination is made (Step S630: No), the flow proceeds to the processing of Step S670.

At Step S635, the control circuit 115 carries out 0V charge processing and the flow proceeds to the processing of Step S640.

At Step S640, the control circuit 115 turns ON the inspection switch 118 and the flow proceeds to the processing of Step S645.

At Step S645, the control circuit 115 turns ON a switch of the multiplexer 114 connected to the ch leading to the input-side resistor as the test object and the flow proceeds to the processing of Step S650.

At Step S650, the control circuit 115 determines whether or not the number of times of the execution of 0V charge processing has become higher than a predetermined threshold value. When an affirmative determination is made (Step S650: Yes), the flow proceeds to the processing of Step S655; and when a negative determination is made (Step S650: No), the flow proceeds to the processing of Step S635.

At Step S655, the control circuit 115 causes the AD converter 116 to carry out AD conversion to detect the voltage of the signal line 119d. Then the flow proceeds to the processing of Step S660.

At Step S660, the control circuit 115 determines whether or not the detected voltage value is 0V or a value close to 0V. When an affirmative determination is made (Step S660: Yes), the flow proceeds to the processing of Step S665; and when a negative determination is made (Step S660: No), the flow proceeds to the processing of Step S670.

At Step S665, the control circuit 115 considers that an open failure (R2x failure) has occurred in the input-side resistor as the test object and terminates this series of processing.

At Step S670, meanwhile, the control circuit 115 considers that a failure has not occurred in the input-side resistor as the test object and terminates this series of processing.

Second Embodiment

Description will be given to the operation of the AD conversion IC 110 of the sensor signal input circuit 100 in the second embodiment.

(1) Overview

Figure 11:
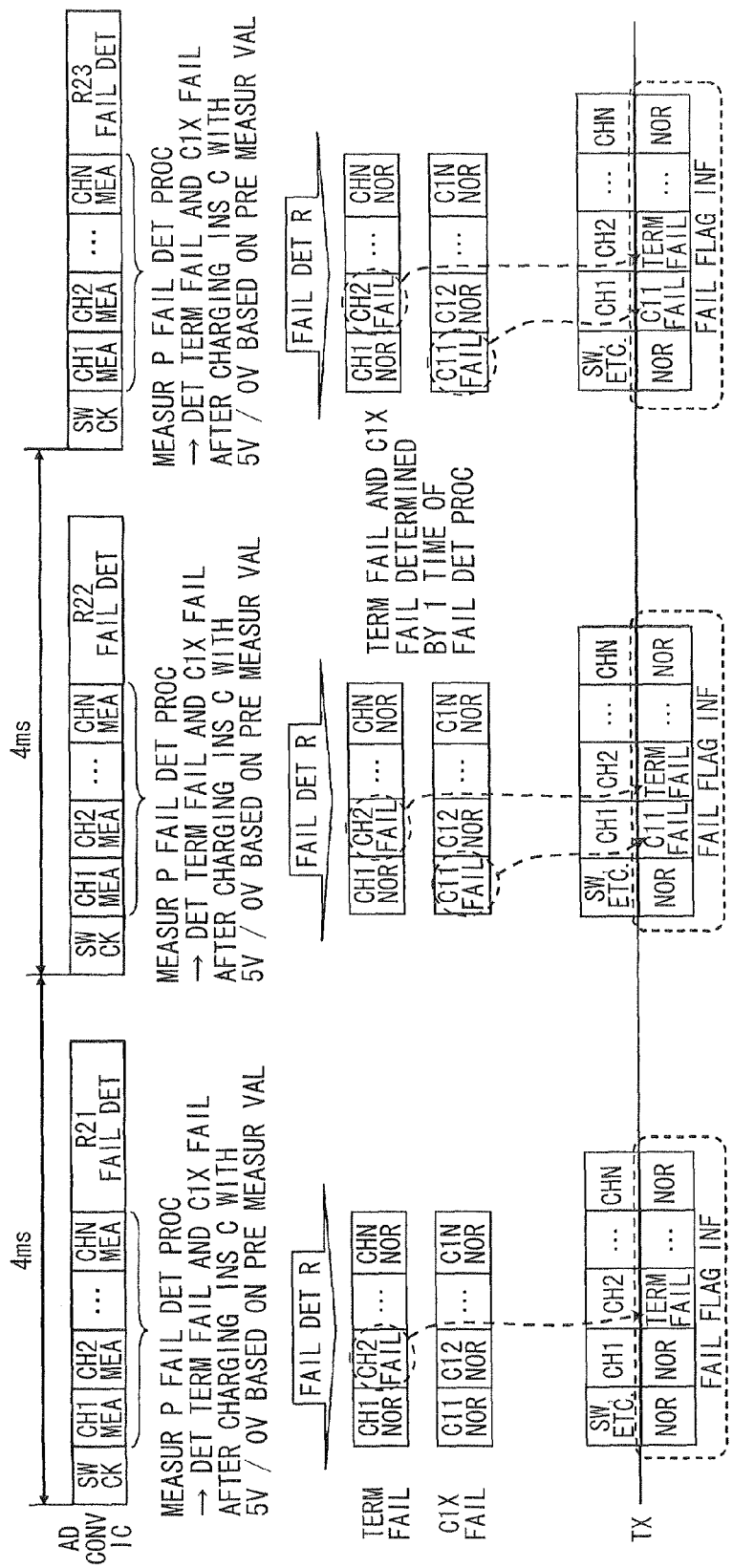
FIG. 11 is a timing chart of the timing of execution of AD conversion and the like and the timing of transmission of response data in a second embodiment.

Description will be given to the overview of the operation of the AD conversion IC 110 in the second embodiment with reference to the timing chart in FIG. 11.

Also in the second embodiment, the microcomputer 160 transmits the same command as in the first embodiment to the AD conversion IC 110 at intervals of 4 ms. The AD conversion IC 110 that received the command first carries out SW, etc. failure detection processing (referred to as "SW, etc. check" in the drawing) as in the first embodiment. When it thereafter sequentially receives a measurement instruction code with respect to each ch, it carries out AD conversion (referred to as "chx measurement" in the drawing) on the corresponding ch. When AD conversion on chN is terminated, it carries out input-side resistor failure detection processing with respect to the input-side resistor specified by the R2x failure detection instruction code composing part of the command. The SW, etc. failure detection processing and the input-side resistor failure detection processing are the same as those in the first embodiment and detailed description thereof will be omitted.

At the AD conversion IC 110, measurement period failure detection processing is carried out in parallel to AD conversion on ch1 to chN as in the first embodiment. In the measurement period failure detection processing, any terminal failure with respect to the target ch of AD conversion and any C1x failure with respect to the input-side capacitor provided in the target ch are carried out. The measurement period failure detection processing in the second embodiment has a difference from that in the first embodiment.

In the first embodiment, the following measure is taken to prevent erroneous detection of a terminal failure when the voltage value of a sensor signal is close to a voltage value set on the inspection capacitor 150 in 5V charge processing or the like: first measurement period failure detection processing involving 5V charge processing and second measurement period failure detection processing involving 0V charge processing are alternately carried out. When it is consecutively determined twice that there is a possibility of a terminal failure, it is considered that a terminal failure has occurred.

In the second embodiment, meanwhile, any terminal failure is detected by one cycle of measurement period failure detection processing by taking the following procedure: it is considered that the present sensor signal has a voltage value close to a measurement value (previous value) obtained by AD conversion with respect to the target ch carried out immediately before; and a voltage value different from the previous value is set on the inspection capacitor 150. The second embodiment is different from the first embodiment in this regard.

(2) Measurement Period Failure Detection Processing (a) Overview

Figure 12:
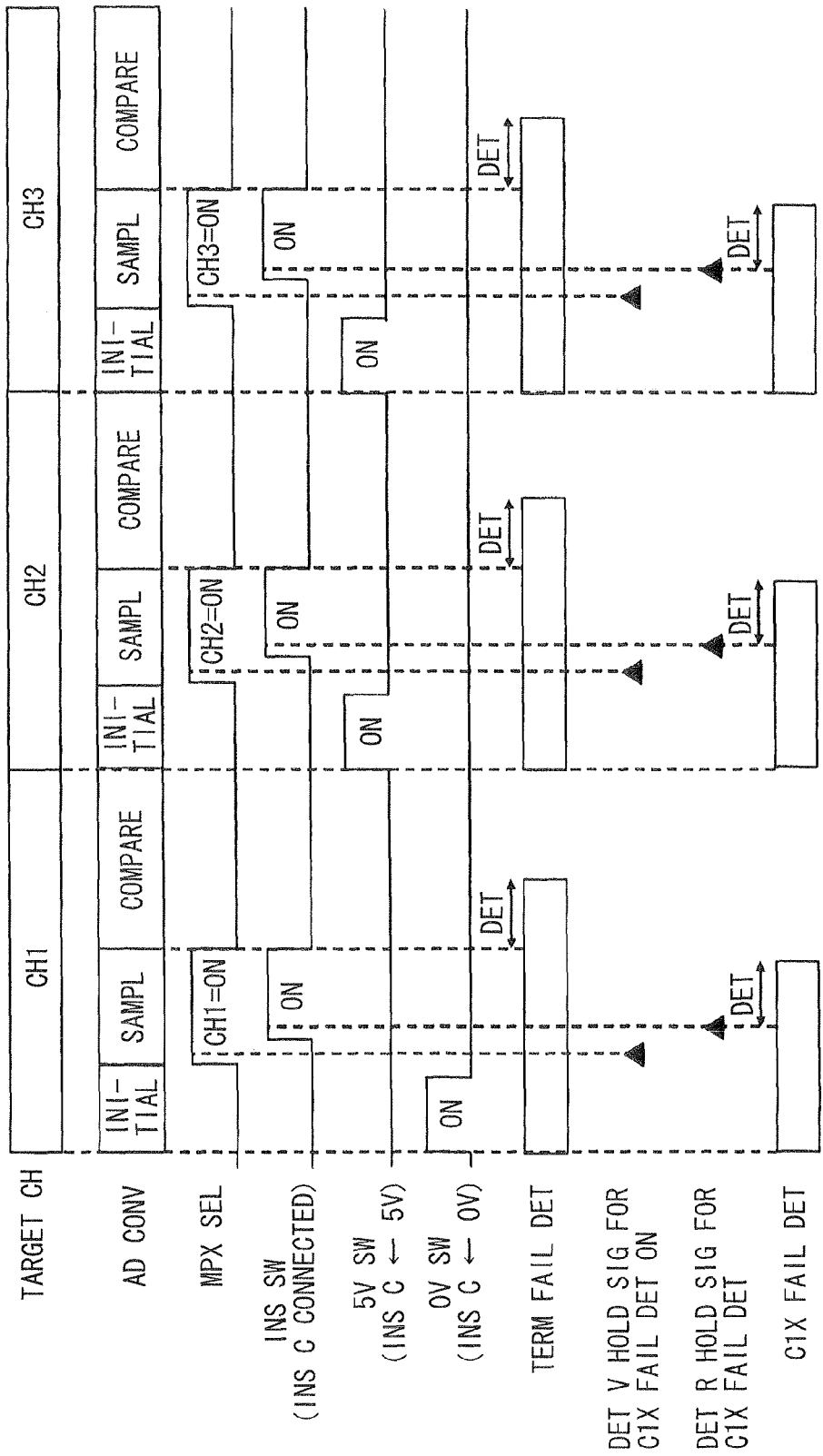
FIG. 12 is a timing chart of measurement period failure detection processing in the second embodiment.

Description will be given to the overview of measurement period failure detection processing in the second embodiment with reference to the timing chart in FIG. 12. In the second embodiment, as already mentioned above, either 5V charge processing or 0V charge processing is carried out according to the measurement value with respect to the target ch obtained by AD conversion carried out immediately before; and any terminal failure is detected by one cycle of measurement period failure detection processing.

More specific description will be given. The measurement period failure detection processing in the second embodiment is carried out in parallel to the same AD conversion as in the first embodiment. The multiplexer 114 and the inspection switch 118 are set with the same timing as in the first embodiment. Either the 5V switch 117a or the 0V switch 117b is turned ON when initialization is started as in the first embodiment and any terminal failure with respect to the target ch is detected based on measurement data generated by comparison.

In the second embodiment, either of the switches is turned on on a case-by-case basis. That is, when the measurement value (previous value) from AD conversion on the target ch carried out immediately before is lower than 2.5V, the 5V switch 117a is turned ON (that is, 5V charge processing is carried out); and when the previous value is equal to or higher than 2.5V, the 0V switch 117b is selected (that is, 0V charge processing is carried out). That is, it is made possible to detect any terminal failure by one cycle of measurement period failure detection processing by taking the following procedure: it is considered that the voltage value of the present sensor signal is close to the previous value; and a voltage value sufficiently different from the previous value is set on the inspection capacitor 150.

Thus the difference between the voltage value of the present sensor signal and the voltage value set on the inspection capacitor 150 is equal to or larger than 2.5V; therefore, the following takes place when an open failure has occurred in C1x: the voltage value of the signal line 119d is sufficiently varied when the inspection switch 118 is turned ON. For this reason, when change in the voltage value of the signal line 119d between before and after the inspection switch 118 is turned ON is equal to or larger than the threshold value, as in the first embodiment, it is considered that a C1x failure has occurred.

(b) Details

Figure 13:
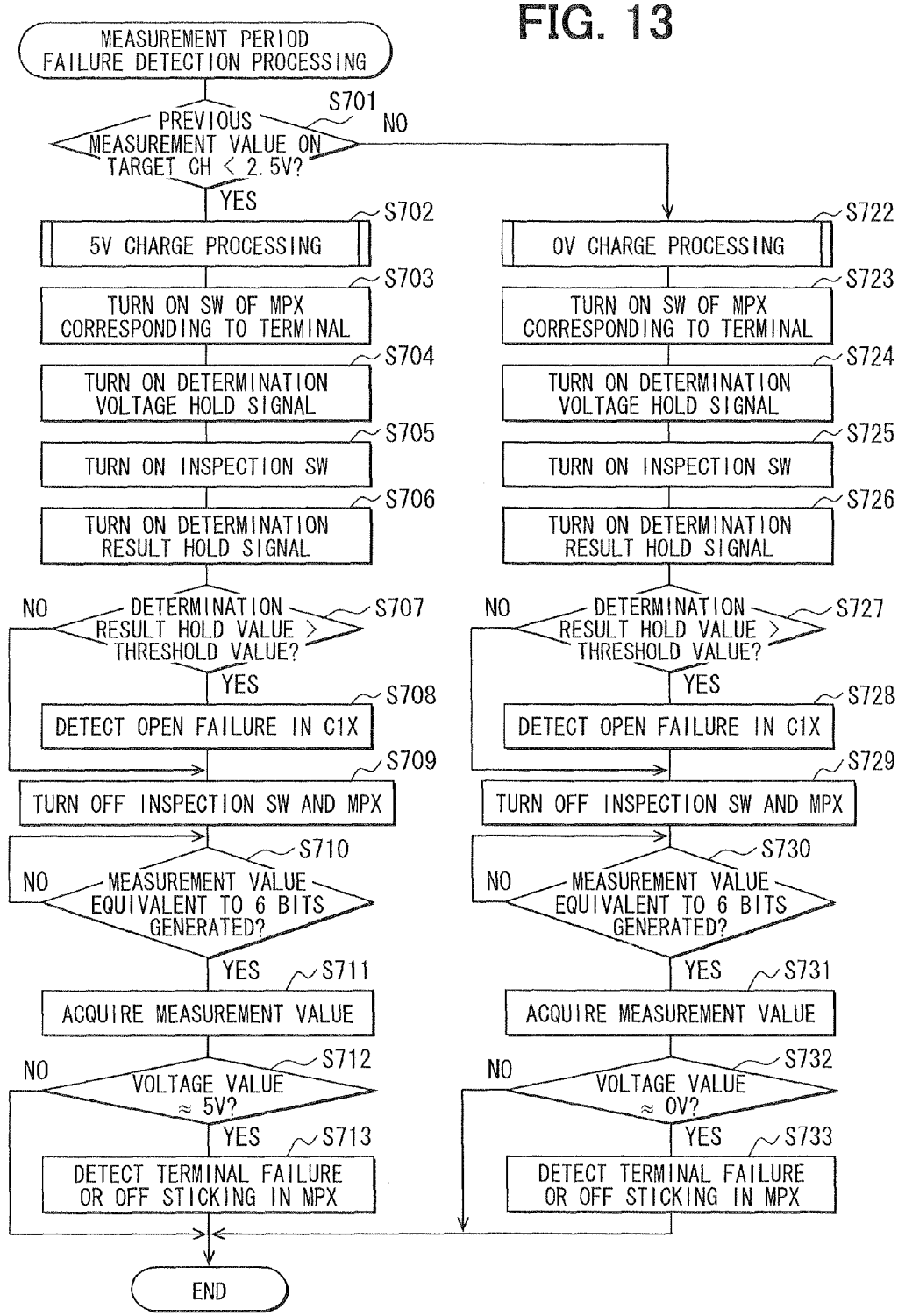
FIG. 13 is a flowchart of measurement period failure detection processing in the second embodiment.

Description will be given to the details of measurement period failure detection processing in the second embodiment with reference to the flowchart in FIG. 13. As already mentioned above, this series of processing is carried out by the control circuit 115 in parallel to AD conversion.

At Step S701, the control circuit 115 determines whether or not the previous value is lower than 2.5V with respect to the target ch of AD conversion. When an affirmative determination is made (Step S701: Yes), the flow proceeds to the processing of Step S702; and when a negative determination is made (Step S701: No), the flow proceeds to the processing of Step S722.

At Step S702, the control circuit 115 carries out 5V charge processing. This step is carried out when initialization in AD conversion is started. Then the flow proceeds to the processing of Step S703.

At Step S703, the control circuit 115 turns ON a switch of the multiplexer 114 connected to the target ch of AD conversion and sampling in AD conversion is started. Then the flow proceeds to the processing of Step S704.

At Step S704, the control circuit 115 outputs a determination voltage hold signal to cause the determination voltage hold circuit 112a to hold the voltage value of the signal line 119d. Then the flow proceeds to the processing of Step S705.

At Step S705, the control circuit 115 turns ON the inspection switch 118 and the flow proceeds to the processing of Step S706.

At Step S706, the control circuit 115 outputs a determination result hold signal to the determination result hold circuit 112c to cause the determination result hold circuit 112c to hold the following difference (determination result hold value): the difference between the voltage value of the signal line 119d detected by the determination circuit 112b and the voltage value held at the determination voltage hold circuit 112a. Then the flow proceeds to the processing of Step S707.

At Step S707, the control circuit 115 determines whether or not the determination result hold value held at the determination result hold circuit 112c is higher than a predetermined threshold value. When an affirmative determination is made (Step S707: Yes), the flow proceeds to the processing of Step S708; and when a negative determination is made (Step S707: No), the flow proceeds to the processing of Step S709.

At Step S708, the control circuit 115 considers that an open failure (C1x failure) has occurred in the input-side capacitor on the target ch and the flow proceeds to the processing of Step S709.

At Step S709, the control circuit 115 turns OFF the inspection switch 118 and all the switches of the multiplexer 114 and the flow proceeds to the processing of Step S710. This processing is carried out when sampling is terminated in AD conversion at the AD converter 116.

At Step S710, the control circuit 115 determines whether or not measurement data equivalent to six bits has been generated during comparison in AD conversion at the AD converter 116. When an affirmative determination is made (Step S710: Yes), the flow proceeds to the processing of Step S711; and when a negative determination is made (Step S710: No), the flow proceeds to the processing of Step S710.

At Step S711, the control circuit 115 acquires measurement data equivalent to six bits from the AD converter 116 and the flow proceeds to the processing of Step S712.

At Step S712, the control circuit 115 determines whether or not the voltage value of the signal line 119d is close to 5V based on the acquired measurement data. When an affirmative determination is made (Step S712: Yes), the flow proceeds to the processing of Step S713; and when a negative determination is made (Step S712: No), this series of processing is terminated.

At Step S713, the control circuit 115 considers that a terminal failure has occurred with respect to the target ch or OFF sticking of the switch of the multiplexer 114 connected to the target ch has occurred and terminates this series of processing At Step S722 to which the flow proceeds when a negative determination is made at Step S701, the control circuit 115 carries out 0V charge processing. This step is carried out when initialization in AD conversion is started. Then the flow proceeds to the processing of Step S723.

At Step S723, the control circuit 115 turns ON the switch of the multiplexer 114 connected to the target ch of AD conversion and sampling in AD conversion is started. Then the flow proceeds to the processing of Step S724.

At Step S724, the control circuit 115 outputs a determination voltage hold signal to cause the determination voltage hold circuit 112a to hold the voltage value of the signal line 119d. Then the flow proceeds to the processing of Step S725.

At Step S725, the control circuit 115 turns ON the inspection switch 118 and the flow proceeds to the processing of Step S726.

At Step S726, the control circuit 115 outputs a determination result hold signal to the determination result hold circuit 112c to cause the determination result hold circuit 112c to hold the following difference (determination result hold value): the difference between the voltage value of the signal line 119d detected by the determination circuit 112b and the voltage value held at the determination voltage hold circuit 112a. Then the flow proceeds to the processing of Step S727.

At Step S727, the control circuit 115 determines whether or not the determination result hold value held at the determination result hold circuit 112c is higher than a predetermined threshold value. When an affirmative determination is made (Step S727: Yes), the flow proceeds to the processing of Step S728; and when a negative determination is made (Step S727: No), the flow proceeds to the processing of Step S729.

At Step S728, the control circuit 115 considers that an open failure (C1*x* failure) has occurred in the input-side capacitor on the target ch and the flow proceeds to the processing of Step S729.

At Step S729, the control circuit 115 turns OFF the inspection switch 118 and all the switches of the multiplexer 114 and the flow proceeds to the processing of Step S730. This processing is carried out when sampling is terminated in AD conversion at the AD converter 116.

At Step S730, the control circuit 115 determines whether or not measurement data equivalent to six bits has been generated during comparison in AD conversion at the AD converter 116. When an affirmative determination is made (Step S730: Yes), the flow proceeds to the processing of Step S731; and when a negative determination is made (Step S730: No), the flow proceeds to the processing of Step S730.

At Step S731, the control circuit 115 acquires measurement data equivalent to six bits from the AD converter 116 and the flow proceeds to the processing of Step S732.

At Step S732, the control circuit 115 determines whether or not the voltage value of the signal line 119*d* is close to 0V based on the acquired measurement data. When an affirmative determination is made (Step S732: Yes), the flow proceeds to the processing of Step S733; and when a negative determination is made (Step S732: No), this series of processing is terminated.

At Step S733, the control circuit 115 considers that a terminal failure has occurred with respect to the target ch and terminates this series of processing.

Third Embodiment

Figure 14:
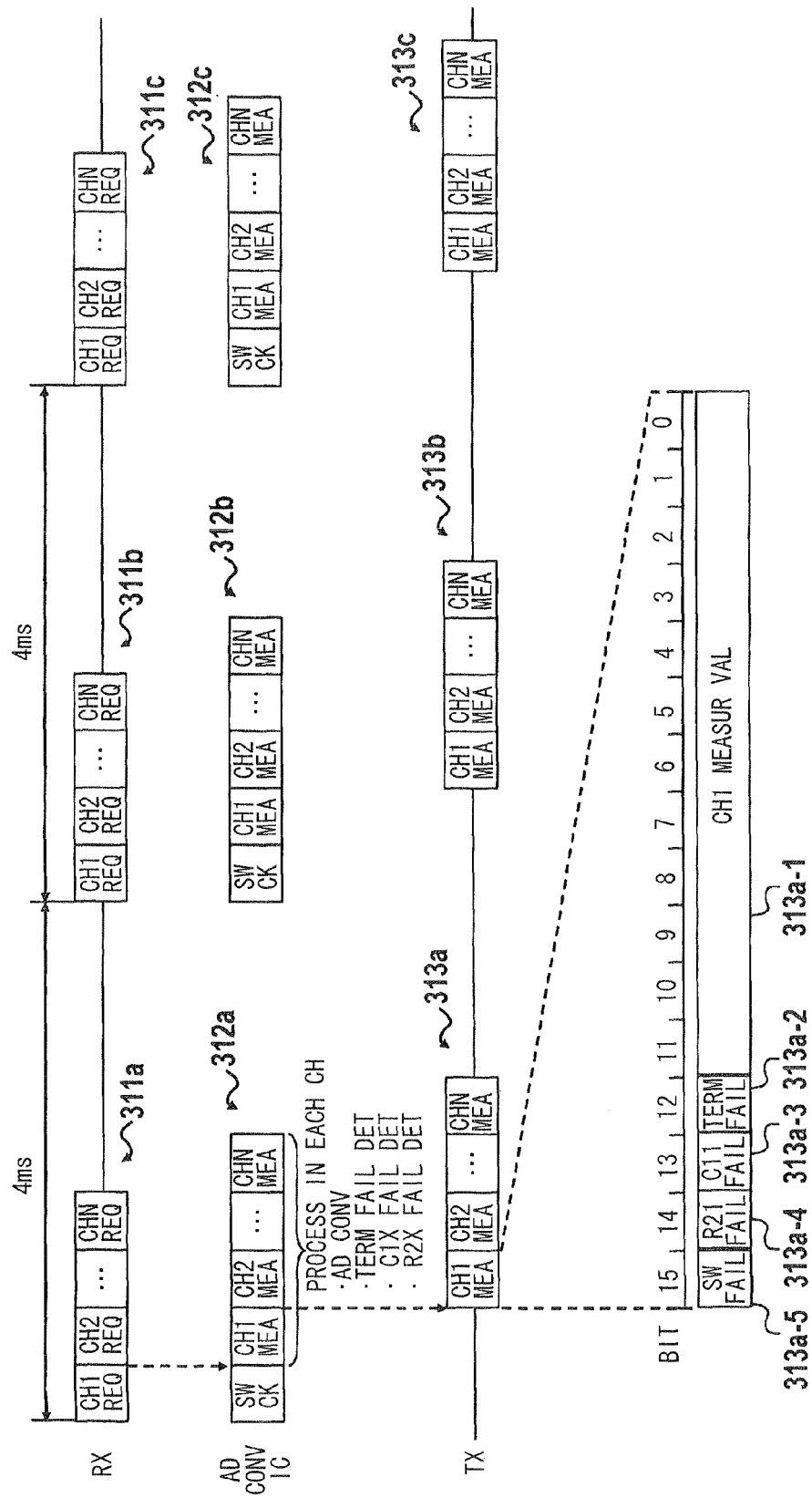
FIG. 14 is a timing chart of communication between a microcomputer and an AD conversion IC in a third embodiment.
Figure 15:
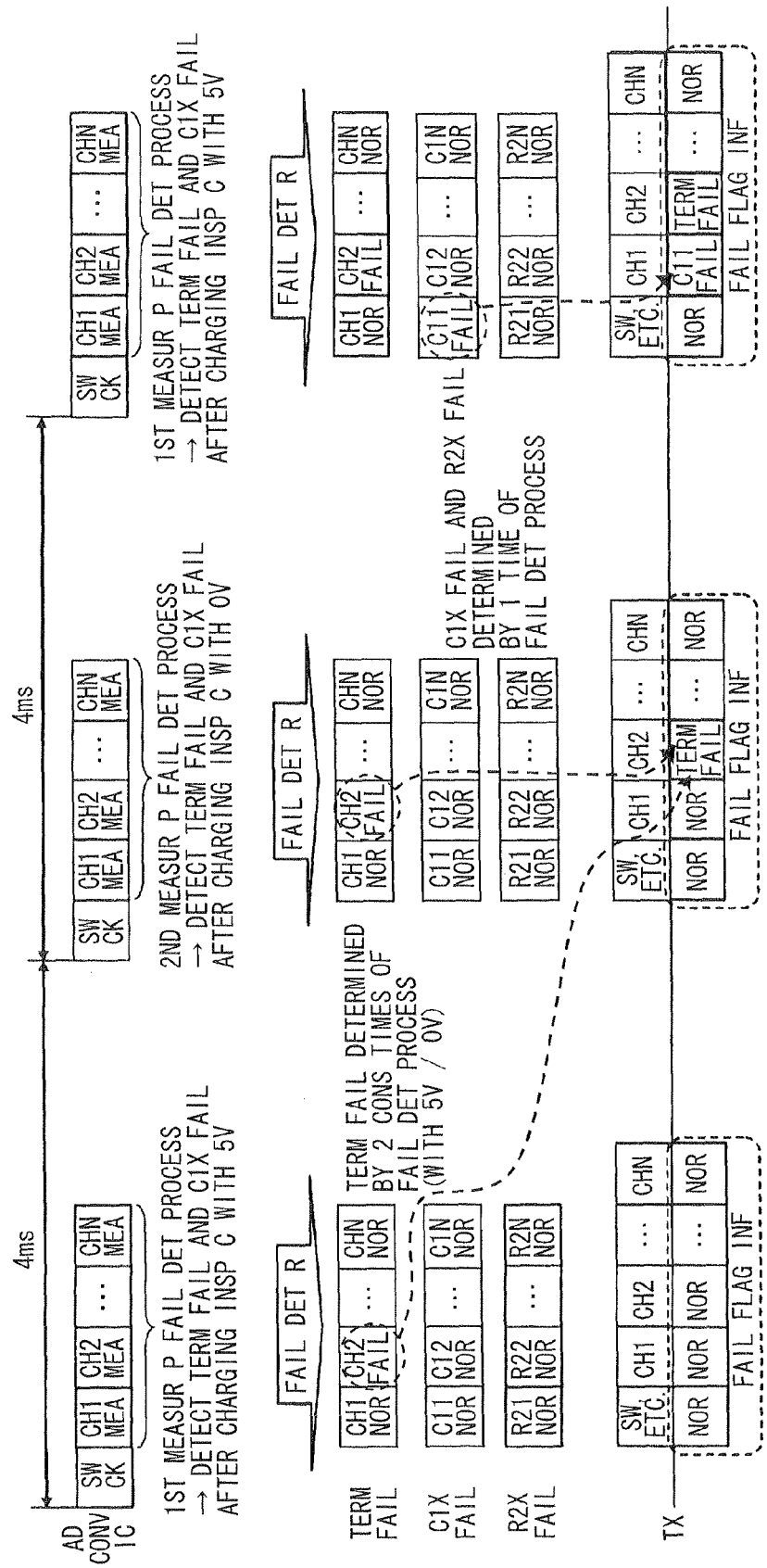
FIG. 15 is a timing chart of the timing of execution of AD conversion and the like and the timing of transmission of response data in the third embodiment.

Description will be given to the operation of the AD conversion IC 110 of the sensor signal input circuit 100 in the third embodiment with reference to the timing charts in FIGS. 14 and 15.

Also in the third embodiment, the microcomputer 160 transmits a command 311 to the AD conversion IC 110 at intervals of 4 ms. In the third embodiment, as shown in FIG. 14, the command 311 is composed of a measurement instruction code (referred to as "chx request" in the drawing) instructing AD conversion on ch1 to chN unlike the first and second embodiments.

The AD conversion IC 110 that received the command 311 carries out processing 312. Specifically, the AD conversion IC 110 first carries out SW, etc. failure detection processing (referred to as "SW, etc. check" in the drawing) as in the first and second embodiments. When it thereafter sequentially receives a measurement instruction code with respect to each ch, it carries out AD conversion (referred to as "chx measurement" in the drawing) on the corresponding ch. It alternately carries out first measurement period failure detection processing and second measurement period failure detection processing in parallel to AD conversion as in the first embodiment. After the termination of these pieces of measurement period failure detection processing, it carries out input-side resistor failure detection processing with respect to the target ch of AD conversion unlike the first embodiment. (Refer to FIG. 15.) The first measurement period failure detection processing, second measurement period failure detection processing, SW, etc. failure detection processing, and input-side resistor failure detection processing are the same as those in the first embodiment and detailed description thereof will be omitted.

When the AD conversion IC 110 terminates AD conversion and measurement period failure detection processing and input-side resistor failure detection processing with respect to the target ch, it generates two-byte measurement data (referred to as "chx measurement" in the drawing) composed of measurement data and the like pertaining to the target ch. Then it transmits measurement data of ch1 to chN as response data 313 to the microcomputer 160. Each piece of measurement data contains: data indicating the presence or absence of a terminal failure, the presence or absence of C1*x* failure, and the presence or absence of R2*x* failure with respect to the corresponding ch; and data indicating the presence or absence of a SW, etc. failure detected before the start of AD conversion.

As an example, measurement data corresponding to ch1 in response data 313*a* contains 12-bit measurement data 313*a*-1. It further contains a terminal failure bit 313*a*-2 indicating the presence or absence of a terminal failure with respect to ch1, a C11 failure bit 313*a*-3 indicating the presence or absence of a C11 failure, and an R21 failure bit 313*a*-4 indicating the presence or absence of an R21 failure. It further contains a SW, etc. failure bit 313*a*-5 indicating the presence or absence of a SW, etc. failure detected before the start of AD conversion. The measurement data with respect to the other chs and measurement data composing the other response data are also similarly composed.

(Effect)

In the AD conversion IC 110 incorporated in the sensor signal input circuit 100 in this embodiment, AD conversion and measurement period failure detection processing are carried out in parallel; and the measurement of the voltage of a sensor signal and the detection of a terminal failure and a C1*x* failure are simultaneously carried out. With the sensor signal input circuit 100 in this embodiment, therefore, any terminal failure or C1*x* failure can be detected without delay in detection of the voltage value of a sensor signal.

Other Embodiments (1) In the first to third embodiments, in measurement period failure detection processing, 5V charge processing or 0V charge processing is carried out during a period of initialization in AD conversion. The timing of execution of 5V charge processing and the like is not limited to this and 5V charge processing and the like may be carried out astride a sampling start time. Even in this case, the same effect can be obtained.

(2) In the first to third embodiments, the inspection capacitor 150 is provided outside the AD conversion IC 110. Even when the inspection capacitor 150 is incorporated in the AD conversion IC 110, the same effect can be obtained. In the first to third embodiments, 0V or 5V is used as the voltage set on the inspection capacitor 150 to carry out failure detection. The invention is not limited to this and the voltage can be changed within the variation range of sensor signals. In the first to third embodiments, the capacitance of C1*x* is 0.1 µF and the capacitance of the inspection capacitor 150 is 0.01 µF. The invention is not limited to this. Even when a different value is set, the same effect can be obtained.

(3) The first to third embodiments are provided with a multiple-channel configuration and N sensor signals are inputted thereto. The invention is not limited to this and may be so configured that a single signal is inputted. Even in this case, the same effect can be obtained.

(4) When a conventional AD converter not provided with a detection function for terminal failures and the like is used, it is necessary to take, for example, the following method to obtain accurate measurement values: one sensor signal is inputted to at least three AD converters and three measurement values are simultaneously obtained with respect to this sensor signal; and a deviated measurement value is excluded from the obtained measurement values and an average value is calculated from the remaining measurement values.

Figure 16:
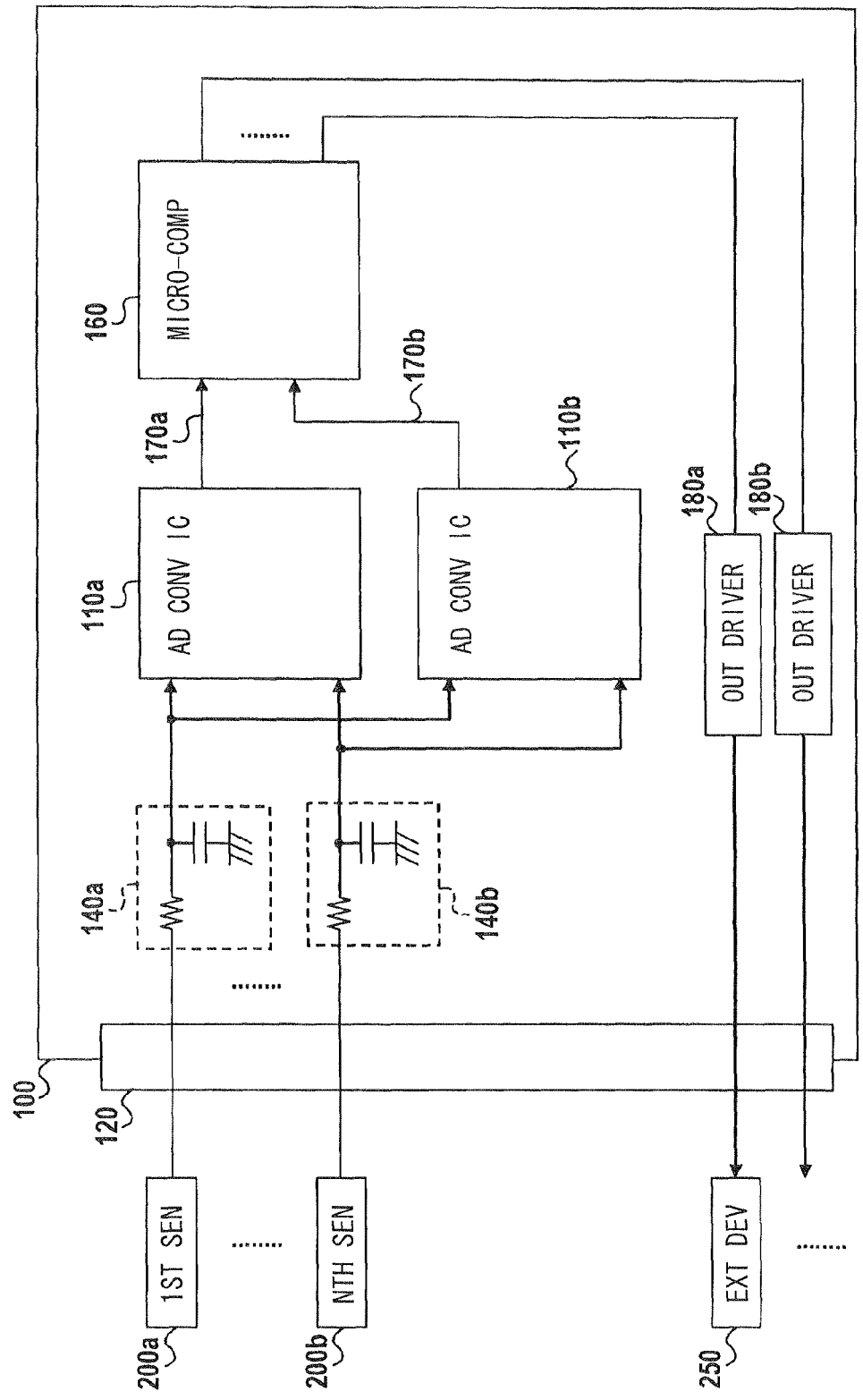
FIG. 16 is a block diagram illustrating the configuration of a sensor signal input circuit in another embodiment.

With the AD conversion IC 110 in this embodiment, meanwhile, it is possible to determine whether or not an accurate measurement value has been obtained based on the result of detection of a terminal failure or the like. For this reason, the following measure may be taken: as shown in the block diagram in FIG. 16, the sensor signal input circuit 100 doubly provided with the same AD conversion IC 110 as in the first to third embodiments and including one microcomputer 160 connected to these two AD conversion ICs is configured; and at the microcomputer 160, a measurement value obtained from an AD conversion IC 110 in which a terminal failure or the like has occurred is discarded. This makes it possible to reduce the number of AD converters and obtain the accurate voltage values of sensor signals.

(5) In the description of the first to third embodiments, the AD conversion IC 110 has been taken as an example. The same configuration may be applied to a microcomputer or the like. Even in this case, the same effect can be obtained.

Figure 17:
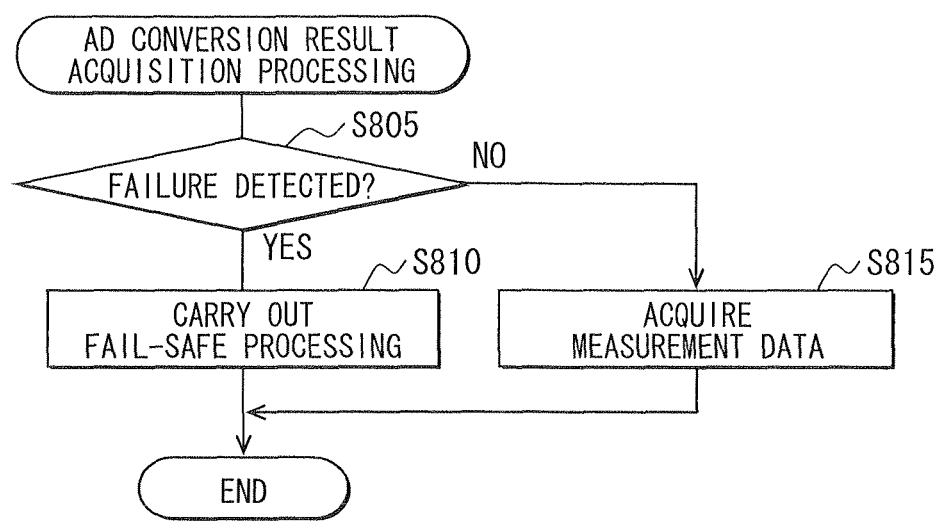
FIG. 17 is a flowchart of AD conversion result acquisition processing.

When the same configuration as in the first to third embodiments is applied to a microcomputer, the following pieces of data may be stored in a register (equivalent to the storage unit in claim 18) in correspondence with each other: measurement data obtained by AD conversion with respect to ch1 to chN and data indicating the presence or absence of a terminal failure, a C1$x$ failure, a SW, etc. failure, or an R2$x$ failure detected when each piece of measurement data is generated. Then the CPU of this microcomputer may take the procedure shown in the flowchart in FIG. 17 in AD conversion result acquisition processing for acquiring measurement data of a specific ch: it refers to the register to determine the presence or absence of a terminal failure or the like corresponding to this ch (Step S805); and when a terminal failure or the like has not occurred, it reads measurement data from the register (Step S815) and when a terminal failure or the like has occurred, it carries out fail-safe processing (Step S810). This makes it possible to reliably cope with any terminal failure and the like when the same configuration as in the first to third embodiment is applied to a microcomputer.

The sensor signal input circuit 100 is equivalent to signal input circuit; the AD conversion IC 110 is equivalent to measuring device and integrated circuit; the AD converter 116 is equivalent to measurement unit; the control circuit 115 is equivalent to control unit; the inspection power supply 117 is equivalent to charge/discharge unit; the multiplexer 114 is equivalent to selector switch; the microcomputer 160 is equivalent to processor; and the communication unit 113 is equivalent to transmission unit. The voltage change detection circuit 112 is equivalent to voltage change detection unit; the determination voltage hold circuit 112$a$ is equivalent to voltage value hold circuit; and the determination circuit 112$b$ and the determination result hold circuit 112$c$ are equivalent to difference hold circuit. The signal line 119$d$ is equivalent to measurement path; the inspection line 119$e$ is equivalent to inspection path; and the sensor signal is equivalent to input signal.

The AD conversion is equivalent to measurement processing; initialization and sampling in AD conversion are equivalent to reading procedure and comparison in the same is equivalent to generation procedure.

Step S401 of the first measurement period failure detection processing and Step S421 of the second measurement period failure detection processing in the first embodiment and Step S702 and Step S722 of the measurement period failure detection processing in the second embodiment are equivalent to charge/discharge procedure.

Step S404 of the first measurement period failure detection processing and Step S424 of the second measurement period failure detection processing in the first embodiment and Step S705 and Step S725 of the measurement period failure detection processing in the second embodiment are equivalent to continuity establishing procedure.

The input-side resistor failure detection processing is equivalent to resistor failure detection processing.

Step S501 to Step S507 of the SW, etc. failure detection processing are equivalent to inspection switch failure detection processing and Step S508 to Step S522 of the same are equivalent to charge/discharge unit failure detection processing.

The C1$x$ failure is equivalent to failure in input-side capacitor and the R2$x$ failure is equivalent to resistor failure.

Fourth Embodiment

Description will be given to a sensor signal input circuit in the fourth embodiment.

(Description of Configuration)

Figure 18:
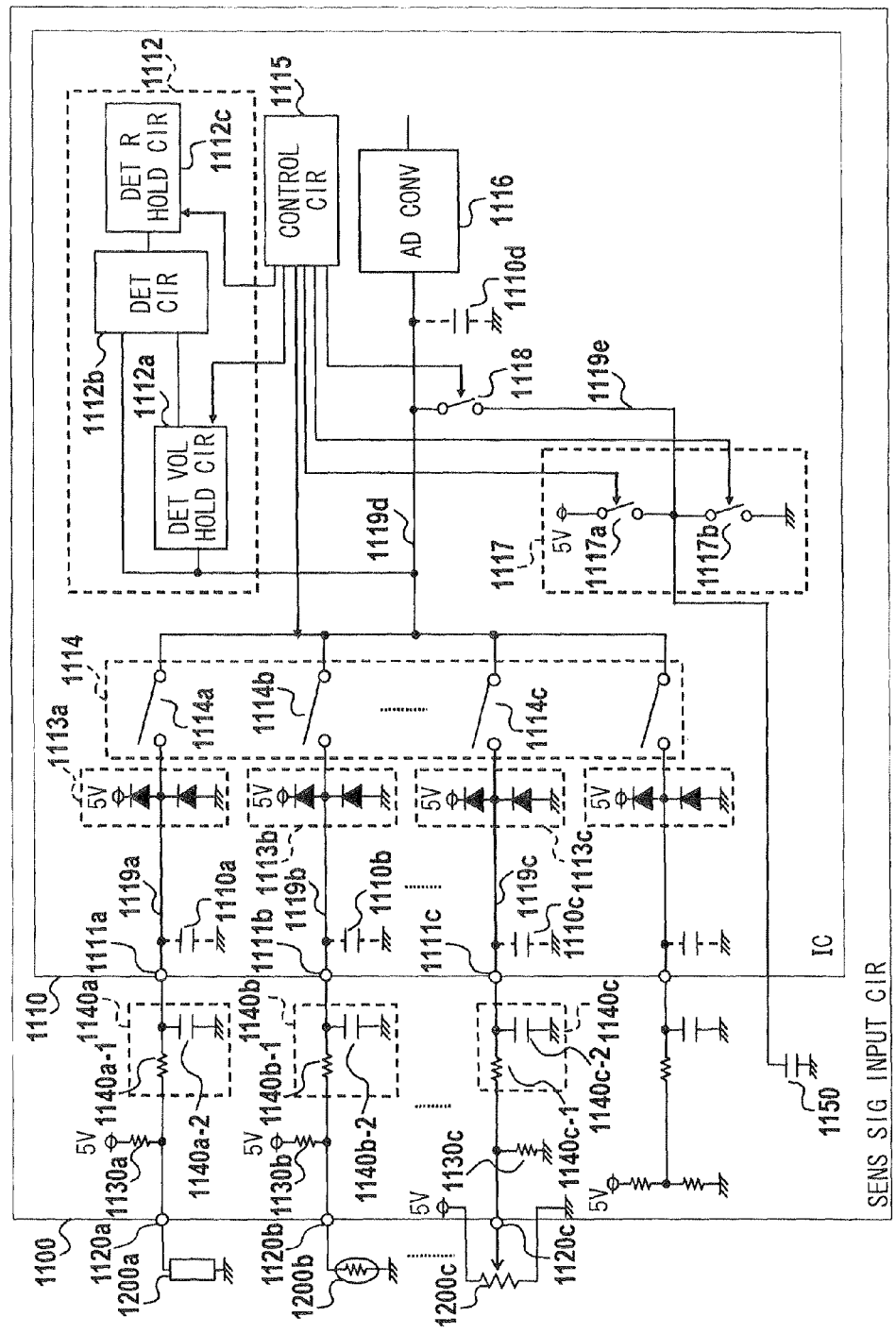
FIG. 18 is a block diagram illustrating the configuration of a sensor signal input circuit in a fourth embodiment.

FIG. 18 is a block diagram illustrating the configuration of the sensor signal input circuit 1100 in the fourth embodiment. The sensor signal input circuit 1100 is connected with first to Nth sensors 1200$a$ to 1200$c$ that generate sensor signals whose voltage value varies within a range of 0V to 5V according to the state of a measuring object and a user's operation. Examples of these sensors are a temperature sensor and a throttle position sensor that detects the state of operation of the accelerator of the relevant vehicle. The sensor signal input circuit 100 detects the voltage values of sensor signals inputted from these sensors by AD conversion and carries out processing based on the detected voltage values.

Specifically, the sensor signal input circuit 1100 includes: first to Nth external input terminals 1120$a$ to 1120$c$ respectively connected to the first to Nth sensors 1200$a$ to 1200$c$; and first to Nth signal input terminals 1111$a$ to 1111$c$ respectively connected to the first to Nth external input terminals 1120$a$ to 1120$c$. It further includes IC 1110 that carries out AD conversion on sensor signals inputted from the first to Nth sensors 1200$a$ to 1200$c$ through these terminals. The IC 1110 may be configured as a microcomputer, IC for AD conversion, or the like.

Further, the sensor signal input circuit 1100 includes: first to Nth resistors 1130$a$ to 1130$c$ connected to the first to Nth external input terminals 1120$a$ to 1120$c$; and first to Nth filter circuits 1140$a$ to 1140$c$ respectively provided between the first to Nth external input terminals 1120$a$ to 1120$c$ and the first to Nth signal input terminals 1111$a$ to 1111$c$. Further, the sensor signal input circuit 1100 includes an inspection capacitor 1150 one end of which is connected to a terminal of the IC 1110 and the other end of which is connected to reference potential and which is used to inspect the first to Nth signal input terminals 1111$a$ to 1111$c$ and the like. (Details will be described later.) The first filter circuit 1140$a$ includes: an input-side resistor 1140$a$-1 provided on the line connecting the first external input terminal 1120$a$ and the first signal input terminal 1111$a$; and an input-side capacitor 1140$a$-2 provided between the first signal input terminal 1111$a$ and reference potential. The other filter circuits are similarly configured.

Further, the IC 1110 includes: a multiplexer 1114 (also referred to as MPX) comprised of first to Nth switches 1114$a$ to 1114$c$ and the like that respectively control the connection between the first to Nth signal input terminals 1111a to 1111c and a signal line 1119d; an AD converter 1116 that detects the voltage value of the signal line 1119d within a range of 0 to 5V by AD conversion; and first to Nth surge protection circuits 1113a to 1113c respectively provided between the first to Nth signal input terminals 1111a to 1111c and the multiplexer 1114 to protect the circuit from surge current. The AD converter 1116 is provided with a sampling capacitor (not shown) connected to the signal line 1119d. The voltage value of the signal line 1119d is detected by detecting the voltage value of the sampling capacitor charged with signals transmitted through the signal line 1119d by AD conversion. The first surge protection circuit 1113a is comprised of: a diode whose anode is connected to a first input line 1119a connecting the first signal input terminal 1111a and the multiplexer 1114 and whose cathode is connected to a 5V power supply; and a diode whose cathode is connected to the first input line 1119a and whose anode is connected to reference potential. The other surge protection circuits are similarly configured.

Further, the IC 1110 includes: an inspection switch 1118 that is provided on an inspection line 1119e connecting the signal line 1119d and the above-mentioned inspection capacitor 1150 and establishes or breaks continuity in the inspection line 1119e; an inspection power supply 1117 that applies voltage to the inspection capacitor 1150; a voltage change detection circuit 1112 that detects to what extent the voltage value has changed in the signal line 1119d during a predetermined period; and a control circuit 1115 that controls the multiplexer 1114, AD converter 1116, inspection power supply 1117, inspection switch 1118, and voltage change detection circuit 1112.

The inspection power supply 1117 is comprised of: a 5V switch 1117a for setting the state of connection of the 5V power supply; and a 0V switch 1117b for setting the state of connection of reference potential. By turning ON either of these switches, voltage of 5V or 0V is applied to the inspection capacitor 1150.

The voltage change detection circuit 1112 includes: a determination voltage hold circuit 1112a configured as a latch circuit for holding the voltage value of the signal line 1119d according to a determination voltage hold signal from the control circuit 1115; a determination circuit 1112b that determines the difference between the voltage value held in the determination voltage hold circuit 1112a and the voltage value of the signal line 1119d; and a determination result hold circuit 1112c that holds the difference detected by the determination circuit 1112b as a determination result hold value according to a determination result hold signal from the control circuit 1115.

In the IC 1110, parasitic capacitances 1110a to 1110d of 5 pF or so are generated between the first to Nth signal input terminals 1111a to 1111c and reference potential and between the signal line 1119d and reference potential.

The capacitance of the input-side capacitor provided in each signal input terminal is larger than the capacitance of the inspection capacitor 1150. For example, the capacitance of the input-side capacitor may be 0.1 µF and the capacitance of the inspection capacitor 1150 may be 0.01 µF.

(Description of Operation)

Description will be given to the operation of the sensor signal input circuit 1100 in the fourth embodiment. The sensor signal input circuit 1100 detects various failures, such as a break in a communication path for sensor signals, by causing the migration of electric charges between the following by the inspection power supply 1117, inspection switch 1118, multiplexer 1114, and the like: between the input-side capacitor connected to any one signal input terminal as the test object and the inspection capacitor 1150.

(1) 5V Charge Processing

Figure 19A:
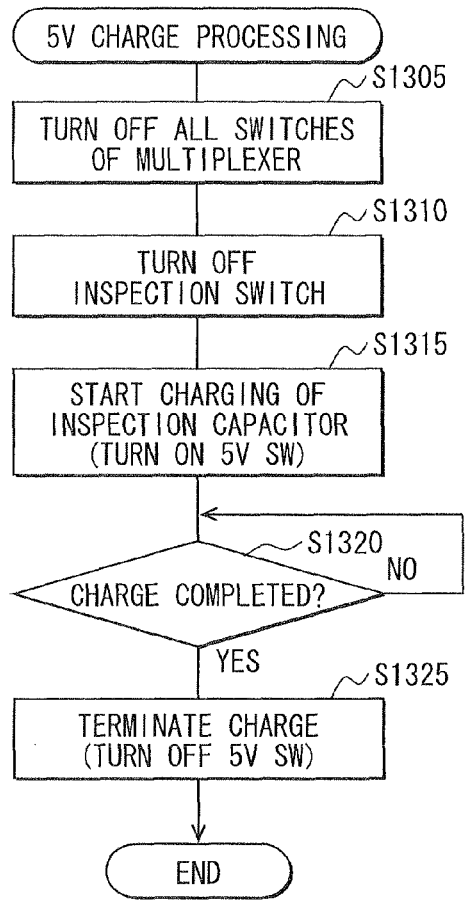
FIG. 19A is a flowchart of 5V charge processing in the fourth embodiment.

Description will be given to 5V charge processing in which the voltage value of the inspection capacitor 1150 is set to 5V by applying voltage of 5V to the inspection capacitor 1150 with reference to the flowchart in FIG. 19A. This processing is carried out by the control circuit 1115 of the IC 1110 when failure detection is carried out.

At Step S1305, the control circuit 1115 of the IC 1110 turns OFF all the switches of the multiplexer 1114 to disconnect all the signal input terminals and the signal line 1119d from each other. Then the flow proceeds to the flow proceeds to the processing of Step S1310.

At Step S1310, the control circuit 1115 turns OFF the inspection switch 1118 to disconnect the signal line 1119d and the inspection capacitor 1150 from each other. Then the flow proceeds to the processing of Step S1315.

At Step S1315, the control circuit 1115 turns ON the 5V switch 1117a of the inspection power supply 1117 and turns OFF the 0V switch 1117b thereof to apply a voltage of 5V to the inspection capacitor 1150. Then the flow proceeds to the processing of Step S1320.

At Step S1320, the control circuit 1115 determines whether or not a predetermined time has passed after the start of voltage application. When an affirmative determination is made (Step S1320: Yes), the flow proceeds to the processing of Step S1325; and when a negative determination is made (Step S1320: No), the flow proceeds to the processing of Step S1320.

At Step S1325, the control circuit 1115 turns OFF the 5V switch 1117a to terminate voltage application to the inspection capacitor 1150 and terminates this series of processing.

(2) 0V Charge Processing

Figure 19B:
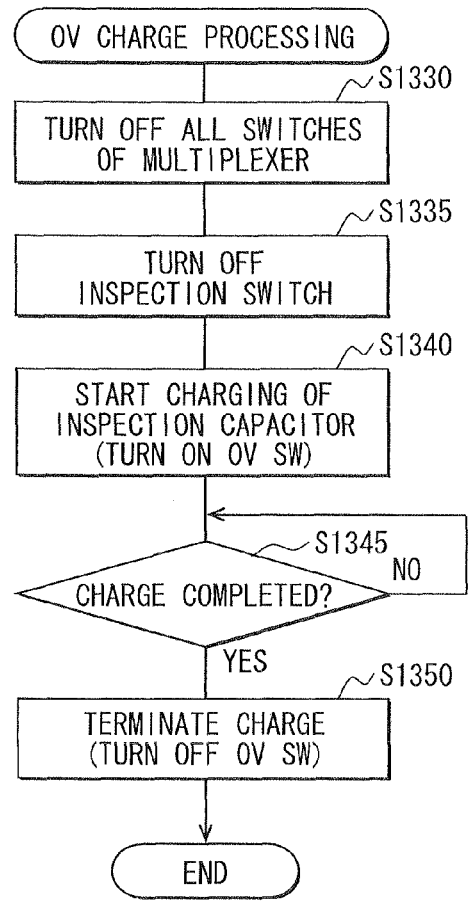
FIG. 19B is a flowchart of 0V charge processing in the fourth embodiment.

Description will be given to 0V charge processing in which the voltage value of the inspection capacitor 1150 is set to 0V by applying voltage of 0V to the inspection capacitor 1150 with reference to the flowchart in FIG. 19B. This processing is carried out by the control circuit 1115 of the IC 1110 when failure detection is carried out. The 0V charge processing is similar to the 5V charge processing and description will be given mainly to a difference from the 5V charge processing.

In the 0V charge processing, Step S1330 to Step S1350 respectively corresponding to Step S1305 to Step S1325 of the 5V charge processing are carried out.

At Step S1340 corresponding to Step S1315 of 5V charge processing, the control circuit 1115 turns OFF the 5V switch 1117a of the inspection power supply 1117 and turns ON the 0V switch 1117b thereof to apply a voltage of 0V to the inspection capacitor 1150. Then the flow proceeds to the processing of Step S1345.

At Step S1350 corresponding to Step S1325 of the 5V charge processing, the control circuit 1115 turns OFF the 0V switch 1117b to terminate voltage application to the inspection capacitor 1150 and terminates this series of processing.

At the other steps than Step S1340 and Step S1350, the same processing as that of the corresponding steps of the 5V charge processing is carried out.

(3) IC Failure Detection Processing

Description will be given to detection of an open failure in a signal input terminal of the IC 1110 or a terminal failure that is a break in the path from a signal input terminal to the inspection switch 1118.

With the inspection capacitor 1150 disconnected from all the signal input terminals, an inspection voltage value within the variation range of a sensor signal is applied to the inspection capacitor 1150 and the voltage across the inspection capacitor 1150 is set to the inspection voltage value. Thereafter, continuity is established between the inspection capacitor 1150 and any signal input terminal. When the voltage value of the signal line 1119d is kept close to the inspection voltage value generated by the inspection capacitor 1150 at this time, it is guessed that the inspection capacitor 1150 is not charged or discharged and a terminal failure has occurred.

However, when the sensor signal itself is close to the inspection voltage value, the signal line 1119d is brought close to the inspection voltage value even though a terminal failure has not occurred. Therefore, it cannot be determined that a terminal failure has occurred. In this embodiment, consequently, the voltage value of the signal line 1119d is detected by taking the following measure: 5V charge processing and 0V charge processing are carried out and then continuity is established between the inspection capacitor 1150 and a signal input terminal. When the signal line 1119d takes values close to 5V and 0V after 5V charge processing and 0V charge processing, it is considered that a terminal failure has occurred.

Figure 20:
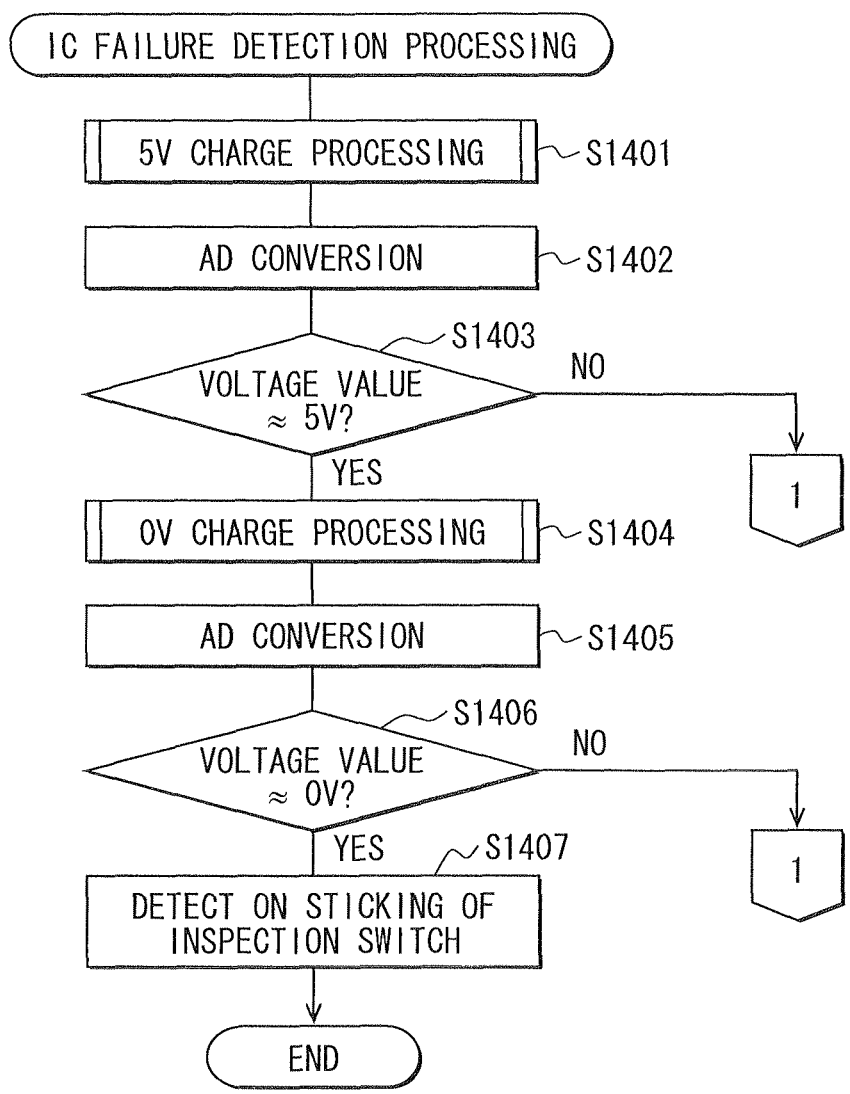
FIG. 20 is a flowchart of IC failure detection processing in the fourth embodiment.
Figure 21:
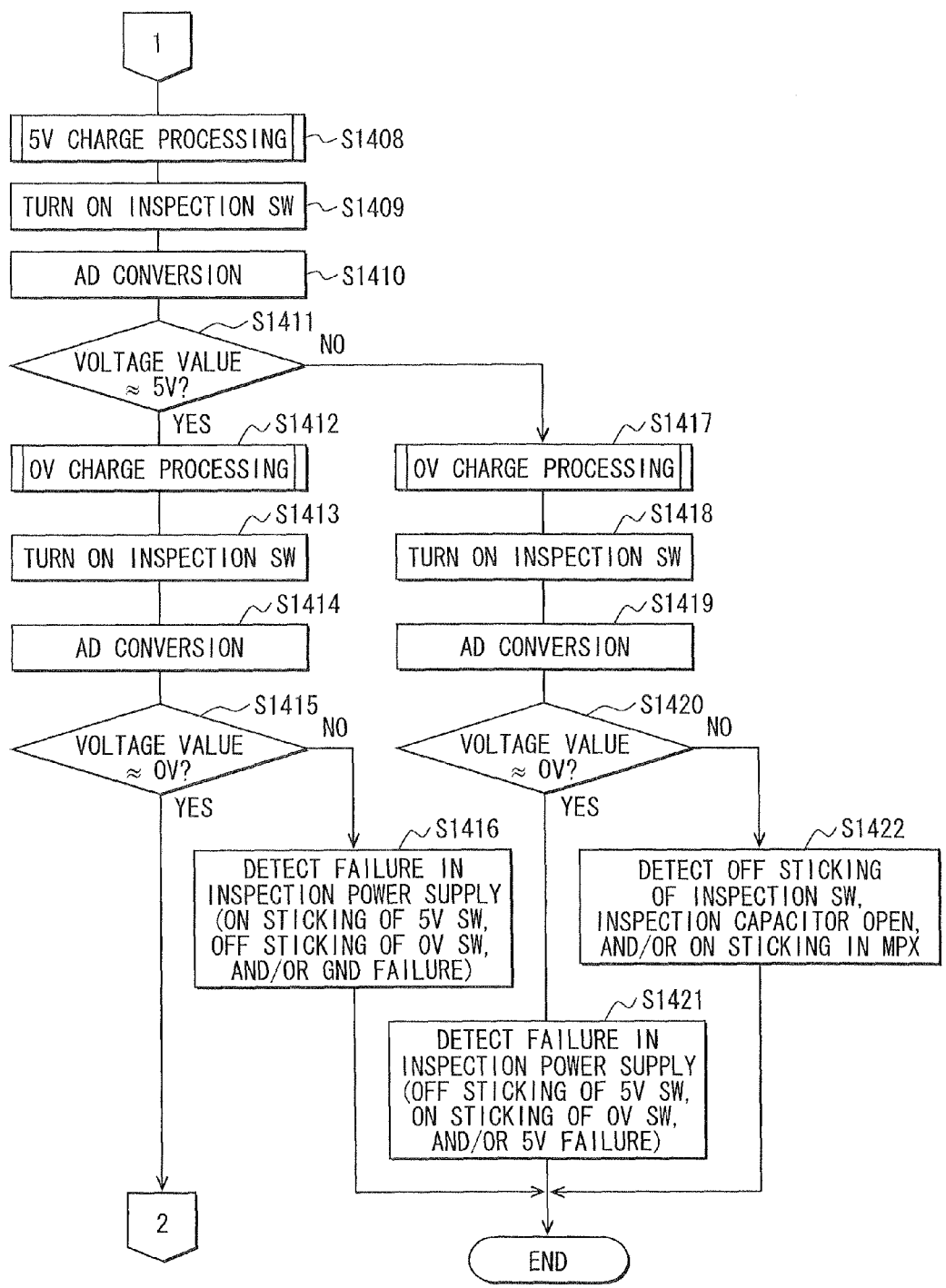
FIG. 21 is a flowchart of the IC failure detection processing in the fourth embodiment.
Figure 22:
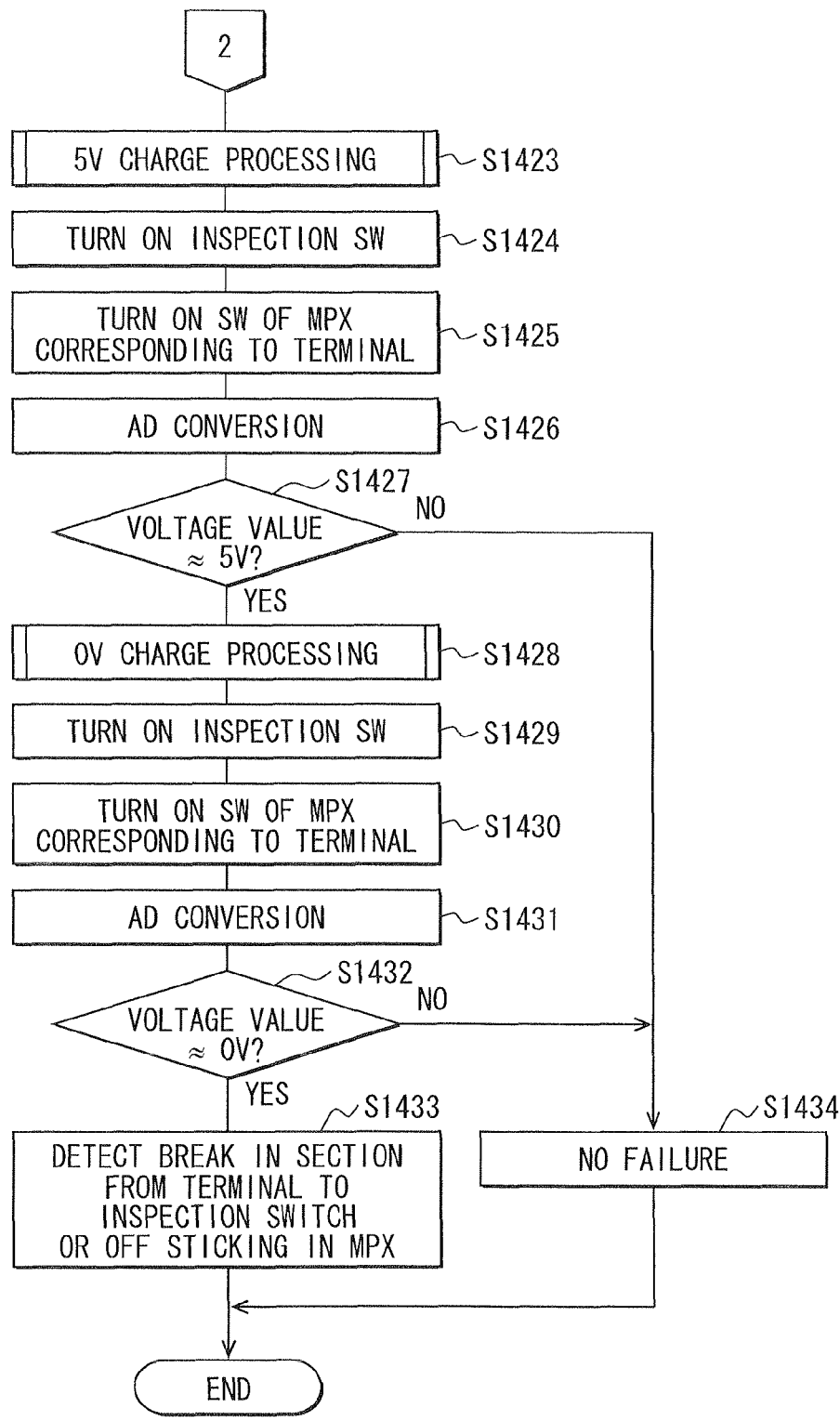
FIG. 22 is a flowchart of the IC failure detection processing in the fourth embodiment.

Description will be given to IC failure detection processing for detecting any terminal failure and the like with reference to the flowcharts in FIGS. 20 to 22. This series of processing is carried out with any one signal input terminal taken as the test object and periodically carried out with the signal input terminal as the test object changed during the operation of the sensor signal input circuit 100.

At Step S1401, the control circuit 1115 of IC 1110 carries out 5V charge processing to set the voltage of the inspection capacitor 1150 to 5V and the flow proceeds to the processing of Step S1402.

At Step S1402, the control circuit 115 causes the AD converter 116 to carry out AD conversion to detect the voltage of the signal line 1119d. Then the flow proceeds to the processing of Step S1403.

At Step S1403, the control circuit 1115 determines whether or not the detected voltage value is 5V or a value close to 5V. When an affirmative determination is made (Step S1403: Yes), the flow proceeds to the processing of Step S1404; and when a negative determination is made (Step S1403: No), the flow proceeds to the processing of Step S1408 in FIG. 21.

At Step S1404, the control circuit 1115 carries out 0V charge processing to set the voltage of the inspection capacitor 1150 to 0V and the flow proceeds to the processing of Step S1405.

At Step S405, the control circuit 1115 causes the AD converter 1116 to carry out AD conversion to detect the voltage of the signal line 1119d. Then the flow proceeds to the processing of Step S1406.

At Step S1406, the control circuit 1115 determines whether or not the detected voltage value is 0V or a value close to 0V. When an affirmative determination is made (Step S1406: Yes), the flow proceeds to the processing of Step S1407; and when a negative determination is made (Step S1406: No), the flow proceeds to the processing of Step S1408 in FIG. 21.

At Step S1407, the control circuit 1115 considers that the inspection switch 1118 is stuck in ON position and terminates this series of processing.

Description will be given with reference to FIG. 21. At Step S1408 to which the flow proceeds when a negative determination is made at Step S1403 or Step S1406, the control circuit 1115 carries out 5V charge processing. Then the flow proceeds to the processing of Step S1409.

At Step S1409, the control circuit 1115 turns ON the inspection switch 118 and the flow proceeds to the processing of Step S1410.

At Step S1410, the control circuit 1115 causes the AD converter 1116 to carry out AD conversion to detect the voltage of the signal line 1119d. Then the flow proceeds to the processing of Step S1411.

At Step S1411, the control circuit 1115 determines whether or not the detected voltage value is 5V or a value close to 5V. When an affirmative determination is made (Step S1411: Yes), the flow proceeds to the processing of Step S1412; and when a negative determination is made (Step S1411: No), the flow proceeds to the processing of Step S1417.

At Step S1412, the control circuit 1115 carries out 0V charge processing and the flow proceeds to the processing of Step S1413.

At Step S1413, the control circuit 1115 turns ON the inspection switch 1118 and the flow proceeds to the processing of Step S1414.

At Step S1414, the control circuit 1115 causes the AD converter 1116 to carry out AD conversion to detect the voltage of the signal line 1119d. Then the flow proceeds to the processing of Step S1415.

At Step S1415, the control circuit 1115 determines whether or not the detected voltage value is 0V or a value close to 0V. When an affirmative determination is made (Step S1415: Yes), the flow proceeds to the processing of Step S1423 in FIG. 22; and when a negative determination is made (Step S1415: No), the flow proceeds to the processing of Step S1416.

At Step S416, the control circuit 1115 considers that a failure (at least any one of ON sticking of the 5V switch 1117a, OFF sticking of the 0V switch 1117b, and reference potential failure) has occurred in the inspection power supply 1117. Then it terminates this series of processing.

At Step S1417 to which the flow proceeds when a negative determination is made at Step S1411, the control circuit 1115 carries out 0V charge processing and the flow proceeds to the processing of Step S1418.

At Step S1418, the control circuit 1115 turns ON the inspection switch 1118 and the flow proceeds to the processing of Step S1419.

At Step S1419, the control circuit 1115 causes the AD converter 1116 to carry out AD conversion to detect the voltage of the signal line 1119d. Then the flow proceeds to the processing of Step S1420.

At Step S1420, the control circuit 1115 determines whether or not the detected voltage value is 0V or a value close to 0V. When an affirmative determination is made (Step S1420: Yes), the flow proceeds to the processing of Step S1421; and when a negative determination is made (Step S1420: No), the flow proceeds to the processing of Step S1422.

At Step S1421, the control circuit 1115 considers that a failure (at least any one of OFF sticking of the 5V switch 1117a, ON sticking of the 0V switch 1117b, and a failure in the 5V power supply) has occurred in the inspection power supply 1117. Then it terminates this series of processing.

At Step S1422, meanwhile, the control circuit 1115 considers that at least any one of OFF sticking of the inspection switch 1118, an open failure in the inspection capacitor 1150, and ON sticking of a switch of the multiplexer 1114 has occurred. Then it terminates this series of processing.

Description will be given with reference to FIG. 22. At Step S1423 to which the flow proceeds when an affirmative determination is made at Step S1415, the control circuit 1115 carries out 5V charge processing and the flow proceeds to the processing of Step S1424.

At Step S1424, the control circuit 1115 turns ON the inspection switch 118 and the flow proceeds to the processing of Step S1425.

At Step S1425, the control circuit 1115 turns ON the switch of the multiplexer 1114 connected to a signal input terminal as the test object to establish continuity between the signal input terminal and the signal line 1119d. Then the flow proceeds to the processing of Step S1426.

At Step S1426, the control circuit 1115 causes the AD converter 1116 to carry out AD conversion to detect the voltage of the signal line 1119d. Then the flow proceeds to the processing of Step S1427.

At Step S1427, the control circuit 1115 determines whether or not the detected voltage value is 5V or a value close to 5V. When an affirmative determination is made (Step S1427: Yes), the flow proceeds to the processing of Step S1428; and when a negative determination is made (Step S1427: No), the flow proceeds to the processing of Step S1434.

At Step S1428, the control circuit 1115 carries out 0V charge processing and the flow proceeds to the processing of Step S1429.

At Step S1429, the control circuit 1115 turns ON the inspection switch 118 and the flow proceeds to the processing of Step S1430.

At Step S1430, the control circuit 1115 turns ON the switch of the multiplexer 114 connected to the signal input terminal as the test object and the flow proceeds to the processing of Step S1431.

At Step S1431, the control circuit 1115 causes the AD converter 1116 to carry out AD conversion to detect the voltage of the signal line 1119d. Then the flow proceeds to the processing of Step S1432.

At Step S1432, the control circuit 1115 determines whether or not the detected voltage value is 0V or a value close to 0V. When an affirmative determination is made (Step S1432: Yes), the flow proceeds to the processing of Step S1433; and when a negative determination is made (Step S1432: No), the flow proceeds to the processing of Step S1434.

At Step S1433, the control circuit 1115 considers that a terminal failure or OFF sticking of the switch of the multiplexer 1114 connected to the signal input terminal as the test object has occurred and terminates this series of processing.

At Step S1434, meanwhile, the control circuit 1115 considers that there is no failure such as an open failure in a signal input terminal and terminates this series of processing.

FIG. 23 is a table listing the failures detected by IC failure detection processing. As listed in the table, at Step S1401 to Step S1407 of IC failure detection processing, ON sticking of the inspection switch 1118 is detected in the following cases: cases where the voltage value detected after 5V charge processing is close to 5V and the voltage value detected after 0V charge processing is close to 0V.

At Step S1408 to Step S1422 of IC failure detection processing, any of ON sticking of the 5V switch 1117, OFF sticking of the 0V switch 1117b, and reference potential failure is detected in the following cases: cases where the voltage value detected after 5V charge processing is close to 5V and the voltage value detected after 0V charge processing is not close to 0V. Any of OFF sticking of the 5V switch 1117a, ON sticking of the 0V switch 1117b, and a failure in the 5V power supply is detected in the following cases: cases where the voltage value detected after 5V charge processing is not close to 5V and the voltage value detected after 0V charge processing is close to 0V. Any of OFF sticking of the inspection switch 1118, an open failure in the inspection capacitor 1150, and ON sticking of a switch of the multiplexer 1114 is detected in the following cases: cases where the voltage value detected after 5V charge processing is not close to 5V and the voltage value detected after 0V charge processing is not close to 0V.

At Step S1423 to Step S1434 of IC failure detection processing, either of the following is detected: a break in the section from the signal input terminal as the test object to the inspection switch 1118 (terminal failure) and OFF sticking of a switch of the multiplexer 1114 connected to the signal input terminal as the test object. These failures are detected in the following cases: cases where the voltage value detected after 5V charge processing is close to 5V and the voltage value detected after 0V charge processing is close to 0V.

(4) Input-Side Resistor Failure Detection Processing

Description will be given to input-side resistor failure detection processing for detecting an open failure in the input-side resistors forming the filter circuits 1140a to 1140c connected to the first to Nth signal input terminals 1111a to 1111c.

(4-1) Overview

In the IC 1110 of the sensor signal input circuit 1100, the following takes place when the processing of establishing continuity between any signal input terminal and the inspection capacitor 1150 is carried out after the execution of 5V charge processing or 0V charge processing: migration of electric charges between the input-side capacitor connected to the signal input terminal and the inspection capacitor 1150. (The above processing of establishing continuity will be referred to as continuity establishment processing.) At normal times, electric charges migrate between a source external to the sensor signal input circuit 1100 and the input-side capacitor and the inspection capacitor. After the execution of continuity establishment processing, therefore, the voltage value of the signal input terminal temporarily varies. Thereafter, however, the voltage value of the signal input terminal becomes equal to the voltage value of a sensor signal. When an open failure has occurred in the input-side resistor, meanwhile, migration of electric charges is not caused between a source external to the sensor signal input circuit 1100 and the capacitors. When 5V charge processing or the like and continuity establishment processing are repeated more than once, the voltage value of the signal input terminal approaches 5V or 0V.

In the sensor signal input circuit 1100, a break in the input-side resistor connected to a signal input terminal is detected by taking the following measure: the voltage value of the signal input terminal is detected after 5V charge processing or the like and continuity establishment processing are repeated more than once.

Figure 24:
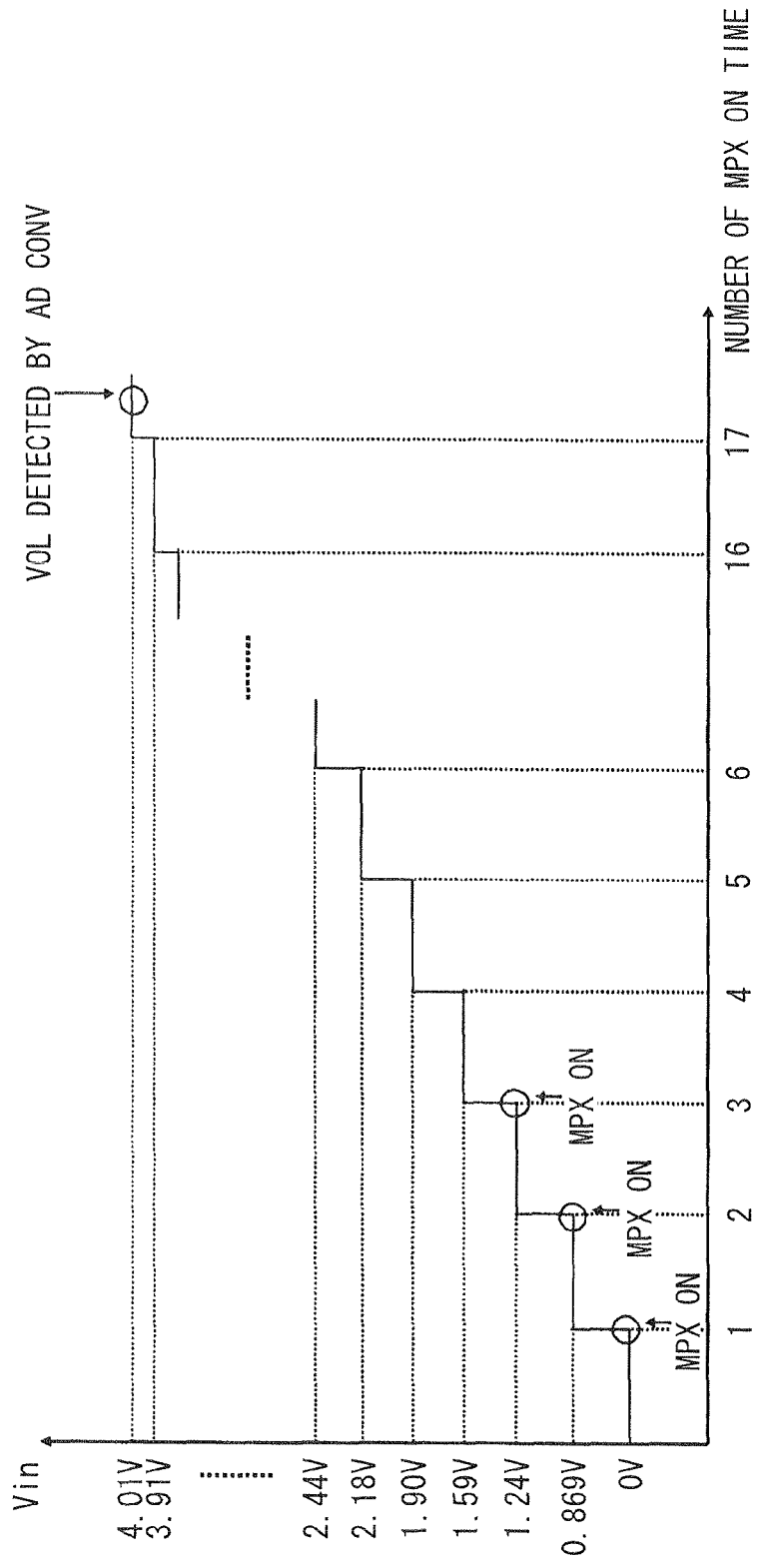
FIG. 24 is a timing chart showing change in the voltage of a signal input terminal observed when a sensor signal is at 0V and 5V charge processing and the like are repeated after the occurrence of an open failure in an input-side resistor.

Description will be given with concrete examples cited. FIG. 24 is a timing chart showing change in the voltage value $V_{in}$ of the signal input terminal connected to an input-side resistor observed in the following cases: cases where the voltage value of a sensor signal is 0V and 5V charge processing and continuity establishment processing are repeated after the occurrence of an open failure in the input-side resistor. 0V is taken for the voltage of the sensor signal immediately before the occurrence of an open failure in the input-side resistor.

As shown in FIG. 24, the following takes place after an open failure occurs in an input-side resistor: each time 5V charge processing and continuity establishment processing (in FIG. 24, continuity establishment processing is referred to as MPX ON) are carried out, the voltage value $V_{in}$ of the signal input terminal increases stepwise. The increment in $V_{in}$ after the execution of continuity establishment processing and the like is determined based on the capacitances of the inspection capacitor 1150 and the input-side capacitors, parasitic capacitance, and the like. FIG. 24 shows change in $V_{in}$ observed in the following case as an example: a case where the capacitances of the inspection capacitor 1150 and each input-side capacitor, the parasitic capacitance of each signal input terminal, and the parasitic capacitance of the signal line 1119*d* are 0.01 μF, 0.1 μF, 5 pF, and 5 pF.

Figure 25:
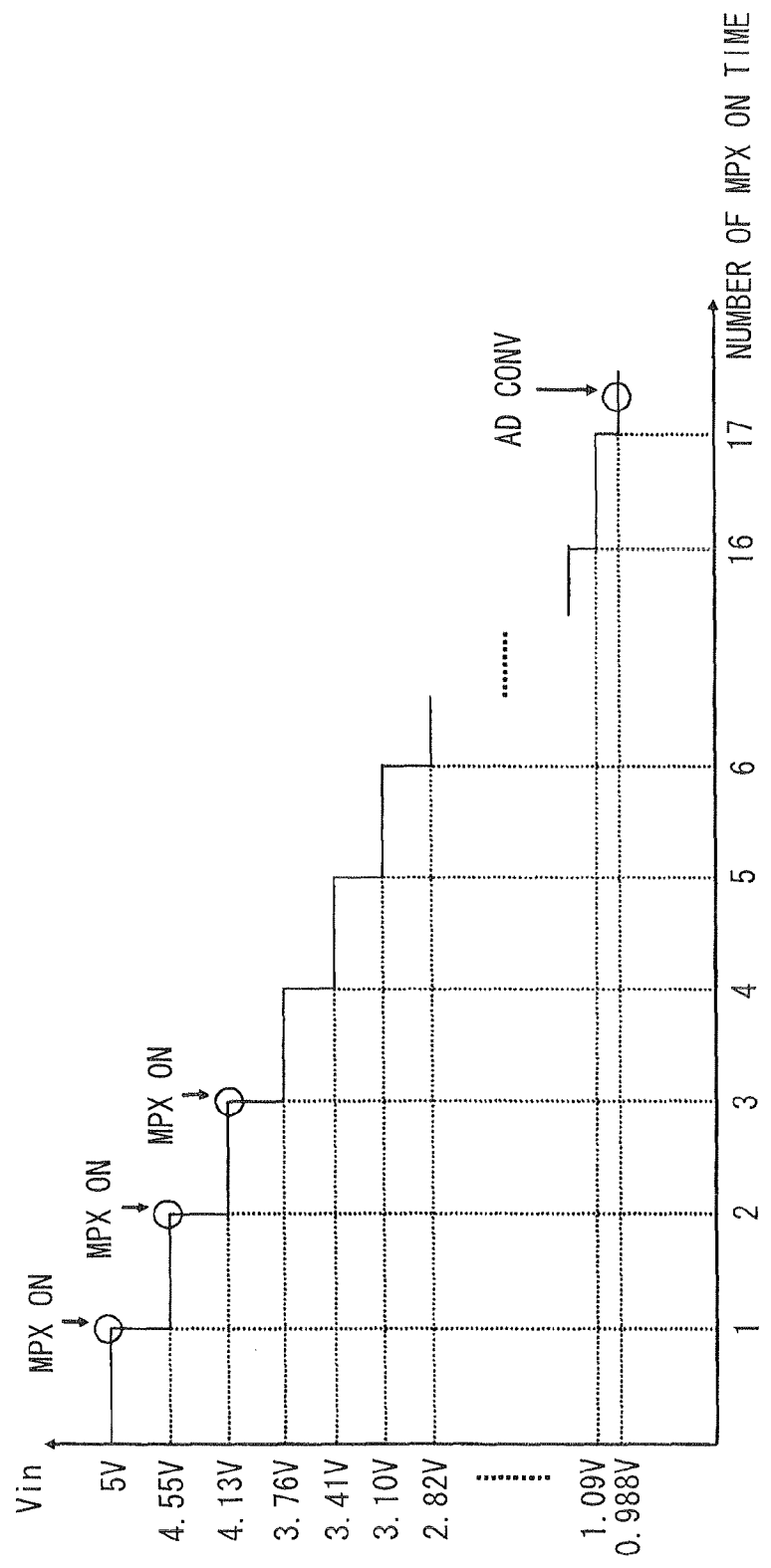
FIG. 25 is a timing chart showing change in the voltage of a signal input terminal observed when a sensor signal is at 5V and 0V charge processing and the like are repeated after the occurrence of an open failure in an input-side resistor.

FIG. 25 is a timing chart showing change in the voltage value $V_{in}$ of the signal input terminal in the following cases: cases where the voltage value of a sensor signal is 5V and 0V charge processing and continuity establishment processing are repeated after the occurrence of an open failure in the input-side resistor. 5V is taken for the voltage of the sensor signal immediately before the occurrence of an open failure in the input-side resistor.

As shown in FIG. 25, the following takes place after an open failure occurs in an input-side resistor: each time 0V charge processing and continuity establishment processing are carried out, the voltage value $V_{in}$ of the signal input terminal decreases stepwise. The decrement in $V_{in}$ after the execution of continuity establishment processing and the like is also determined based on the capacitances of the inspection capacitor 1150 and the input-side capacitors, parasitic capacitance, and the like. FIG. 25 shows change in $V_{in}$ observed when the capacitances of the inspection capacitor 1150 and the like are set as in the case in FIG. 24.

When the voltage value of a sensor signal is close to 5V or close to 0V, the following takes place even though an open failure has not occurred in an input-side resistor: after 5V charge processing or the like and continuity establishment processing are repeated, the voltage value of the signal input terminal approaches 5V or 0V.

In input-side resistor failure detection processing, consequently, it is considered that an open failure has occurred in an input-side resistor in cases where: the voltage value of the signal input terminal is close to 5V after 5V charge processing and continuity establishment processing are repeated more than once; and the voltage value of the signal input terminal is close to 0V after 0V charge processing and continuity establishment processing are repeated more than once.

(4-2) Details

Figure 26:
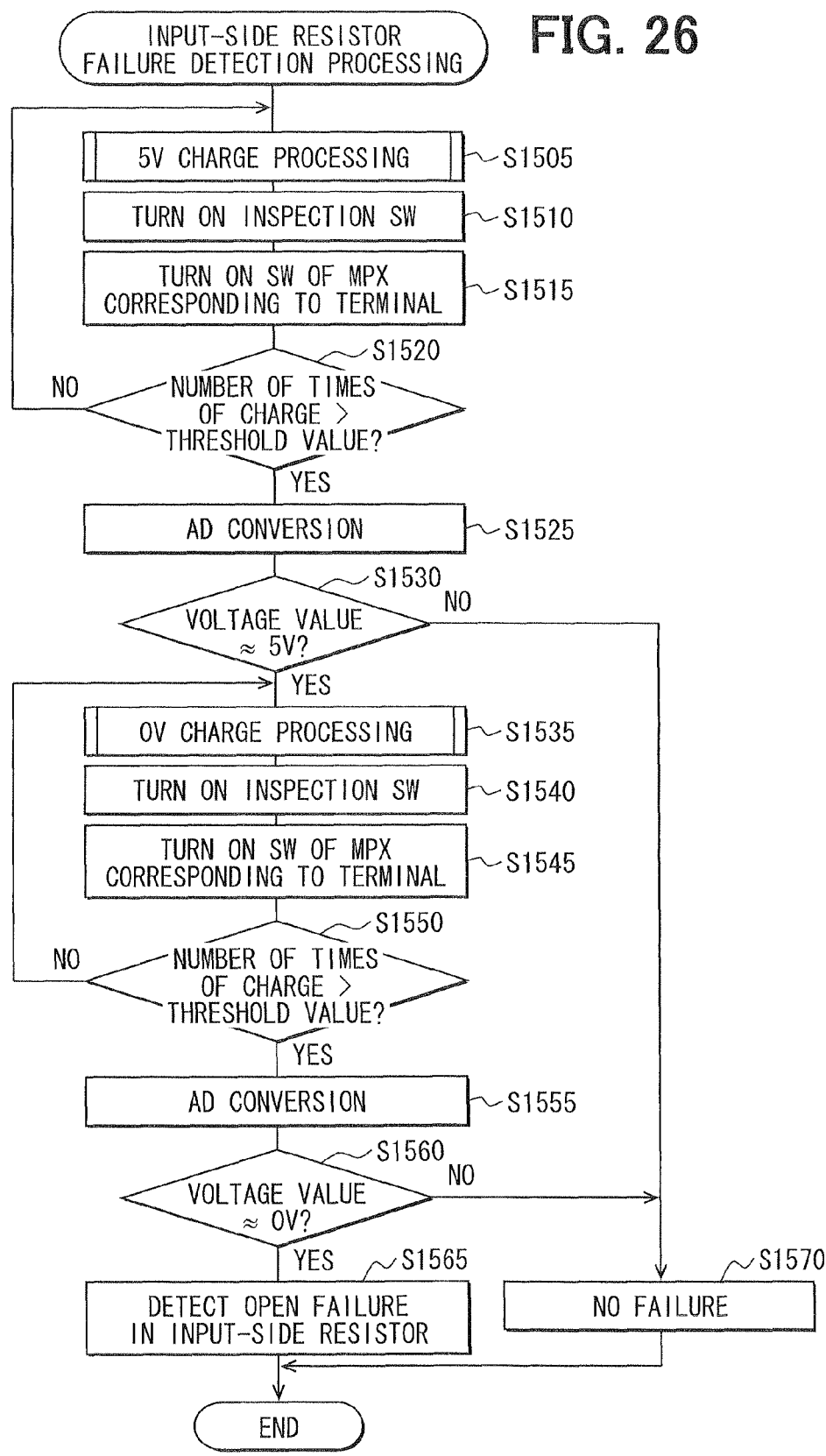
FIG. 26 is a flowchart of input-side resistor failure detection processing in the fourth embodiment.

Description will be given to the details of input-side resistor failure detection processing with reference to the flowchart in FIG. 26. This series of processing is carried out with any one input-side resistor taken as the test object and periodically carried out with the input-side resistor as the test object changed during the operation of the sensor signal input circuit 1100.

At Step S1505, the control circuit 1115 of the IC 1110 carries out 5V charge processing and the flow proceeds to the processing of Step S1510.

At Step S1510, the control circuit 1115 turns ON the inspection switch 118 and the flow proceeds to the processing of Step S1515.

At Step S1515, the control circuit 1115 turns ON a switch of the multiplexer 1114 connected to the signal input terminal leading to the input-side resistor as the test object and the flow proceeds to the processing of Step S1520.

At Step S1520, the control circuit 1115 determines whether or not the number of times of the execution of 5V charge processing has become higher than a predetermined threshold value. When an affirmative determination is made (Step S1520: Yes), the flow proceeds to the processing of Step S1525; and when a negative determination is made (Step S1520: No), the flow proceeds to the processing of Step S1505.

At Step S1525, the control circuit 1115 causes the AD converter 1116 to carry out AD conversion to detect the voltage of the signal line 1119*d*. Then the flow proceeds to the processing of Step S1530.

At Step S1530, the control circuit 1115 determines whether or not the detected voltage value is 5V or a value close to 5V. When an affirmative determination is made (Step S1530: Yes), the flow proceeds to the processing of Step S1535; and when a negative determination is made (Step S1530: No), the flow proceeds to the processing of Step S1570.

At Step S1535, the control circuit 1115 caries out 0V charge processing and the flow proceeds to the processing of Step S1540.

At Step S1540, the control circuit 1115 turns ON the inspection switch 118 and the flow proceeds to the processing of Step S1545.

At Step S1545, the control circuit 1115 turns ON a switch of the multiplexer 1114 connected to the signal input terminal leading to the input-side resistor as the test object and the flow proceeds to the processing of Step S1550.

At Step S1550, the control circuit 1115 determines whether or not the number of times of the execution of 0V charge processing has become higher than a predetermined threshold value. When an affirmative determination is made (Step S1550: Yes), the flow proceeds to the processing of Step S555; and when a negative determination is made (Step S1550: No), the flow proceeds to the processing of Step S1535.

At Step S1555, the control circuit 1115 causes the AD converter 1116 to carry out AD conversion to detect the voltage of the signal line 1119*d*. Then the flow proceeds to the processing of Step S1560.

At Step S1560, the control circuit 1115 determines whether or not the detected voltage value is 0V or a value close to 0V. When an affirmative determination is made (Step S1560: Yes), the flow proceeds to the processing of Step S1565; and when a negative determination is made (Step S1560: No), the flow proceeds to the processing of Step S1570.

At Step S1565, the control circuit 1115 considers that an open failure has occurred in the input-side resistor as the test object and terminates this series of processing.

At Step S1570, meanwhile, the control circuit 1115 considers that a failure has not occurred in the input-side resistor as the test object and terminates this series of processing.

(5) Input-Side Capacitor Failure Detection Processing

Description will be given to input-side capacitor failure detection processing for detecting an open failure in the input-side capacitors forming the filter circuits 1140*a* to 1140*c* connected to the first to Nth signal input terminals 1111*a* to 1111*b*.

(5-1) Overview

In the sensor signal input circuit 1100 in the fourth embodiment, the following takes place when the processing of establishing continuity between any signal input terminal and the inspection capacitor 1150 is carried out after the execution of 5V charge processing or 0V charge processing: the inspection capacitor 1150 is charged or discharged and the voltage of the signal input terminal temporarily varies. (The above processing of establishing continuity will be referred to as continuity establishment processing.) When an input-side capacitor is not connected to a signal input terminal, the range of variation of the voltage of the signal input terminal is wider than when an input-side capacitor is connected. In the sensor signal input circuit 1100, an open failure in the input-side capacitor is detected by detecting this range of variation.

Figure 27A:
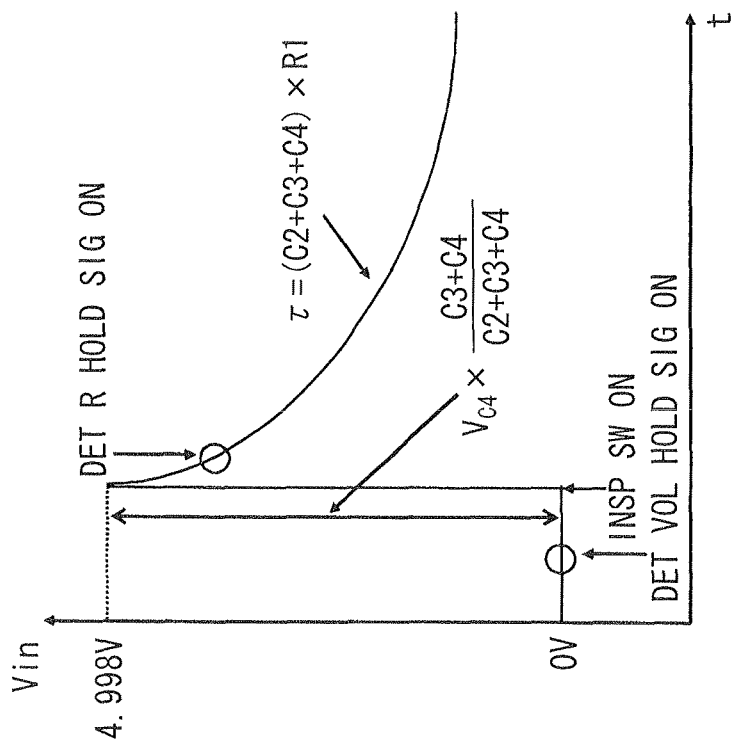
FIG. 27A is a timing chart showing change in the voltage of a signal input terminal observed when a sensor signal is at 0V and continuity is established between the inspection capacitor and the signal input terminal with 5V set on the inspection capacitor.
Figure 27B:
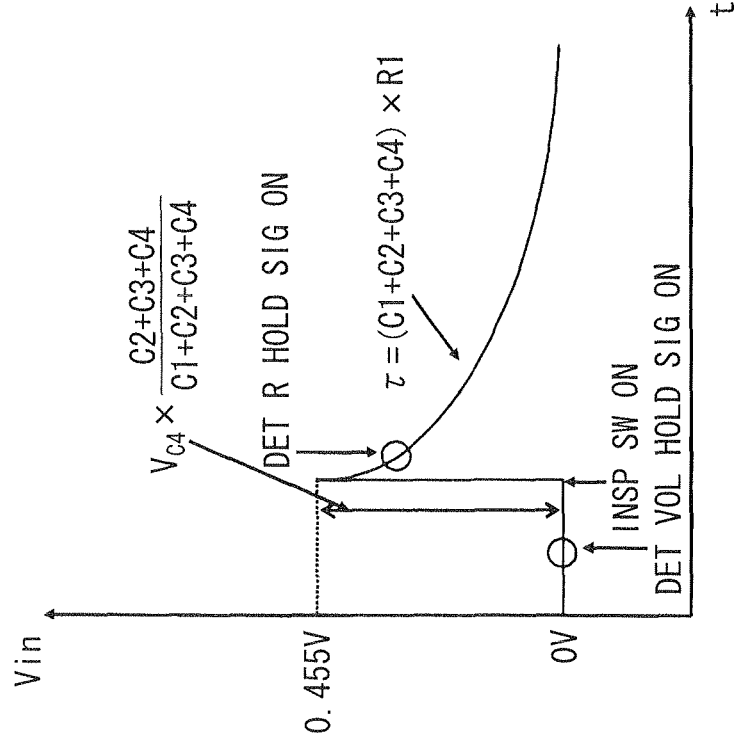
FIG. 27B is a timing chart showing change in the voltage of the signal input terminal observed when a sensor signal is at 0V and continuity is established between the inspection capacitor and the signal input terminal with 5V set on the inspection capacitor.

Description will be given with concrete examples cited. FIGS. 27A and 27B are timing charts showing change in the voltage value $V_{in}$ of the signal input terminal connected to an input-side capacitor as the test object observed in the following case: a case where the voltage value of a sensor signal inputted to the signal input terminal is 0V and continuity establishment processing is carried out after the execution of 5V charge processing. Letting the capacitance of the input-side capacitor be C1, the capacitance of the inspection capacitor be C4, and parasitic capacitances be C2 and C3, C1=0.1 μF, C4=0.01 μF, and C2 and C3=5 pF. FIG. 27A represents Normal times, and FIG. 27B represents open failure in input-side capacitor. In FIGS. 27A and 27B, letting the resistance value of the input-side resistor be R1, R1=10 kΩ. 0V is taken for the voltage of a sensor signal immediately before the occurrence of an open failure in the input-side capacitor and $V_{C4}$ is taken for the voltage of the inspection capacitor immediately before the inspection SW is turned ON. It is assumed that the capacitance of the input-side capacitor is C1, the parasitic capacitances produced in the IC 1110 are C2 and C3, the capacitance of the inspection capacitor 1150 is C4, and the resistance value of the input-side resistor is R1. $V_{C4}$ in FIGS. 27A and 27B denotes the voltage generated by the inspection capacitor 1150 immediately before continuity establishment processing. In this example, continuity establishment processing is carried out after 5V charge processing; therefore, $V_{C4}$ is 5V. The timing chart in FIG. 27A shows change in voltage value $V_{in}$ at normal times and the timing chart in FIG. 27B shows change in voltage value $V_{in}$ observed when an open failure occurs in an input-side capacitor.

At normal times, the following takes place when continuity establishment processing is carried out (referred to as inspection SW ON in FIGS. 27A and 27B): $V_{in}$ rises to $V_{C4} \times (C2+C3+C4)/(C1+C2+C3+C4)$ (V) and is thereafter reduced with a time constant τ of $(C1+C2+C3+C4) \times R1$. (Refer to FIG. 27A.)

With a break in the input-side capacitor, meanwhile, the following takes place when continuity establishment processing is carried out: $V_{in}$ rises to $V_{C4} \times (C3+C4)/(C2+C3+C4)$ (V) and is thereafter reduced with a time constant τ of $(C2+C3+C4) \times R1$. (Refer to FIG. 27B.)

Figure 28A:
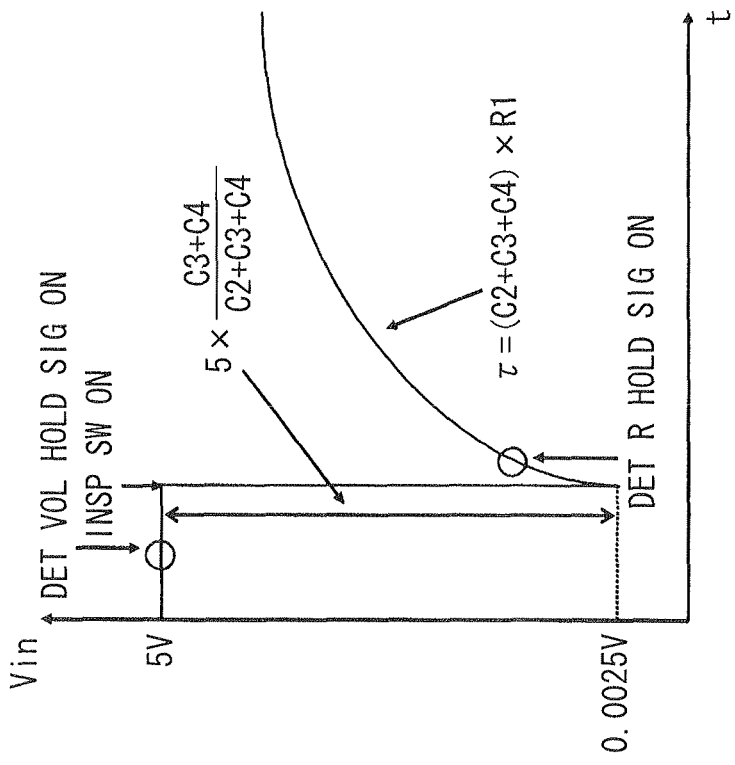
FIG. 28A is a timing chart showing change in the voltage of a signal input terminal observed when a sensor signal is at 5V and continuity is established between the inspection capacitor and the signal input terminal with 0V set on the inspection capacitor.
Figure 28B:
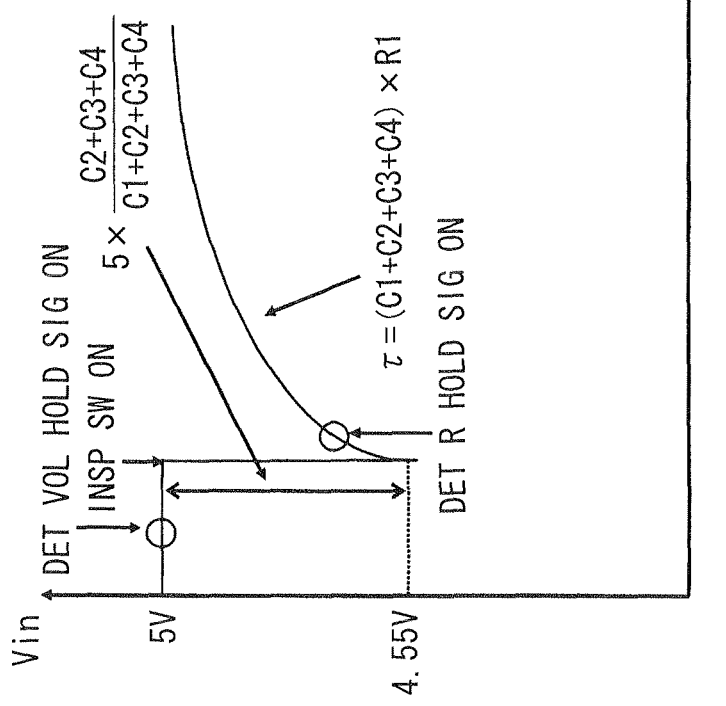
FIG. 28B is a timing chart showing change in the voltage of the signal input terminal observed when a sensor signal is at 5V and continuity is established between the inspection capacitor and the signal input terminal with 0V set on the inspection capacitor.

FIGS. 28A and 28B are timing charts showing change in the voltage value $V_{in}$ of the signal input terminal connected to an input-side capacitor as the test object observed in the following case: a case where the voltage value of a sensor signal inputted to the signal input terminal is 5V and continuity establishment processing is carried out after the execution of 0V charge processing. FIG. 28A represents normal times, and FIG. 28B represents open failure in input-side capacitor. In FIGS. 28A and 28B, letting the capacitance of the input-side capacitor be C1, the capacitance of the inspection capacitor be C4, and parasitic capacitances be C2 and C3, C1=0.1 μF, C4=0.01 μF, and C2 and C3=5 pF. Letting the resistance value of the input-side resistor be R1, R1=10 kΩ. 5V is taken for the voltage of a sensor signal immediately before the occurrence of an open failure in the input-side capacitor. The timing chart in FIG. 28A shows change in voltage value $V_{in}$ at normal times and the timing chart in FIG. 28B shows change in voltage value $V_{in}$ observed when an open failure occurs in an input-side capacitor.

At normal times, the following takes place when continuity establishment processing is carried out (referred to as inspection SW ON in FIGS. 28A and 28B): $V_{in}$ becomes equal to $5 \times (C2+C3+C4)/(C1+C2+C3+C4)$ (V) and $V_{in}$ is thereafter increased with a time constant τ of $(C1+C2+C3+C4) \times R1$. (Refer to FIG. 28A.)

With a break in the input-side capacitor, meanwhile, the following takes place when continuity establishment processing is carried out: $V_{in}$ becomes equal to $5 \times (C3+C4)/(C2+C3+C4)$ (V) and $V_{in}$ is thereafter increased with a time constant of $(C2+C3+C4) \times R1$. (Refer to FIG. 28B.)

In input-side capacitor failure detection processing, for this reason, any change in the voltage value of a signal input terminal between before and after continuity establishment processing is detected by the voltage change detection circuit 1112 by taking the following measure: a determination voltage hold signal is outputted immediately before the continuity establishment processing and a determination result hold signal is outputted immediately after the continuity establishment processing. Then any open failure in the input-side capacitor is detected based on whether or not this change in voltage value exceeds a predetermined threshold value.

If the voltage value of a sensor signal is 5V, the following takes place even though 5V charge processing and continuity establishment processing are carried out with an open failure in the input-side capacitor: sufficient change is not caused and the open failure in the input-side capacitor cannot be detected. Also when the voltage value of a sensor signal is 0V and 0V charge processing and continuity establishment processing are carried out, the outcome is the same. For this reason, in the input-side capacitor failure detection processing, the following measure is taken: 5V charge processing and 0V charge processing are carried out; after the execution of each processing, continuity establishment processing is carried out; and when change in voltage value exceeds a threshold value after either continuity establishment processing, it is considered that an open failure has occurred in the input-side capacitor.

When a break in an input-side capacitor is detected by 5V charge processing, this threshold value may be set based on the voltage $V_{C4}$ generated by the inspection capacitor 1150 immediately before continuity establishment processing. As an example, it may be approximately half of $V_{C4}$.

When a break in an input-side capacitor is detected by 0V charge processing, the above threshold value may be set based on the maximum voltage value of a sensor signal. As an example, it may be approximately half of the maximum voltage value.

(5-2) Details

Figure 29:
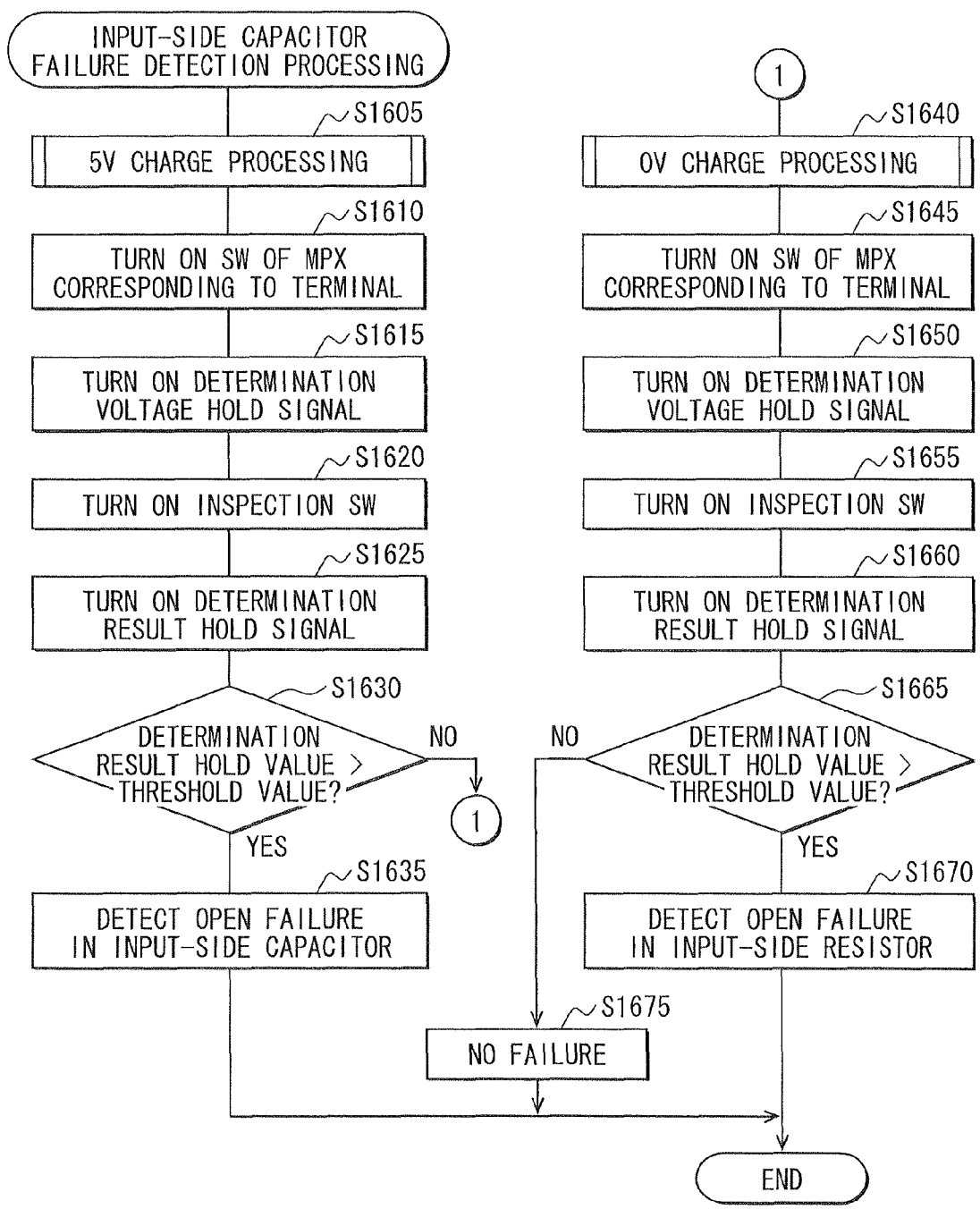
FIG. 29 is a flowchart of input-side capacitor failure detection processing in the first embodiment.

Description will be given to the details of input-side capacitor failure detection processing with reference to the flowchart in FIG. 29. This series of processing is carried out with any one input-side capacitor taken as the test object and periodically carried out with the input-side capacitor as the test object changed during the operation of the sensor signal input circuit 1100.

At Step S1605, the control circuit 1115 of the IC 1110 carries out 5V charge processing and the flow proceeds to the processing of Step S1610.

At Step S1610, the control circuit 1115 turns ON the switch of the multiplexer 1114 connected to the signal input terminal leading to an input-side capacitor as the test object and the flow proceeds to the processing of Step S1615.

At Step S1615, the control circuit 1115 outputs a determination voltage hold signal to cause the determination voltage hold circuit 1112a to hold the voltage value of the signal line 1119d. Then the flow proceeds to the processing of Step S1620.

At Step S1620, the control circuit 1115 turns ON the inspection switch 1118 and the flow proceeds to the processing of Step S1625.

At Step S1625, the control circuit 1115 outputs a determination result hold signal to the determination result hold circuit 1112c to cause the determination circuit 1112b to detect the following difference: the difference (determination result hold value) between the voltage value of the signal line 1119d and the voltage value held at the determination voltage hold circuit 1112a. Further, it causes the determination result hold circuit 1112c to hold the determination result hold value. Then the flow proceeds to the processing of Step S1630.

At Step S1630, the control circuit 1115 determines whether or not the determination result hold value held at the determination result hold circuit 112c is higher than a predetermined threshold value. When an affirmative determination is made (Step S1630: Yes), the flow proceeds to the processing of Step S1635; and when a negative determination is made (Step S1630: No), the flow proceeds to the processing of Step S1640.

At Step S1635, the control circuit 1115 considers that an open failure has occurred in the input-side capacitor as the test object and terminates this series of processing.

At Step S1640, the control circuit 1115 carries out 0V charge processing and the flow proceeds to the processing of Step S1645.

At Step S1645, the control circuit 1115 turns ON the switch of the multiplexer 1114 connected to the signal input terminal leading to the input-side capacitor as the test object and the flow proceeds to the processing of Step S650.

At Step S1650, the control circuit 1115 outputs a determination voltage hold signal to cause the determination voltage hold circuit 1112a to hold the voltage value of the signal line 1119d. Then the flow proceeds to the processing of Step S1655.

At Step S1655, the control circuit 1115 turns ON the inspection switch 118 and the flow proceeds to the processing of Step S1660.

At Step S1660, the control circuit 1115 outputs a determination result hold signal to the determination result hold circuit 1112c to cause the determination circuit 1112b to detect the following difference: the difference (determination result hold value) between the voltage value of the signal line 1119d and the voltage value held at the determination voltage hold circuit 1112a. Further, it causes the determination result hold circuit 1112c to hold the determination result hold value. Then the flow proceeds to the processing of Step S665.

At Step S1665, the control circuit 1115 determines whether or not the determination result hold value held at the determination result hold circuit 1112c is higher than a predetermined threshold value. When an affirmative determination is made (Step S1665: Yes), the flow proceeds to the processing of Step S1670; and when a negative determination is made (Step S1665: No), the flow proceeds to the processing of Step S1675.

At Step S1670, the control circuit 1115 considers that an open failure has occurred in the input-side capacitor as the test object and terminates this series of processing.

At Step S1675, meanwhile, the control circuit 1115 considers that a failure has not occurred in the input-side capacitor as the test object and terminates this series of processing.

Fifth Embodiment

Description will be given to a sensor signal input circuit in the fifth embodiment.

(Description of Configuration)

Figure 30:
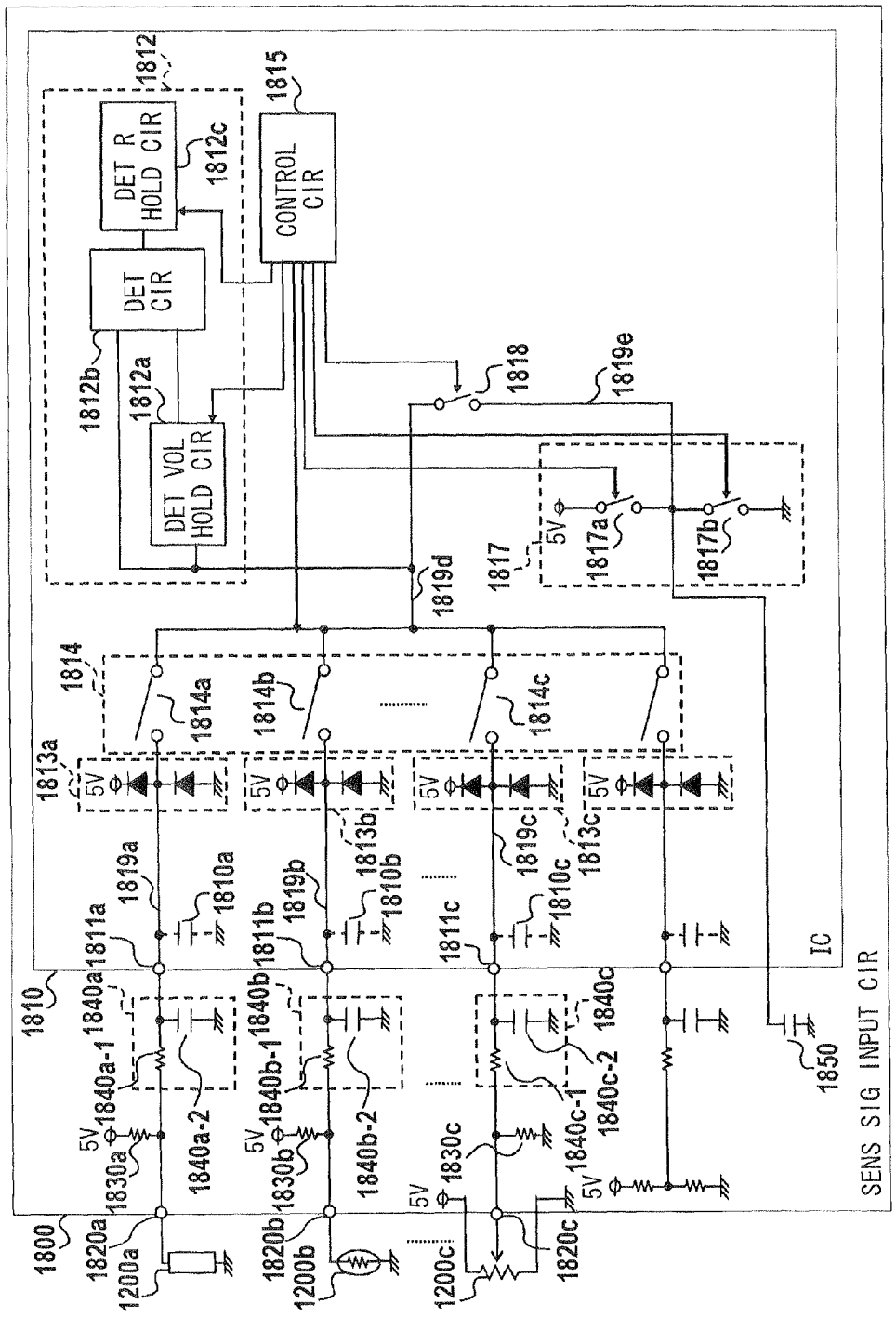
FIG. 30 is a block diagram illustrating the configuration of a sensor signal input circuit in a fifth embodiment.

FIG. 30 is a block diagram illustrating the configuration of the sensor signal input circuit 800 in the fifth embodiment. This sensor signal input circuit 1800 is connected with the same first to Nth sensors 1200a to 1200c as in the fourth embodiment. It carries out processing according to sensor signals within a range of 0V to 5V inputted from these sensors.

Specifically, the sensor signal input circuit 1800 includes: the same first to Nth external input terminals 1820a to 1820c as in the fourth embodiment; and IC 1810 having first to Nth signal input terminals 1811a to 1811c respectively connected to the first to Nth external input terminals 1820a to 1820c.

The sensor signal input circuit 1800 includes the same first to Nth resistors 1830a to 1830c, first to Nth filter circuits 1840a to 1840c, and inspection capacitor 1850 as in the fourth embodiment. The first filter circuit 1840a includes the same input-side resistor 1840a-1 and input-side capacitor 1840a-2 as in the fourth embodiment and the other filter circuits are similarly configured.

The IC 1810 includes a multiplexer 1814 having first to Nth switches 1814a to 1814c and an inspection switch 1818 that establishes or breaks continuity in the inspection line 1819e connecting a signal line 1819d and the above-mentioned inspection capacitor 1850 as in the fourth embodiment.

Further, the IC 1810 includes: the same first to Nth surge protection circuits 1813a to 1813c, inspection power supply 1817, and voltage change detection circuit 1812 as in the fourth embodiment; and a control circuit 1815 that controls the multiplexer 1814, voltage change detection circuit 1812, inspection power supply 1817, and inspection switch 1818.

In the IC 1810, parasitic capacitances 1810a to 1810c of 5 pF or so are generated between the first to Nth signal input terminals 1811a to 1811c and reference potential and between the signal line 1819d and reference potential.

The capacitance of the input-side capacitor provided in each signal input terminal is larger than the capacitance of the inspection capacitor 1850. For example, the capacitance of the input-side capacitor may be 0.1 µF and the capacitance of the inspection capacitor 1850 may be 0.01 µF.

(Description of Operation)

Description will be given to the operation of the sensor signal input circuit 1800 in the fifth embodiment. Also in the sensor signal input circuit 1800, terminal failures and the like are detected by taking the following measure: the same 5V charge processing and 0V charge processing as in the fourth embodiment are carried out and the migration of electric charges is caused between the input-side capacitor connected to a signal input terminal as the test object and the inspection capacitor 1150. In the sensor signal input circuit 1100 in the fourth embodiment, the migration of electric charges is detected by detecting the voltage value of the signal line 1119d with the AD converter 1116. In the sensor signal input circuit 1800 in the fifth embodiment, meanwhile, the migration of electric charges is detected by detecting change in the voltage value of the signal line 1819d with the voltage change detection circuit 1812. The fifth embodiment is different from the fourth embodiment in this regard.

(1) IC Failure Detection Processing

Figure 31:
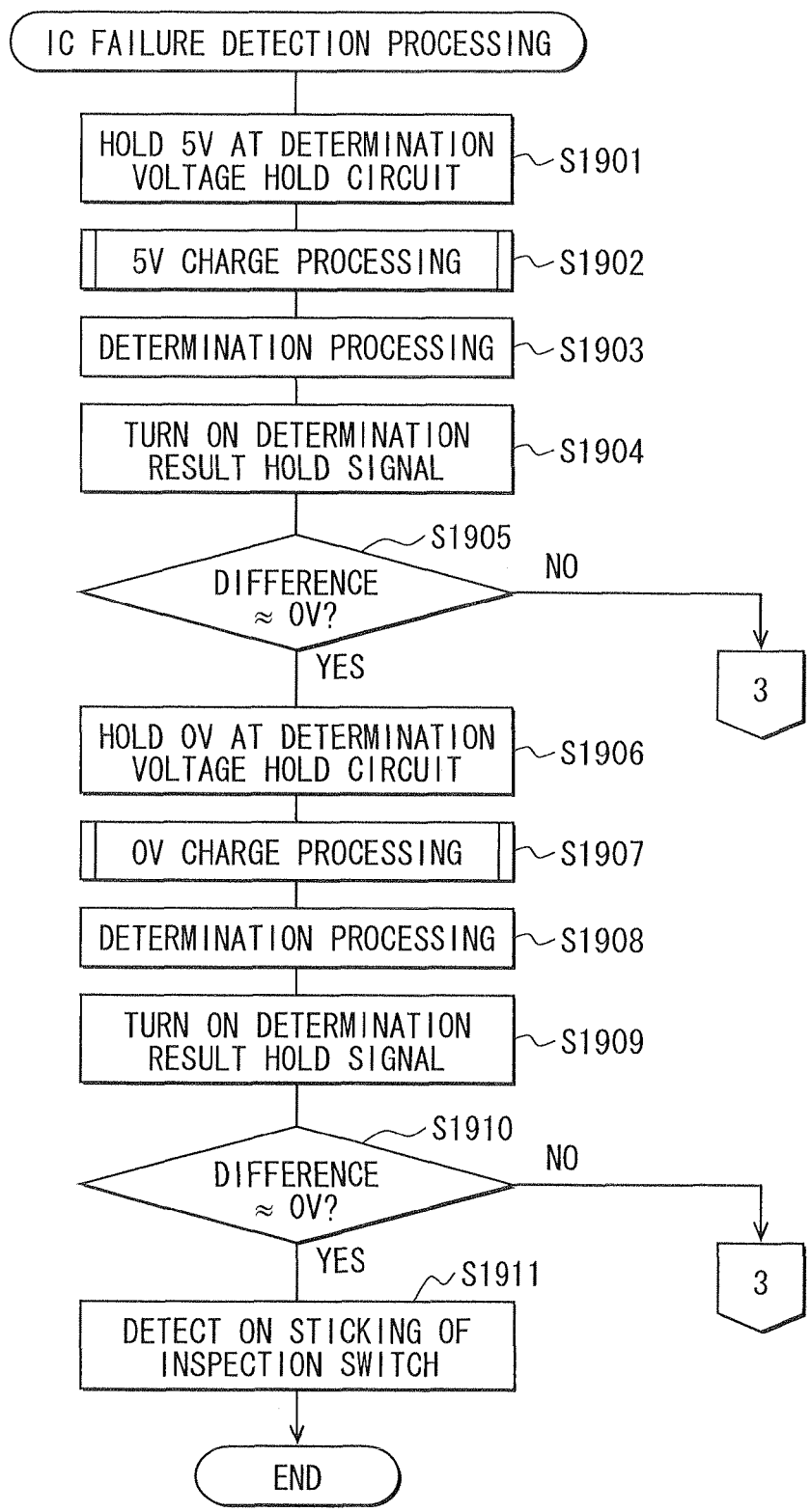
FIG. 31 is a flowchart of IC failure detection processing in the fifth embodiment.
Figure 32:
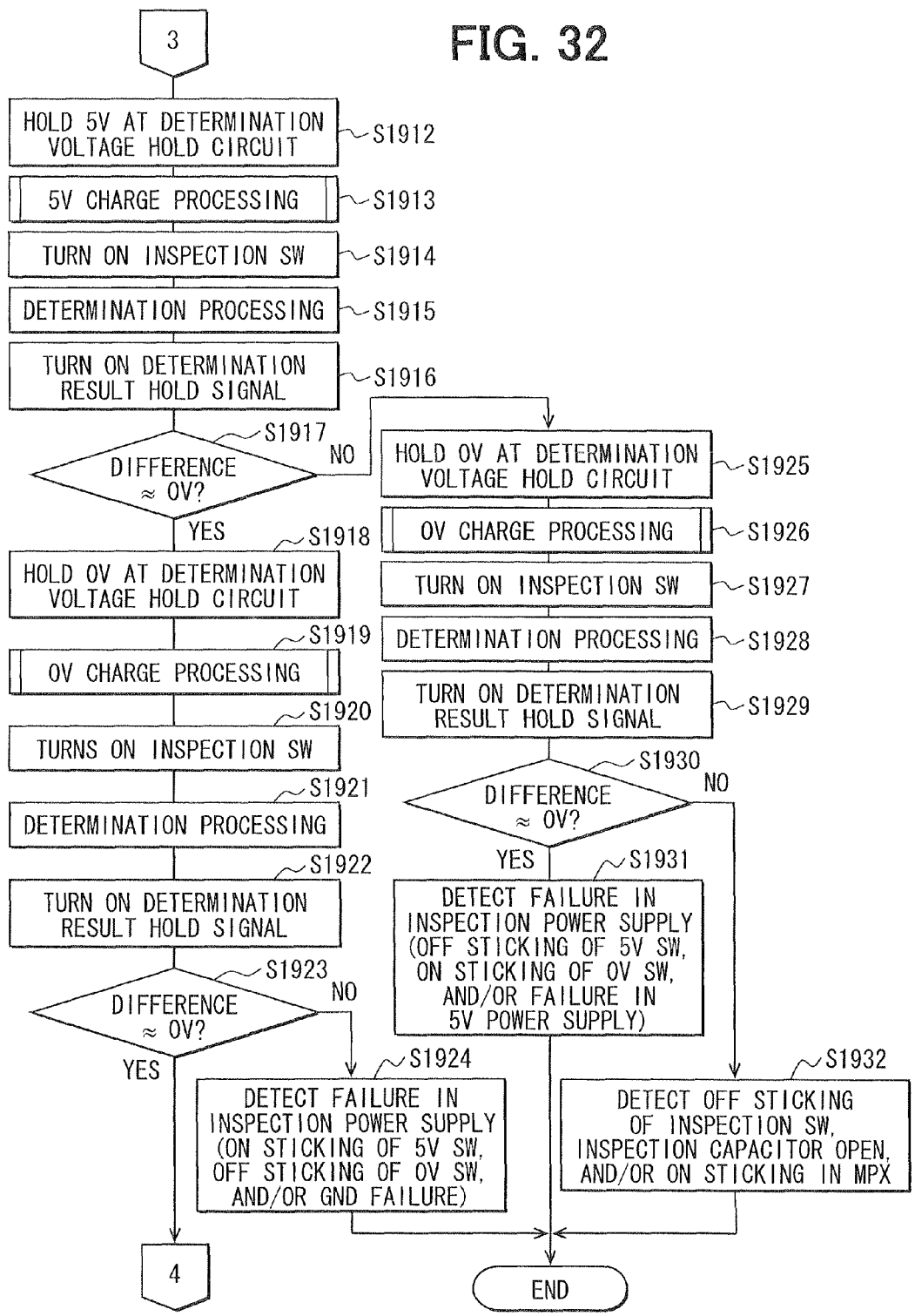
FIG. 32 is a flowchart of the IC failure detection processing in the fifth embodiment.
Figure 33:
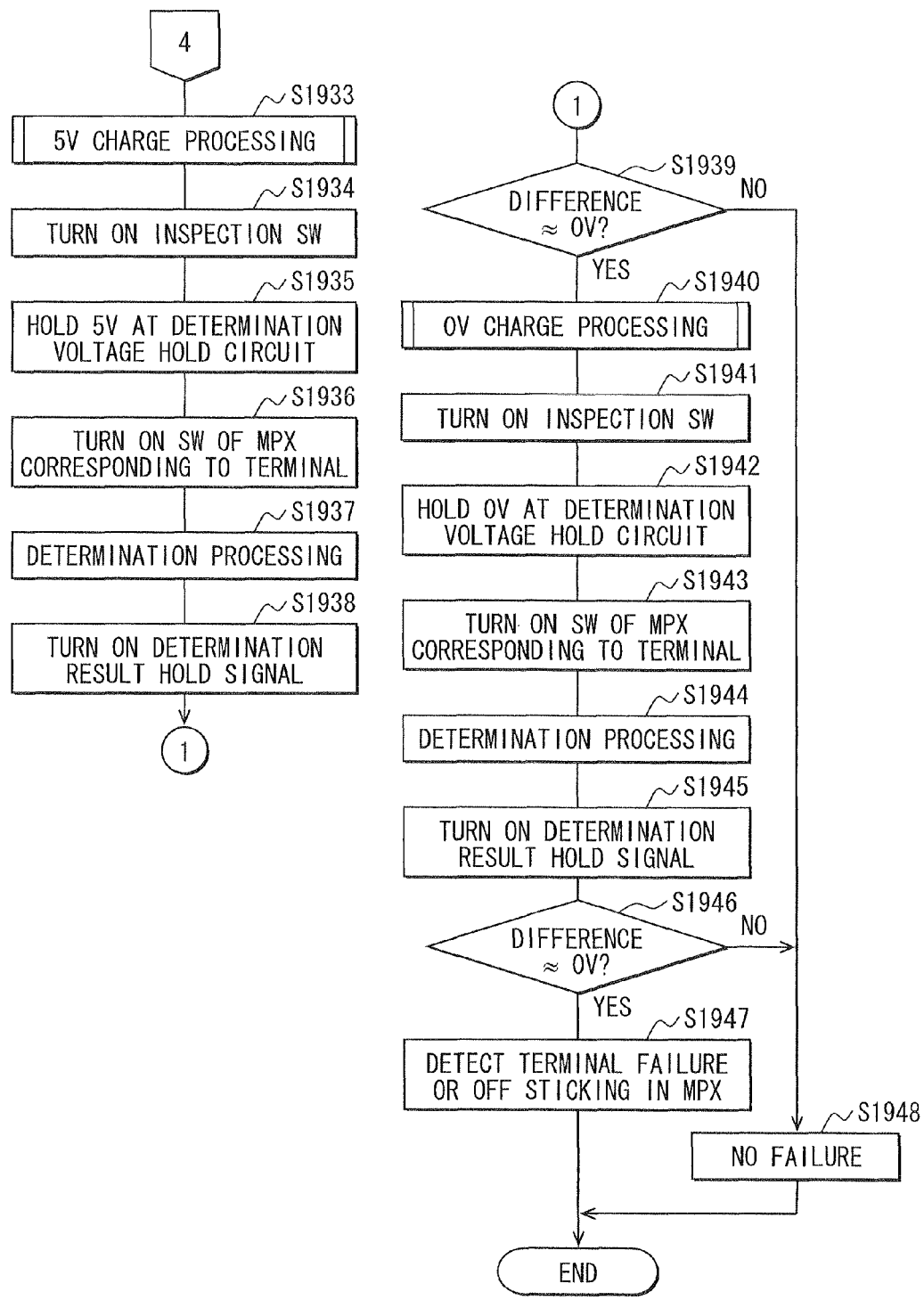
FIG. 33 is a flowchart of the IC failure detection processing in the fifth embodiment.

Description will be given to IC failure detection processing with reference to the flowcharts in FIGS. 31 to 33. In the IC failure detection processing, any open failure in the first to Nth signal input terminals 1811a to 1811c and a break or the like in the communication path for sensor signals from each signal input terminal are detected. This series of processing is carried out with any one signal input terminal taken as the test object and periodically carried out with the signal input terminal as the test object changed during the operation of the sensor signal input circuit 1800.

At Step S1901, the control circuit 1815 of the IC 1810 turns OFF all the switches of the multiplexer 1814 and turns ON the inspection switch 1818 and further turns ON the 5V switch 1817a of the inspection power supply 1817 to apply a voltage of 5V to the signal line 1819d. Further, it outputs a determination voltage hold signal to cause the determination voltage hold circuit 1812a to hold a voltage value of 5V. Then the flow proceeds to the processing of Step S1902.

At Step S1902, the control circuit 1815 carries out 5V charge processing and the flow proceeds to the processing of Step S1903.

At Step S1903 and the subsequent step, or Step S1904, the control circuit 1815 causes the determination circuit 1812b to detect the following difference: the difference (determination result hold value) between the voltage value of the signal line 1819d and the voltage value of 5V held at the determination voltage hold circuit 1812a. It thereafter outputs a determination result hold signal to the determination result hold circuit 1812c to cause the determination result hold circuit 1812c to hold the determination result hold value. Then the flow proceeds to the processing of Step S1905.

At Step S1905, the control circuit 1115 determines whether or not the difference (determination result hold value) held at the determination result hold circuit 1812c is 0V or a value close to 0V. (That is, it determines whether or not the voltage value of the signal line 1819d is 5V or a value close to 5V.) When an affirmative determination is made (Step S1905: Yes), the flow proceeds to the processing of Step S1906; and when a negative determination is made (Step S1905: No), the flow proceeds to the processing of Step S1912 in FIG. 32.

At Step S1906, the control circuit 1815 turns OFF all the switches of the multiplexer 814 and turns ON the inspection switch 1818 and further turns ON the 0V switch 1817b of the inspection power supply 1817 to apply a voltage of 0V to the signal line 1819d. Further, it outputs a determination voltage hold signal to cause the determination voltage hold circuit 1812a to hold a voltage value of 0V. Then the flow proceeds to the processing of Step S1907.

At Step S1907, the control circuit 1815 carries out 0V charge processing and the flow proceeds to the processing of Step S1908.

At Step S1908 and the subsequent step, or Step S1909, the control circuit 1815 causes the determination circuit 1812b to detect the following difference: the difference (determination result hold value) between the voltage value of the signal line 1819d and the voltage value of 0V held at the determination voltage hold circuit 1812a. It thereafter outputs a determination result hold signal to the determination result hold circuit 1812c to cause the determination result hold circuit 1812c to hold the determination result hold value. Then the flow proceeds to the processing of Step S1910.

At Step S1910, the control circuit 1815 determines whether or not the difference (determination result hold value) held at the determination result hold circuit 1812c is 0V or a value close to 0V. (That is, it determines whether or not the voltage value of the signal line 1819d is 0V or a value close to 0V.) When an affirmative determination is made (Step S1910: Yes), the flow proceeds to the processing of Step S1911; and when a negative determination is made (Step S1910: No), the flow proceeds to the processing of Step S1912 in FIG. 32.

At Step S1911, the control circuit 1815 considers that the inspection switch 1818 is stuck in ON position and terminates this series of processing.

Description will be given with reference to FIG. 32. At Step S1912 to which the flow proceeds when a negative determination is made at Step S1905 or Step S1910, the control circuit 1815 causes the determination voltage hold circuit 1812a to hold a voltage value of 5V as mentioned above. Then the flow proceeds to the processing of Step S1913.

At Step S1913, the control circuit 1815 carries out 5V charge processing and the flow proceeds to the processing of Step S1914.

At Step S1914, the control circuit 1815 turns ON the inspection switch 1818 and the flow proceeds to the processing of Step S1915.

At Step S1915 and the subsequent step, or Step S1916, the control circuit 1815 causes the determination result hold circuit 1812c to hold the following difference as mentioned above: the difference (determination result hold value) between the voltage value of the signal line 1819d and the voltage value of 5V held at the determination voltage hold circuit 1812a. Then the flow proceeds to the processing of Step S1917.

At Step S1917, the control circuit 1815 determines whether or not the difference (determination result hold value) held at the determination result hold circuit 1812c is 0V or a value close to 0V. (That is, it determines whether or not the voltage value of the signal line 1819d is 5V or a value close to 5V.) When an affirmative determination is made (Step S1917: Yes), the flow proceeds to the processing of Step S1918; and when a negative determination is made (Step S1917: No), the flow proceeds to the processing of Step S1925.

At Step S1918, the control circuit 1815 causes the determination voltage hold circuit 1812a to hold a voltage value of 0V as mentioned above and the flow proceeds to the processing of Step S1919.

At Step S1919, the control circuit 1815 carries out 0V charge processing and the flow proceeds to the processing of Step S1920.

At Step S1920, the control circuit 1815 turns ON the inspection switch 1818 and the flow proceeds to the processing of Step S1921.

At Step S1921 and the subsequent step, or Step S1922, the control circuit 1815 causes the determination result hold circuit 1812c to hold the following difference as mentioned above: the difference (determination result hold value) between the voltage value of the signal line 1819d and the voltage value of 0V held at the determination voltage hold circuit 1812a. Then the flow proceeds to the processing of Step S1923.

At Step S1923, the control circuit 1815 determines whether or not the difference (determination result hold value) held at the determination result hold circuit 1812c is 0V or a value close to 0V. (That is, it determines whether or not the voltage value of the signal line 1819d is 0V or a value close to 0V.) When an affirmative determination is made (Step S1923: Yes), the flow proceeds to the processing of Step S1933 in FIG. 33; and when a negative determination is made (Step S1923: No), the flow proceeds to the processing of Step S1924.

At Step S1924, the control circuit 1815 considers that a failure (at least any one of ON sticking of the 5V switch 1817a, OFF sticking of the 0V switch 1817b, and reference potential failure) has occurred in the inspection power supply 1817. Then it terminates this series of processing.

At Step S1925 to which the flow proceeds when a negative determination is made at Step S1917, the control circuit 1815 causes the determination voltage hold circuit 1812a to hold a voltage value of 0V as mentioned above. Then the flow proceeds to the processing of Step S1926.

At Step S1926, the control circuit 1815 carries out 0V charge processing and the flow proceeds to the processing of Step S1927.

At Step S1927, the control circuit 1115 turns ON the inspection switch 1118 and the flow proceeds to the processing of Step S1928.

At Step S1928 and the subsequent step, or Step S1929, the control circuit 1815 causes the determination result hold circuit 1812c to hold the following difference as mentioned above: the difference (determination result hold value) between the voltage value of the signal line 1819d and the voltage value of 0V held at the determination voltage hold circuit 1812a. Then the flow proceeds to the processing of Step S1930.

At Step S1930, the control circuit 1815 determines whether or not the difference (determination result hold value) held at the determination result hold circuit 1812c is 0V or a value close to 0V. (That is, it determines whether or not the voltage value of the signal line 1819d is 0V or a value close to 0V.) When an affirmative determination is made (Step S1930: Yes), the flow proceeds to the processing of Step S1931; and when a negative determination is made (Step S1930: No), the flow proceeds to the processing of Step S1932.

At Step S1931, the control circuit 1815 considers that a failure (at least any one of OFF sticking of the 5V switch 1817a, ON sticking of the 0V switch 1817b, and a failure in the 5V power supply) has occurred in the inspection power supply 1817. Then it terminates this series of processing.

At Step S1932, meanwhile, the control circuit 1815 considers that at least any one of OFF sticking of the inspection switch 1818, an open failure of the inspection capacitor 1850, and ON sticking of a switch of the multiplexer 1814 has occurred. Then it terminates this series of processing.

Description will be given with reference to FIG. 33. At Step S1933 to which the flow proceeds when an affirmative determination is made at Step S1923, the control circuit 1815 carries out 5V charge processing and the flow proceeds to the processing of Step S1934.

At Step S1934, the control circuit 1815 turns ON the inspection switch 1818 and the flow proceeds to the processing of Step S1935.

At Step S1935, the control circuit 1815 outputs a determination voltage hold signal to cause the determination voltage hold circuit 1812a to hold a voltage value of 5V and the flow proceeds to the processing of Step S1936.

At Step S1936, the control circuit 1815 turns ON the switch of the multiplexer 1814 connected to the signal input terminal as the test object and the flow proceeds to the processing of Step S1937.

At Step S1937 and the subsequent step, or Step S1938, the control circuit 1815 causes the determination result hold circuit 1812c to hold the following difference as mentioned above: the difference (determination result hold value) between the voltage value of the signal line 1819d and the voltage value of 5V held at the determination voltage hold circuit 1812a. Then the flow proceeds to the processing of Step S1939.

At Step S1939, the control circuit 1815 determines whether or not the difference (determination result hold value) held at the determination result hold circuit 1812c is 0V or a value close to 0V. (That is, it determines whether or not the voltage value of the signal line 1819d is 5V or a value close to 5V.) When an affirmative determination is made (Step S1939: Yes), the flow proceeds to the processing of Step S1940; and when a negative determination is made (Step S1939: No), the flow proceeds to the processing of Step S1948.

At Step S1940, the control circuit 1815 carries out 0V charge processing and the flow proceeds to the processing of Step S1941.

At Step S1941, the control circuit 1815 turns ON the inspection switch 818 and the flow proceeds to the processing of Step S1942.

At Step S1942, the control circuit 1815 outputs a determination voltage hold signal to cause the determination voltage hold circuit 1812a to hold a voltage value of 0V and the flow proceeds to the processing of Step S1943.

At Step S1943, the control circuit 1815 turns ON the switch of the multiplexer 1814 connected to the signal input terminal as the test object and the flow proceeds to the processing of Step S1944.

At Step S1944 and the subsequent step, or Step S1945, the control circuit 1815 causes the determination result hold circuit 1812c to hold the following difference as mentioned above: the difference (determination result hold value) between the voltage value of the signal line 1819d and the voltage value of 0V held at the determination voltage hold circuit 1812a. Then the flow proceeds to the processing of Step S1946.

At Step S1946, the control circuit 1815 determines whether or not the difference (determination result hold value) held at the determination result hold circuit 1812c is 0V or a value close to 0V. (That is, it determines whether or not the voltage value of the signal line 1819d is 0V or a value close to 0V.) When an affirmative determination is made (Step S1946: Yes), the flow proceeds to the processing of Step S1947; and when a negative determination is made (Step S1946: No), the flow proceeds to the processing of Step S1948.

At Step S1947, the control circuit 1815 considers that at least either of a terminal failure in the signal input terminal as the test object and OFF sticking of the switch of the multiplexer 1814 connected to the signal input terminal as the test object has occurred. Then it terminates this series of processing.

At Step S1948, the control circuit 1815 considers that a failure such as an open failure in a signal input terminal has not occurred and terminates this series of processing.

(2) Input-Side Resistor Failure Detection Processing

Description will be given to input-side resistor failure detection processing for detecting any open failure in the input-side resistors forming the filter circuits 1840a to 1840c connected to the first to Nth signal input terminals 1811a to 1811b. Also in the sensor signal input circuit 1800 in the fifth embodiment, any open failure in an input-side resistor is detected by the same method as in the fourth embodiment. In the fifth embodiment, however, change in the voltage of a signal input terminal is detected with the voltage change detection circuit 1812, not with the AD converter. The fifth embodiment is different from the fourth embodiment in this regard.

Figure 34:
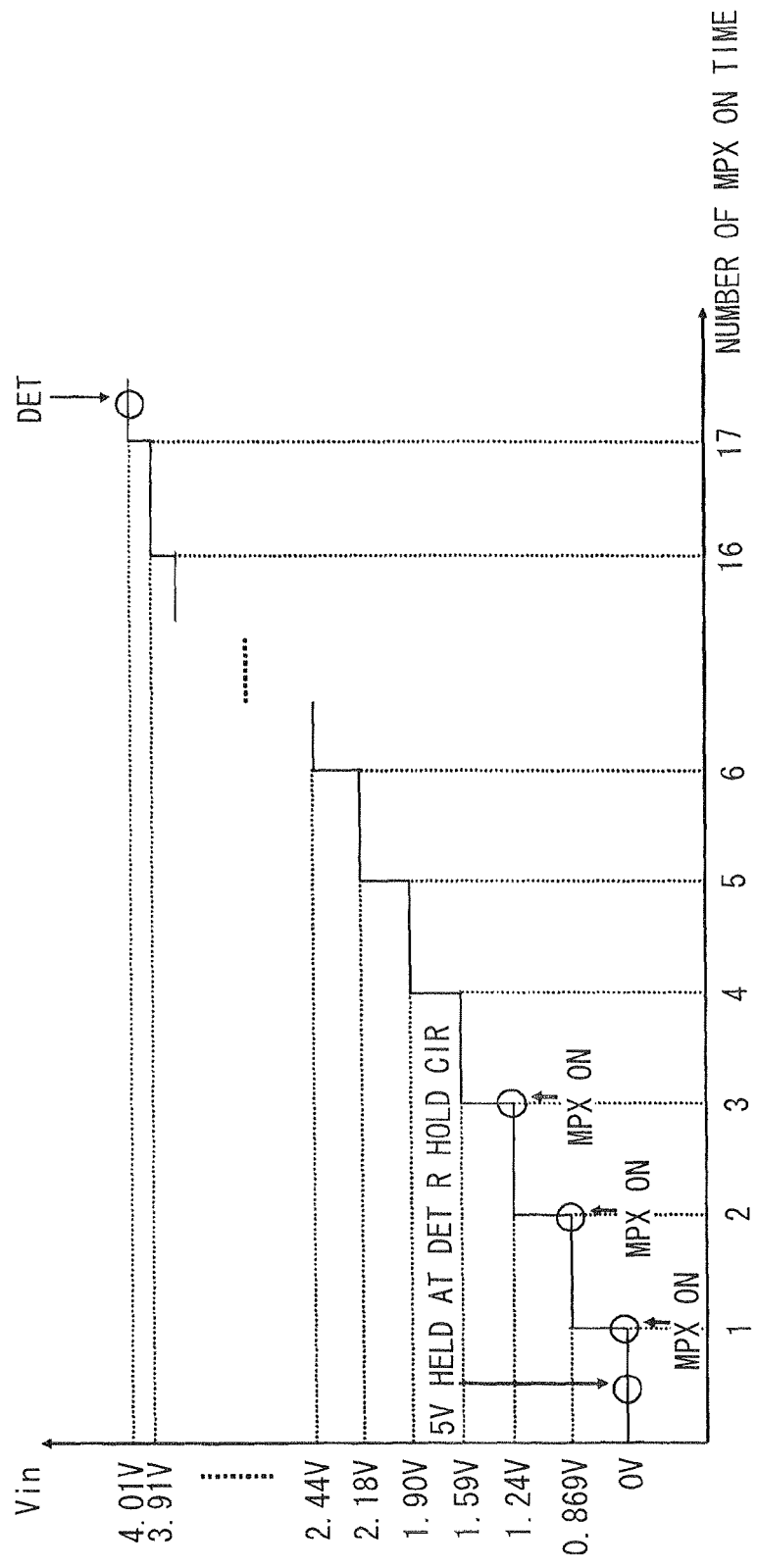
FIG. 34 is a timing chart showing change in the voltage of a signal input terminal observed when a sensor signal is at 0V and 5V charge processing and the like are repeated after the occurrence of an open failure in an input-side resistor.

Description will be given with concrete examples cited. FIG. 34 is a timing chart showing change in the voltage value $V_{in}$ of the signal input terminal connected to an input-side resistor observed in the following cases: cases where the voltage value of a sensor signal is 0V and 5V charge processing and the processing of establishing continuity between the signal input terminal and the inspection capacitor 1850 are repeated after the occurrence of an open failure in the input-side resistor. In FIG. 34, 0V is taken for the voltage of the sensor signal immediately before the occurrence of an open failure in the input-side resistor. (The above processing of establishing continuity is referred to as continuity establishment processing.) This timing chart is equivalent to the timing chart in FIG. 24. In the sensor signal input circuit 1800 in the fifth embodiment, as shown in FIG. 34, a voltage value of 5V is held at the determination voltage hold circuit 1812a immediately before the first 5V charge processing and continuity establishment processing are carried out. After 5V charge processing and continuity establishment processing are carried out by a predetermined number of times (for example, 17 times), the following processing is carried out: the difference (determination result hold value) between the voltage value of the signal line 819d and the voltage value of 5V held at the determination voltage hold circuit 812a is held at the determination result hold circuit 1812c. Then it is determined based on the determination result hold value whether or not the voltage value of the signal line 1819d is 5V or a value close to 5V.

Figure 35:
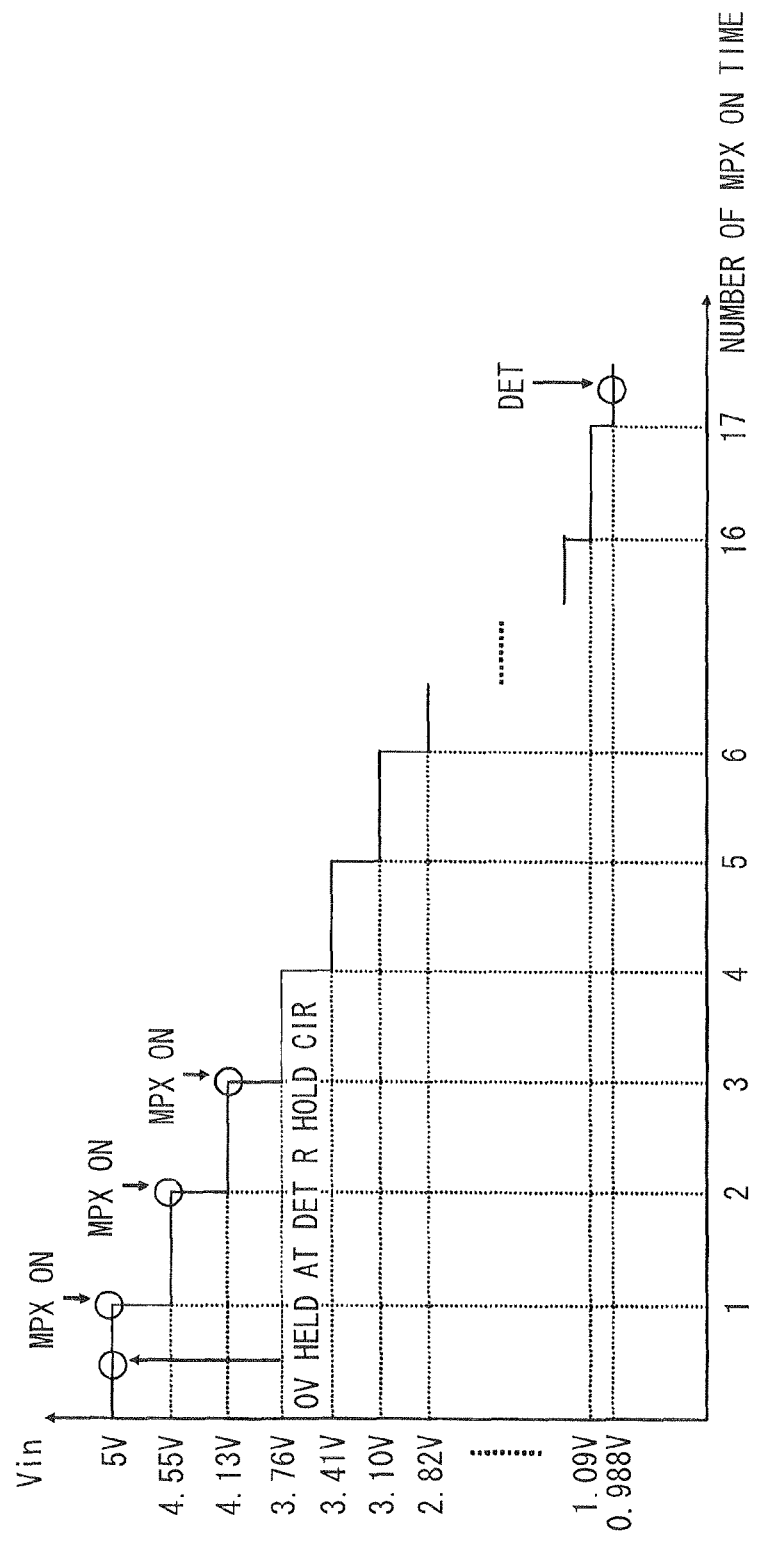
FIG. 35 is a timing chart showing change in the voltage of a signal input terminal observed when a sensor signal is at 5V and 0V charge processing and the like are repeated after the occurrence of an open failure in an input-side resistor.

FIG. 35 is a timing chart showing change in the voltage value $V_{in}$ of the signal input terminal observed in the following cases: cases where the voltage value of a sensor signal is 5V and 0V charge processing and continuity establishment processing are repeated after the occurrence of an open failure in the input-side resistor. In FIG. 35, 5V is taken for the voltage of the sensor signal immediately before the occurrence of an open failure in the input-side resistor. This timing chart is equivalent to the timing chart in FIG. 25. In the sensor signal input circuit 1800 in the fifth embodiment, as shown in FIG. 35, a voltage value of 0V is held at the determination voltage hold circuit 1812a immediately before the first 0V charge processing and continuity establishment processing are carried out. After 0V charge processing and continuity establishment processing are carried out by a predetermined number of times (for example, 17 times), the following processing is carried out: the difference (determination result hold value) between the voltage value of the signal line 1819d and the voltage value of 0V held at the determination voltage hold circuit 1812a is held at the determination result hold circuit 1812c. Then it is determined based on the determination result hold value whether or not the voltage value of the signal line 1819d is 0V or a value close to 0V.

Figure 36:
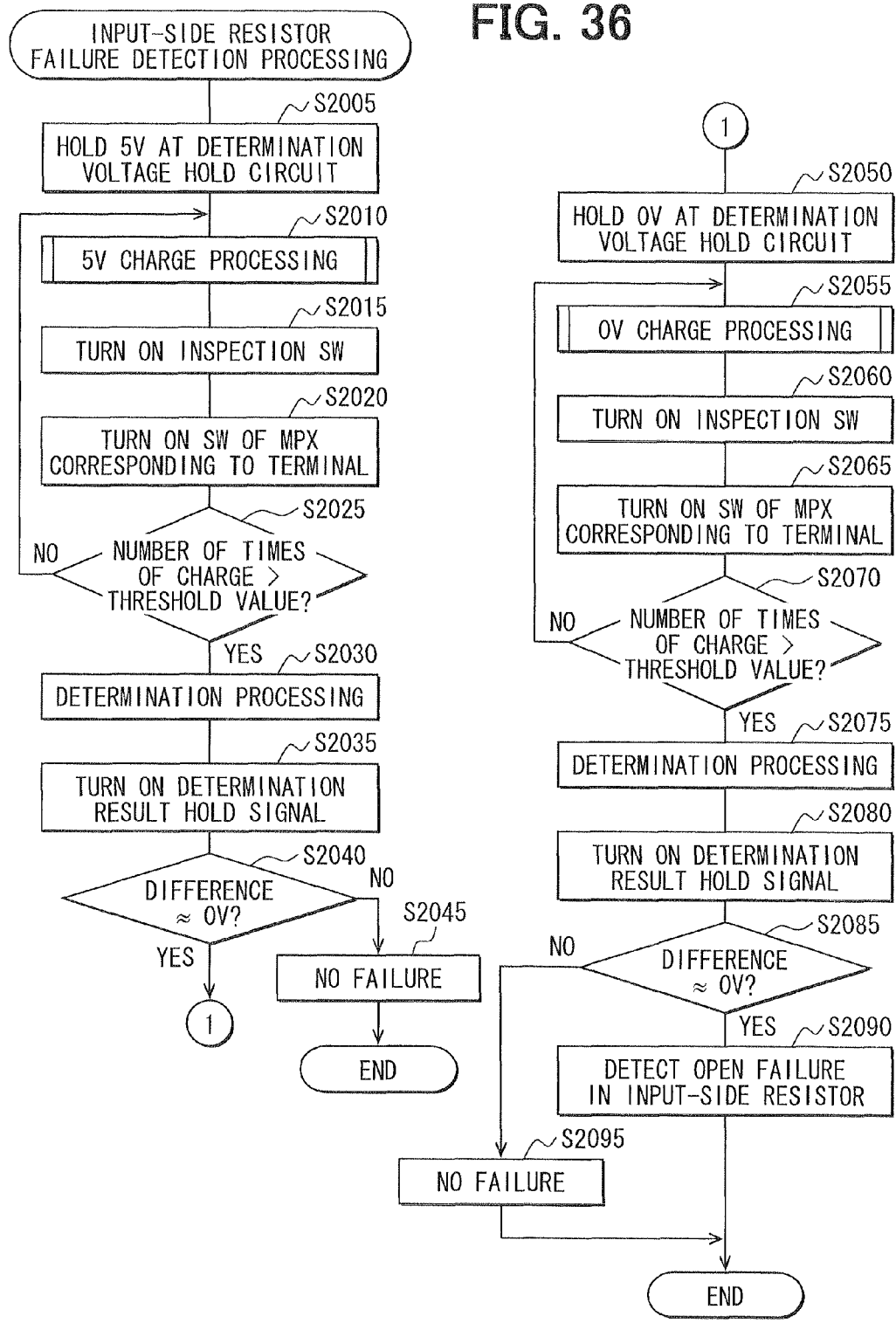
FIG. 36 is a flowchart of input-side resistor failure detection processing in the fifth embodiment.

Description will be given to the details of input-side resistor failure detection processing with reference to the flowchart in FIG. 36. This series of processing is carried out with any one input-side resistor taken as the test object and periodically carried out with the input-side resistor as the test object changed during the operation of the sensor signal input circuit 1800.

At Step S2005, the control circuit 1815 of IC 1810 causes the determination voltage hold circuit 1812a to hold a voltage value of 5V as mentioned above and the flow proceeds to the processing of Step S2010.

At Step S2010, the control circuit 1815 carries out 5V charge processing and the flow proceeds to the processing of Step S2015.

At Step S2015, the control circuit 1815 turns ON the inspection switch 1118 and the flow proceeds to the processing of Step S2020.

At Step S2020, the control circuit 1815 turns ON the switch of the multiplexer 1814 connected to the signal input terminal leading to an input-side resistor as the test object and the flow proceeds to the processing of Step S2025.

At Step S2025, the control circuit 1815 determines whether or not the number of times of the execution of 5V charge processing is higher than a predetermined threshold value. When an affirmative determination is made (Step S2025: Yes), the flow proceeds to the processing of Step S1030; and when a negative determination is made (Step S2025: No), the flow proceeds to the processing of Step S2010.

At Step S2030 and the subsequent step, or Step S2035, the control circuit 1815 causes the determination result hold circuit 1812c to hold the following difference as mentioned above: the difference (determination result hold value) between the voltage value of the signal line 1819d and the voltage value of 5V held at the determination voltage hold circuit 1812a. Then the flow proceeds to the processing of Step S2040.

At Step S2040, the control circuit 1815 determines whether or not the difference (determination result hold value) held at the determination result hold circuit 1812c is 0V or a value close to 0V. (That is, it determines whether or not the voltage value of the signal line 1819d is 5V or a value close to 5V.) When an affirmative determination is made (Step S2040: Yes), the flow proceeds to the processing of Step S2050; and when a negative determination is made (Step S2040: No), the flow proceeds to the processing of Step S2045.

At Step S2045, the control circuit 1815 considers that a failure has not occurred in the input-side resistor as the test object and terminates this series of processing.

At Step S2050, the control circuit 1815 causes the determination voltage hold circuit 1812a to hold a voltage value of 0V as mentioned above and the flow proceeds to the processing of Step S2055.

At Step S2055, the control circuit 1815 carries out 0V charge processing and the flow proceeds to the processing of Step S2060.

At Step S2060, the control circuit 1815 turns ON the inspection switch 1118 and the flow proceeds to the processing of Step S2065.

At Step S2065, the control circuit 1815 turns ON the switch of the multiplexer 1814 connected to the signal input terminal leading to the input-side resistor as the test object and the flow proceeds to the processing of Step S2070.

At Step S2070, the control circuit 1815 determines whether or not the number of times of the execution of 0V charge processing is higher than a predetermined threshold value. When an affirmative determination is made (Step S2070: Yes), the flow proceeds to the processing of Step S2075; and when a negative determination is made (Step S2070: No), the flow proceeds to the processing of Step S2055.

At Step S2075 and the subsequent step, or Step S2080, the control circuit 1815 causes the determination result hold circuit 1812c to hold the following difference as mentioned above: the difference (determination result hold value) between the voltage value of the signal line 1819d and the voltage value of 0V held at the determination voltage hold circuit 1812a. Then the flow proceeds to the processing of Step S2085.

At Step S2085, the control circuit 1815 determines whether or not the difference (determination result hold value) held at the determination result hold circuit 1812c is 0V or a value close to 0V. (That is, it determines whether or not the voltage value of the signal line 1819d is 0V or a value close to 0V.) When an affirmative determination is made (Step S2085: Yes), the flow proceeds to the processing of Step S2090; and when a negative determination is made (Step S2085: No), the flow proceeds to the processing of Step S2095.

At Step S2090, the control circuit 1815 considers that a break has occurred in the input-side resistor as the test object and terminates this series of processing.

At Step S2095, meanwhile, the control circuit 1815 considers that a failure has not occurred in the input-side resistor as the test object and terminates this series of processing.

(3) Input-Side Capacitor Failure Detection Processing

Also in the sensor signal input circuit 1800 in the fifth embodiment, input-side capacitor failure detection processing is carried out to detect any break in the input-side capacitors forming the filter circuits 1840a to 1840c connected to the first to Nth signal input terminals 1811a to 1811b. This processing is the same as the input-side capacitor failure detection processing in the fourth embodiment and the description thereof will be omitted.

(Effect)

In the sensor signal input circuits in the fourth and fifth embodiments, any terminal failure and the like are detected by setting a voltage value within the variation range (0 to 5V) of a sensor signal on the inspection capacitor. This makes it unnecessary to make the range of voltage that can be detected with the IC wider than the variation range of each sensor signal. Thus it is possible to prevent the complication of and increase in the size of the configurations of the AD converter and the voltage change detection circuit incorporated in the IC. Or, it is unnecessary to make the variation range of each sensor signal narrower than the range of voltage that can be detected with the IC. This prevents limitations from being imposed on sensors connected to the sensor signal input circuit.

With the sensor signal input circuits in the fourth and fifth embodiments, therefore, the following can be detected without imposing limitations on sensors or complicating or increasing the size of the configuration of the IC: any open failure in a signal input terminal of the IC and any break in a communication path for sensor signals in the IC.

Other Embodiments (1) At Step S1401 to Step S1407, Step S1408 to Step S1422, and Step S1423 to Step S1434 of IC failure detection processing in the fourth embodiment, 5V charge processing and 0V charge processing are sequentially carried out. In addition, after each processing, the voltage value of the signal line 1819d is detected and various failures are detected based on this voltage value. The order of execution of 5V charge processing and 0V charge processing may be changed. Even in this case, the same effect can be obtained. This is the same with: input-side resistor failure detection processing and input-side capacitor failure detection processing in the fourth embodiment; and IC failure detection processing, input-side resistor failure detection processing, and input-side capacitor failure detection processing in the fifth embodiment.

(2) In input-side resistor failure detection processing and input-side capacitor failure detection processing in the fourth and fifth embodiments, 5V charge processing and 0V charge processing are carried out. Instead, for example, the following procedure may be taken: the present voltage value of a sensor signal is estimated based on a past measurement result or the like; when the estimated present voltage value of the sensor signal is close to 5V, 0V charge processing is selected and when the voltage value is close to 0V, 5V charge processing is selected; and the presence or absence of a failure is detected based on the voltage value of the signal line after the execution of the selected processing. Even in this case, any open failure in an input-side resistor or an input-side capacitor can be detected.

(3) In the fourth and fifth embodiment, the inspection capacitor is provided outside the IC. Even when the inspection capacitor is incorporated in the IC, the same effect can be obtained. In the above embodiments, the voltage applied to the inspection capacitor is 0V or 5V. The invention is not limited to this and the voltage can be changed within the variation range of each sensor signal. In the above embodiments, the capacitance of each input-side capacitor is 0.1 µF and the capacitance of the inspection capacitor is 0.01 µF. The invention is not limited to this and the same effect can be obtained even when a different value is set.

(4) The fourth and fifth embodiments are provided with a multiple-channel configuration and N sensor signals are inputted thereto. The invention is not limited to this and may be so configured that a single signal is inputted. Even in this case, the same effect can be obtained.

The sensor signal input circuit in the fourth and fifth embodiments is equivalent to signal input circuit; the IC is equivalent to signal input device or integrated circuit; the inspection power supply is equivalent to charge/discharge unit; the multiplexer is equivalent to selector switch; the inspection switch and the multiplexer are equivalent to connection unit; and the sensor signal is equivalent to input signal.

The control circuit 1115, AD converter 1116, and voltage change detection circuit 1112 of the IC 110 in the fourth embodiment and the control circuit 1815 and voltage change detection circuit 1812 of the IC 1810 in the fifth embodiment are respectively equivalent to determination processing unit. The voltage change detection circuit is equivalent to voltage change detecting means; the determination voltage hold circuit is equivalent to voltage value hold circuit; and the determination circuit and the determination result hold circuit are equivalent to difference hold circuit.

Step S1401 to Step S1407 of the IC failure detection processing in the fourth embodiment are equivalent to inspection switch failure detection processing; Step S1408 to Step S1422 are equivalent to charge/discharge unit failure detection processing; and Step S1423 to Step S1434 are equivalent to terminal failure detection processing.

Step S1901 to Step S1911 of the IC failure detection processing in the fifth embodiment are equivalent to inspection switch failure detection processing; Step S1912 to Step S1932 are equivalent to charge/discharge unit failure detection processing; and Step S1933 to Step S1948 are equivalent to terminal failure detection processing.

Step S1423 and Step S1428 of the IC failure detection processing in the fourth embodiment are equivalent to charge/discharge procedure and Step S1424 and Step S1429 are equivalent to continuity establishing procedure.

Step S1933 and Step S1940 of the IC failure detection processing in the fifth embodiment are equivalent to charge/discharge procedure and Step S1934 and Step S1941 are equivalent to continuity establishing procedure.

The input-side capacitor failure detection processing is equivalent to capacitor failure detection processing and an open failure in an input-side capacitor is equivalent to capacitor failure.

The input-side resistor failure detection processing is equivalent to resistor failure detection processing and an open failure in an input-side resistor is equivalent to resistor failure.

Sixth Embodiment

Description will be given to a sensor signal input circuit in the sixth embodiment.

(Description of Configuration)

Figure 37:
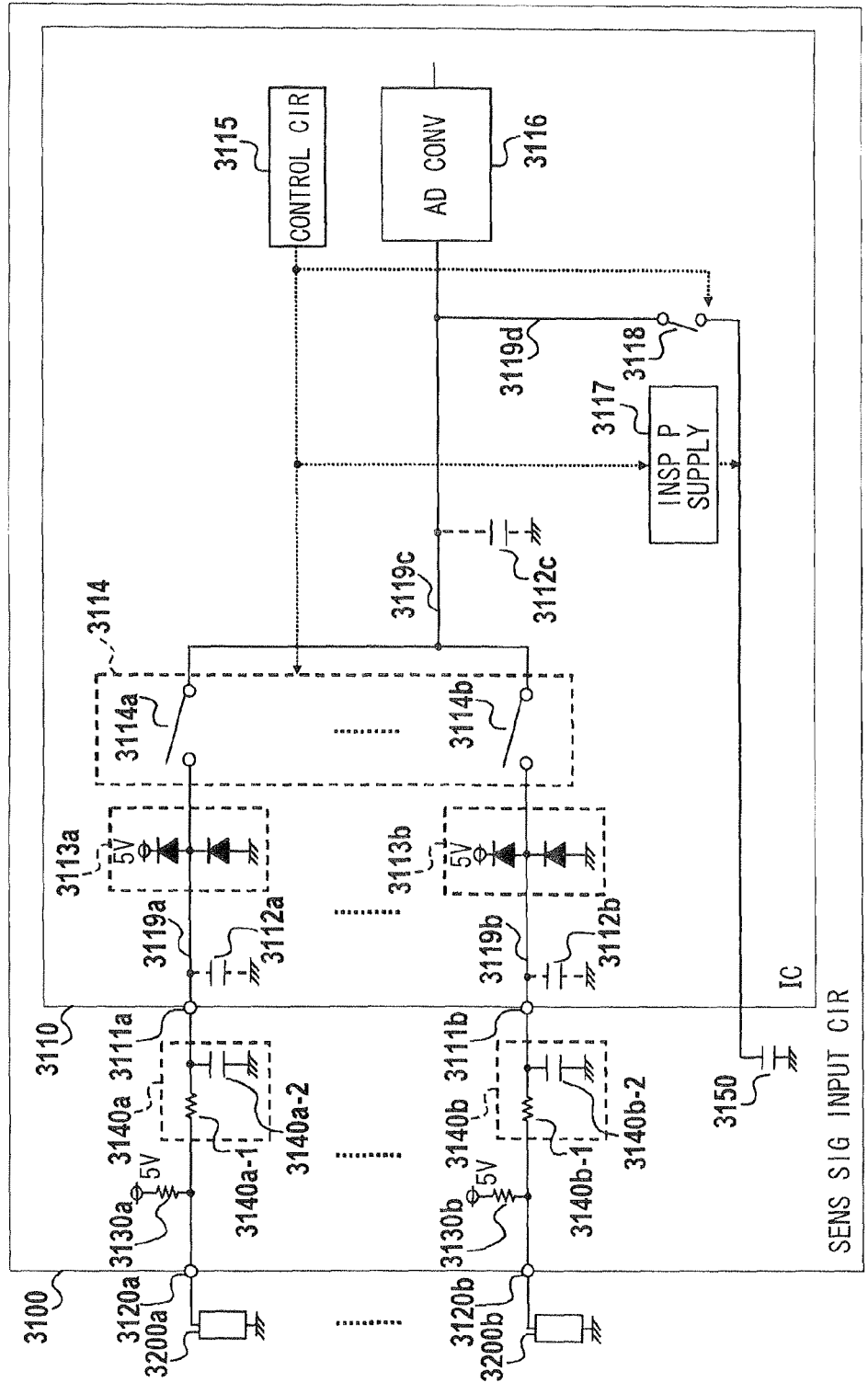
FIG. 37 is a block diagram illustrating the configuration of a sensor signal input circuit in a sixth embodiment.

FIG. 37 is a block diagram illustrating the configuration of the sensor signal input circuit 3100 in the sixth embodiment. The sensor signal input circuit 3100 is connected with first to Nth sensors 3200a to 3200b that generate sensor signals whose voltage value varies within a range of 0V to 5V according to the state of a measuring object and a user's operation. Examples of these sensors are a temperature sensor and a throttle position sensor that detects the state of operation of the accelerator of the relevant vehicle. The sensor signal input circuit 3100 detects the voltage values of sensor signals inputted from these sensors by AD conversion and carries out processing based on the detected voltage values.

Specifically, the sensor signal input circuit 3100 includes: first to Nth external input terminals 3120a to 3120b respectively connected to the first to Nth sensors 3200a to 3200b; and first to Nth signal input terminals 3111a to 3111b respectively connected to the first to Nth external input terminals 3120a to 3120b. It further includes IC 3110 that carries out AD conversion on sensor signals inputted from the first to Nth sensors 3200a to 3200b through these terminals. The IC 3110 may be configured as a microcomputer, IC for AD conversion, or the like.

Further, the sensor signal input circuit 3100 includes: first to Nth resistors 3130a to 3130b connected to the first to Nth external input terminals 3120a to 3120b; and first to Nth filter circuits 3140a to 3140b respectively provided between the first to Nth external input terminals 3120a to 3120b and the first to Nth signal input terminals 3111a to 3111b. Further, the sensor signal input circuit 3100 includes an inspection capacitor 3150 one end of which is connected to a terminal of the IC 3110 and the other end of which is connected to reference potential and which is used to inspect the first to Nth signal input terminal 3111a to 3111b and the like. (Details will be described later.) The first filter circuit 3140a includes: an input-side resistor 3140a-1 provided on the line connecting the first external input terminal 3120a and the first signal input terminal 3111a; and an input-side capacitor 3140a-2 provided between the first signal input terminal 3111a and reference potential. The other filter circuits are similarly configured.

Further, the IC 3110 includes: a multiplexer 3114 (also referred to as MPX) comprised of first to Nth switches 3114a to 3114b that respectively control the connection between the first to Nth signal input terminals 3111a to 3111b and a signal line 3119c; an AD converter 3116 that detects the voltage value of the signal line 3119c within a range of 0 to 5V by AD conversion; and first to Nth surge protection circuits 3113a to 3113b respectively provided between the first to Nth signal input terminals 3111a to 3111b and the multiplexer 3114 to protect the circuit from surge current. The AD converter 3116 is provided with a sampling capacitor (not shown) connected to the signal line 3119c. The voltage value of the signal line 3119c is detected by detecting the voltage value of the sampling capacitor charged with signals transmitted through the signal line 3119c by AD conversion. The first surge protection circuit 3113a is comprised of: a diode whose anode is connected to a first input line 3119a connecting the first signal input terminal 3111a and the multiplexer 3114 and whose cathode is connected to a 5V power supply; and a diode whose cathode is connected to the first input line 3119a and whose anode is connected to reference potential. The other surge protection circuits are similarly configured.

Further, the IC 3110 includes: an inspection switch 3118 that is provided on an inspection line 3119d connecting the signal line 3119c and the above-mentioned inspection capacitor 3150 and establishes or breaks continuity in the inspection line 3119d; an inspection power supply 3117 that applies voltage to the inspection capacitor 3150; and a control circuit 3115 that controls the multiplexer 3114, AD converter 3116, inspection power supply 3117, and inspection switch 3118.

In the IC 3110, parasitic capacitances 3112a to 3112c of 5 pF or so are generated between the first to Nth signal input terminal 3111a to 3111b and reference potential and between the signal line 3119c and reference potential.

The capacitance of the input-side capacitor provided in each signal input terminal is larger than the capacitance of the inspection capacitor 3150. For example, the capacitance of the input-side capacitor may be 0.1 μF and the capacitance of the inspection capacitor 3150 may be 0.01 μF.

The first to Nth external input terminals 3120a to 3120b will also be referred to as ch1 to chN.

(Description of Operation)
(1) Overview

Figure 38:
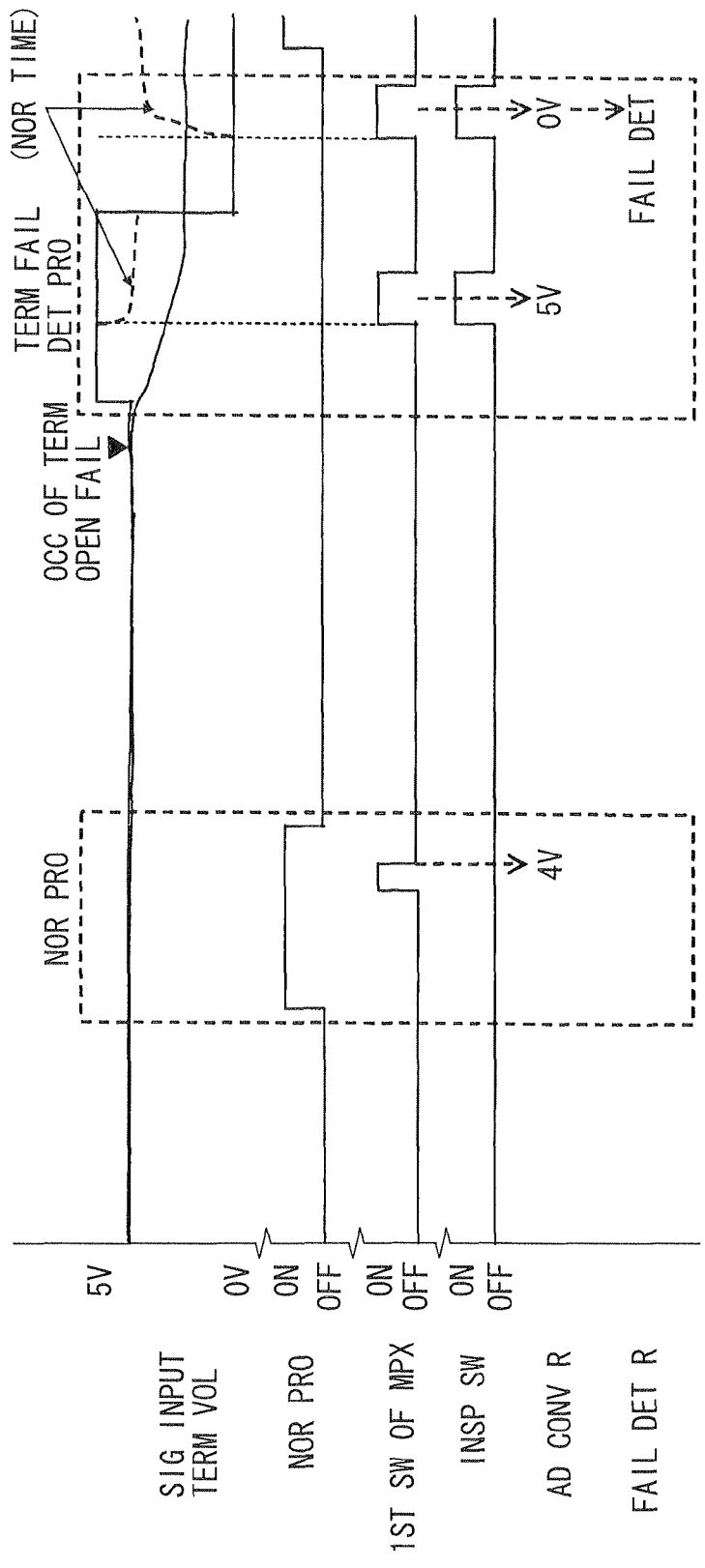
FIG. 38 is a timing chart of normal processing and failure detection processing.
Figure 39:
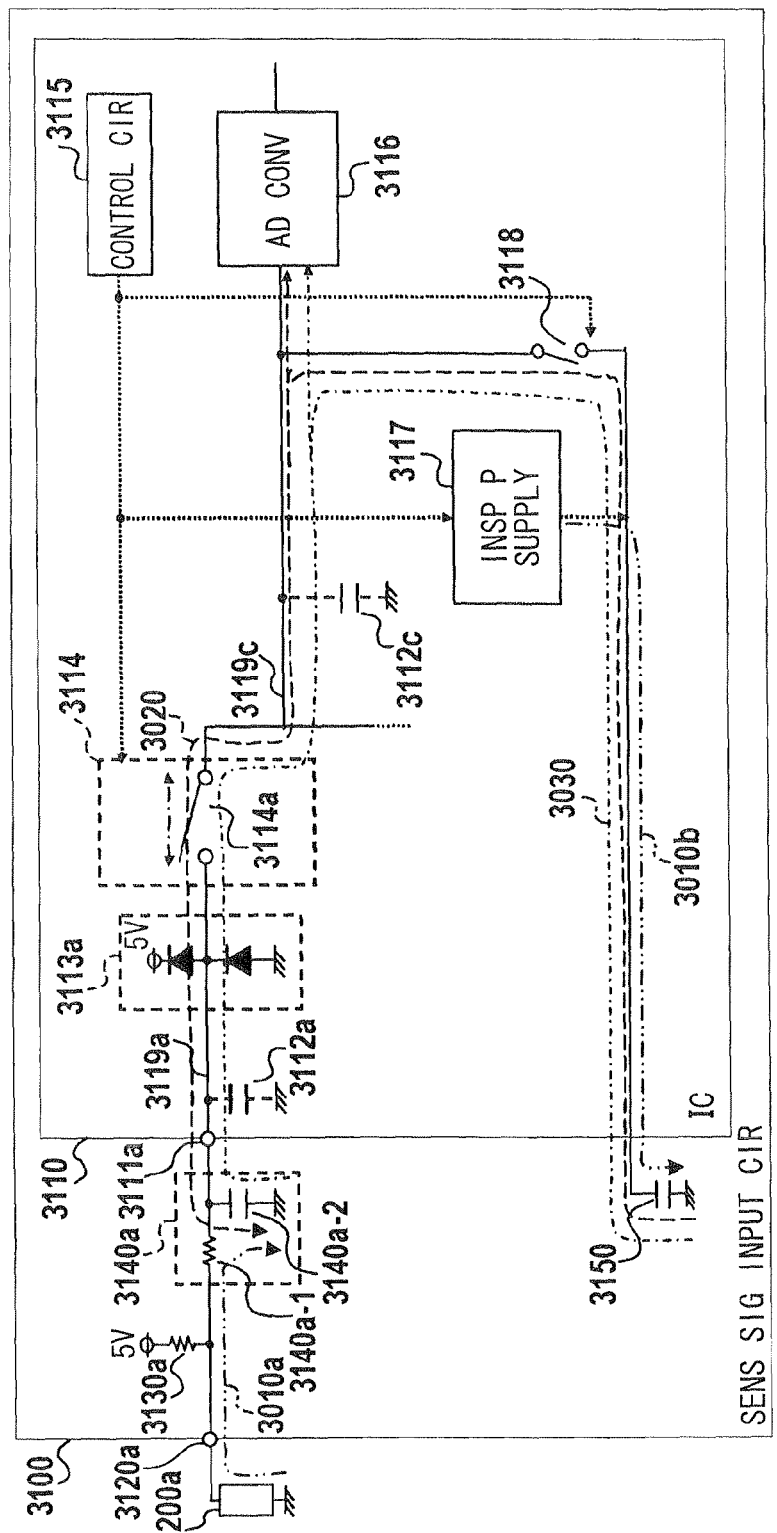
FIG. 39 is an explanatory drawing illustrating the flow of electric charges and the like in failure detection processing at normal times.
Figure 40:
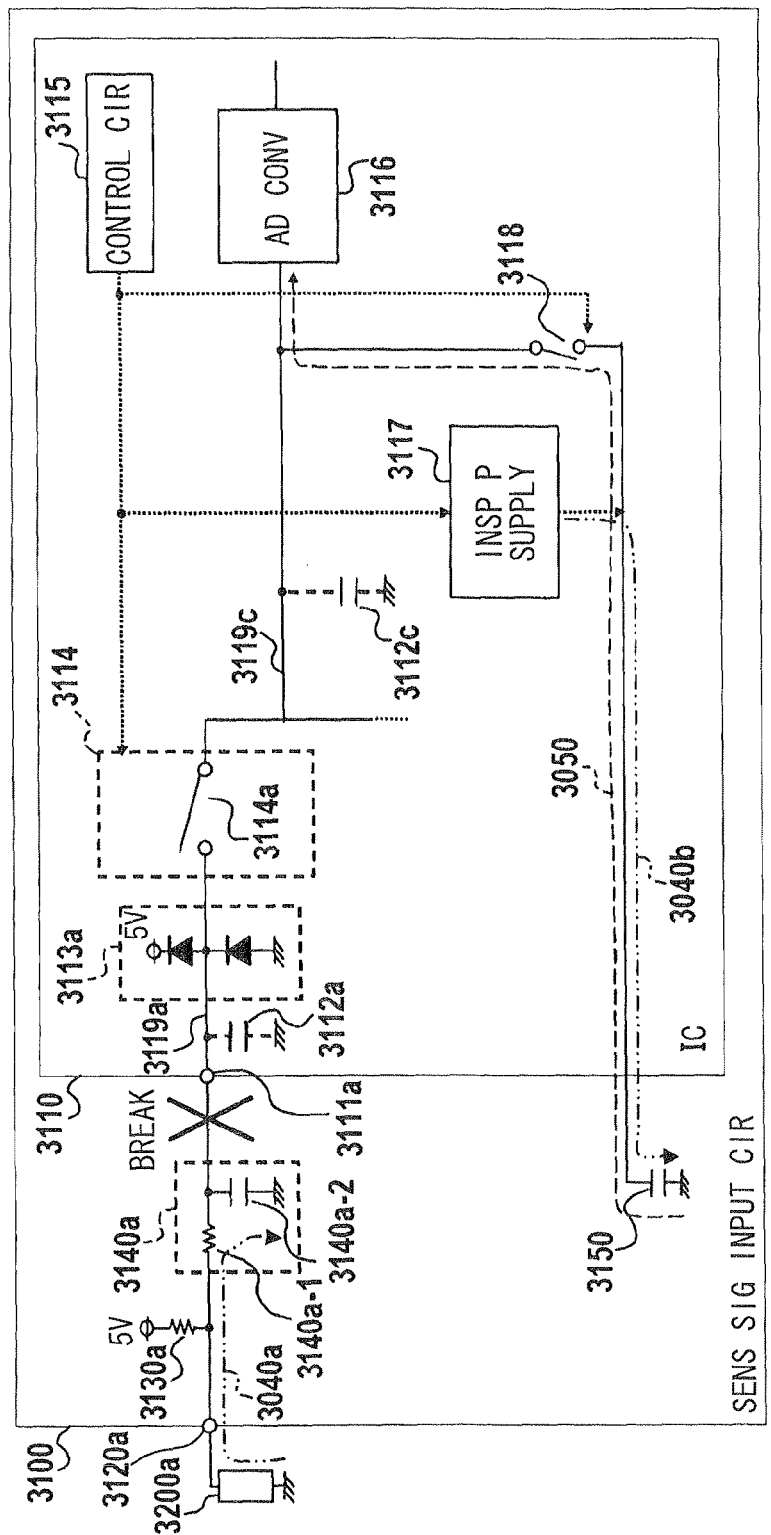
FIG. 40 is an explanatory drawing illustrating the flow of electric charges and the like in failure detection processing when an open failure has occurred in a signal input terminal.

Description will be given to the overview of terminal failure detection processing carried out by the IC 3110 of the sensor signal input circuit 3100 with reference to FIGS. 38 to 40. In the terminal failure detection processing, any terminal failure that is an open failure in the first to Nth signal input terminals 3111a to 3111b or a break in the path from a signal input terminal to the inspection switch 3118 is detected. FIG. 38 is a timing chart illustrating, as an example, the timing of operation of the multiplexer 3114, the inspection switch 3118, and the like in terminal failure detection processing corresponding to the first signal input terminal 3111a connected to the first sensor 3200a. FIG. 39 is an explanatory drawing illustrating, as an example, the flow of electric charges in terminal failure detection processing corresponding to the first signal input terminal 3111a at normal times. FIG. 40 is an explanatory drawing illustrating the flow of electric charges in terminal failure detection processing corresponding to the first signal input terminal 3111a when an open failure occurs in the terminal.

As shown in FIG. 38, the control circuit 3115 of the IC 3110 carries out the following processing in normal processing in which AD conversion is carried out with respect to a sensor signal inputted from the first signal input terminal 3111a: it turns ON only the first switch 3114a of the multiplexer 3114; and it thereby connects the first signal input terminal 3111a and the signal line 3119c and establishes continuity between the first signal input terminal 3111a and the AD converter 3116.

In terminal failure detection processing corresponding to the first signal input terminal 3111a, meanwhile, the control circuit 3115 carries out the following processing: it turns OFF the first switch 3114a of the multiplexer 3114 (that is, it breaks continuity between the first signal input terminal 3111a and the signal line 3119c); it further turns OFF the inspection switch 3118 (that is, it breaks continuity between the inspection capacitor 3150 and the signal line 3119c); and it applies a voltage of 5V to the inspection capacitor 3150 by the inspection power supply 117 to charge electric charges. (Refer to arrow 3010b in FIG. 39 and arrow 3040b in FIG. 40.) At this time, the input-side capacitor 3140a-2 of the filter circuit 3140a is charged with electric charges by the sensor signal. (Refer to arrow 3010a in FIG. 39 and arrow 3040a in FIG. 40.)

As shown in FIG. 38, the control circuit thereafter carries out the following processing: it turns ON the first switch 3114a of the multiplexer 3114 (that is, it establishes continuity between the first signal input terminal 3111a and the signal line 3119c); at the same time, it turns ON the inspection switch 3118 (that is, it establishes continuity between the inspection capacitor 3150 and the signal line 3119c); and it detects the voltage value of the signal line 3119c by the AD converter 3116.

When a terminal failure has not occurred in the first signal input terminal 3111a at this time, the following takes place: when the voltage value of the sensor signal is lower than 5V, the electric charges charged in the inspection capacitor 3150 migrate to the input-side capacitor 3140a-2 and the electric charges in the inspection capacitor 3150 are discharged. For this reason, when a predetermined time has passed after the first switch 3114a and the inspection switch 3118 were turned ON, the voltage of the sensor signal from the first sensor 3200a is detected by the AD converter 3116. (Refer to arrow 3030 in FIG. 39.)

When a terminal failure has occurred in the first signal input terminal 3111a as shown in FIG. 40, meanwhile, the electric charges charged in the inspection capacitor 3150 are not discharged and a voltage value close to 5V is detected by the AD converter 3116. (Refer to arrow 3050 in FIG. 40.)

Subsequently, the control circuit 3115 turns OFF the first switch 3114a of the multiplexer 3114 and the inspection switch 118 to apply a voltage of 0V to the inspection capacitor 3150 by the inspection power supply 3117. The electric charges in the inspection capacitor 3150 are thereby discharged. (Refer to arrow 3010b in FIG. 39 and arrow 3040b in FIG. 40.) At this time, the input-side capacitor 3140a-2 of the filter circuit 3140a is charged with electric charges by the sensor signal. (Refer to arrow 3010a in FIG. 39 and arrow 3040a in FIG. 40.)

As shown in FIG. 38, the control circuit thereafter turns ON the inspection switch 3118 and the first switch 3114a of the multiplexer 3114 and detects the voltage value of the signal line 3119c by the AD converter 3116.

When a terminal failure has not occurred in the first signal input terminal 3111a at the time, the following takes place: when the voltage value of the sensor signal is higher than 0V, the electric charges charged in the input-side capacitor 3140a-2 migrate to the inspection capacitor 3150 and the inspection capacitor 3150 is charged. For this reason, when a predetermined time has passed, the voltage of the input signal from the first sensor 3200a is detected by the AD converter 3116. (Refer to arrow 3030 in FIG. 39.)

When a terminal failure has occurred in the first signal input terminal 3111a as shown in FIG. 40, meanwhile, the electric charges charged in the input-side capacitor 3140a-2 do not migrate to the inspection capacitor 3150. Then a voltage value close to 0V is detected by the AD converter 3116. (Refer to arrow 3050 in FIG. 40.)

In terminal failure detection processing in the sixth embodiment, as mentioned above, two times of voltage application, voltage application at 5V and voltage application at 0V, are carried out on the inspection capacitor 3150. After each time of voltage application, the voltage value of the signal line 3119c is detected by the AD converter 3116. Then, as listed in FIG. 41, it is determined that a terminal failure has occurred in the first signal input terminal 3111a in cases where: a voltage value close to 5V is detected after the first voltage application and a voltage value close to 0V is detected after the second voltage application. Meanwhile, it is determined that the first input terminal is normal in the following cases: cases where a voltage value close to 5V is not detected after the first voltage application; and cases where a voltage value close to 0V is not detected after the second voltage application. For this reason, if the voltage value of a sensor signal from the first sensor 3200a is close to 5V or close to 0V, erroneous detection of a terminal failure can be prevented.

(2) Details of Terminal Failure Detection Processing

Figure 42:
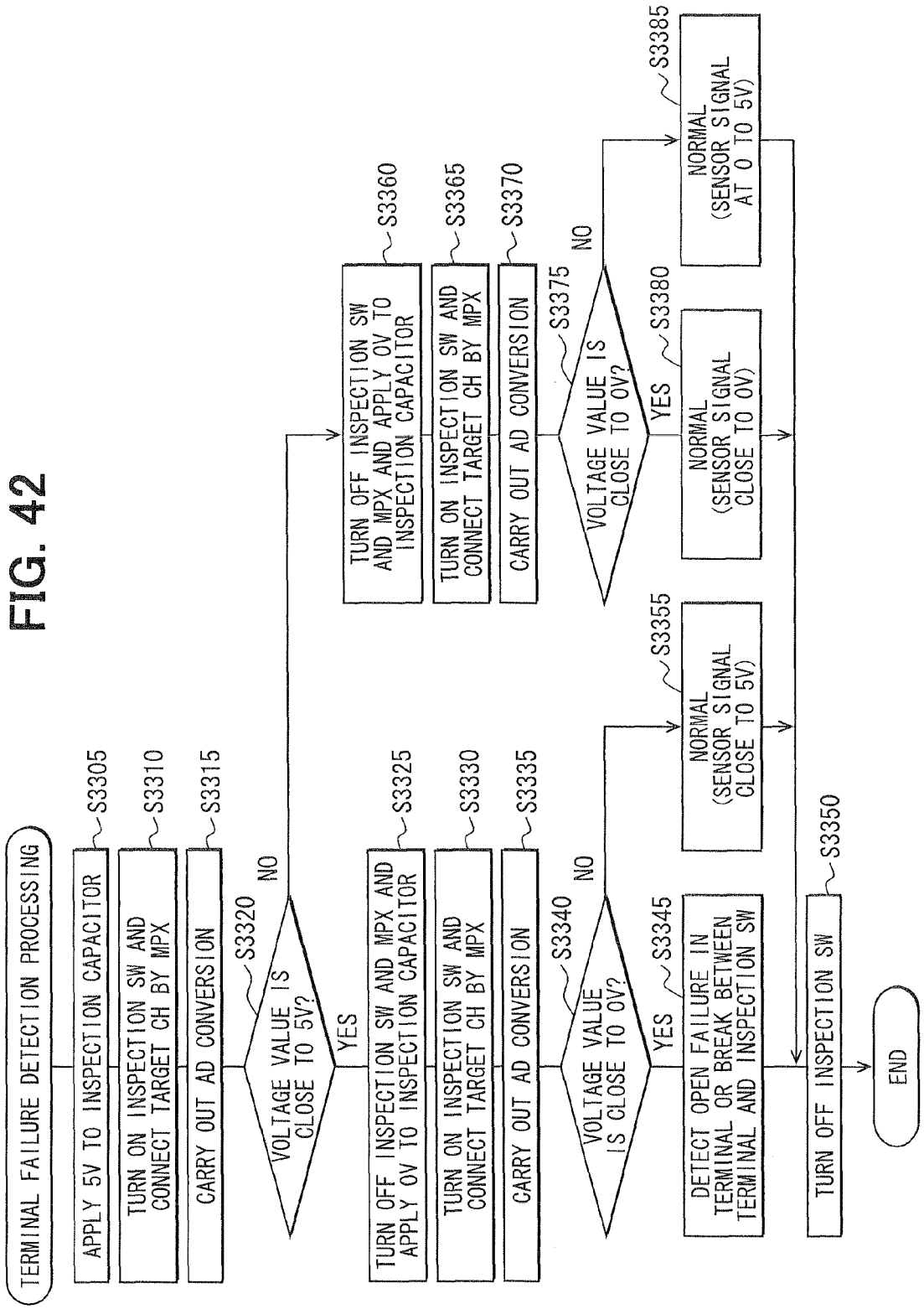
FIG. 42 is a flowchart of failure detection processing in the first embodiment.

Description will be given to the details of terminal failure detection processing for detecting any terminal failure in the first to Nth signal input terminals 3111a to 3111b with reference to the flowchart in FIG. 42. This series of processing is carried out with any one signal input terminal taken as the test object and is periodically carried out with the signal input terminal as the test object changed during the operation of the sensor signal input circuit 3100.

At Step S3305, the control circuit 3115 of the IC 3110 breaks continuity between every signal input terminal and the signal line 3119c by the multiplexer 3114 and turns OFF the inspection switch 3118. Then it applies a voltage of 5V to the inspection capacitor 3150 by the inspection power supply 3117 for a predetermined period to set the voltage of the inspection capacitor 3150 to 5V. Then the flow proceeds to the processing of Step S3310.

At Step S3310, the control circuit 3115 turns ON the inspection switch 3118 and establishes continuity between the signal input terminal as the test object and the signal line 3119c by the multiplexer 3114. Then the flow proceeds to the processing of Step S3315.

At Step S3315, the control circuit 3115 causes the AD converter 3116 to carry out AD conversion to detect the voltage value of the signal line 3119c and the flow proceeds to the processing of Step S3320.

At Step S3320, the control circuit 3115 determines whether or not the voltage value detected by AD conversion is 5V or a value close to 5V. When an affirmative determination is made (Step S3320: Yes), the flow proceeds to the processing of Step S3325; and when a negative determination is made (Step S3320: No), the flow proceeds to the processing of Step S3360.

At Step S3325, the control circuit 3115 breaks continuity between every signal input terminal and the signal line 3119c by the multiplexer 3114 and turns OFF the inspection switch 3118. Then it applies a voltage of 0V to the inspection capacitor 3150 by the inspection power supply 3117 for a predetermined period to set the voltage of the inspection capacitor 3150 to 0V. Then the flow proceeds to the processing of Step S3330.

At Step S3330, the control circuit 3115 turns ON the inspection switch 3118 and establishes continuity between the signal input terminal as the test object and the signal line 3119c by the multiplexer 3114 and the flow proceeds to the processing of Step S3335.

At Step S3335, the control circuit 3115 causes the AD converter 3116 to carry out AD conversion to detect the voltage value of the signal line 3119c and the flow proceeds to the processing of Step S3340.

At Step S3340, the control circuit 3115 determines whether or not the voltage value detected by AD conversion is 0V or a value close to 0V. When an affirmative determination is made (Step S3340: Yes), the flow proceeds to the processing of Step S3345; and when a negative determination is made (Step S3340: No), the flow proceeds to the processing of Step S3355.

At Step S3345, the control circuit 3115 determines that a terminal failure has occurred in the signal input terminal as the test object and the flow proceeds to the processing of Step S3350.

At Step S3350, the control circuit 3115 turns OFF the inspection switch 3118 and terminates this series of processing.

At Step S3355 to which the flow proceeds when a negative determination is made at Step S3340, the control circuit 3115 determines that a terminal failure has not occurred in the signal input terminal as the test object. Then the flow proceeds to the processing of Step S3350. When the voltage value of the sensor signal inputted to the signal input terminal as the test object is close to 5V, the flow proceeds to the processing of Step S3355.

At Step S3360 to which the flow proceeds when a negative determination is made at Step S3320, the control circuit 3115 carries out the following processing: it breaks continuity between every signal input terminal and the signal line 3119c by the multiplexer 3114 and turns OFF the inspection switch 3118; and it applies a voltage of 0V to the inspection capacitor 3150 by the inspection power supply 3117 for a predetermined period to set the voltage of the inspection capacitor 3150 to 0V. Then the flow proceeds to the processing of Step S3365.

At Step S3365, the control circuit 3115 turns ON the inspection switch 3118 and establishes continuity between the signal input terminal as the test object and the signal line 3119c by the multiplexer 3114 and the flow proceeds to the processing of Step S3370.

At Step S3370, the control circuit 3115 causes the AD converter 3116 to carry out AD conversion to detect the voltage value of the signal line 3119c and the flow proceeds to the processing of Step S3375.

At Step S3375, the control circuit 115 determines whether or not the voltage value detected by AD conversion by the AD converter 3116 is 0V or a value close to 0V. When an affirmative determination is made (Step S3375: Yes), the flow proceeds to the processing of Step S3380; and when a negative determination is made (Step S3375: No), the flow proceeds to the processing of Step S3385.

At Step S3380, the control circuit 3115 determines that a terminal failure has not occurred in the signal input terminal as the test object and the flow proceeds to the processing of Step S3350. When the voltage value of the sensor signal inputted to the signal input terminal is close to 0V, the flow proceeds to the processing of Step S3380.

Also at Step S3385, the control circuit 3115 determines that a terminal failure has not occurred in the signal input terminal as the test object and the flow proceeds to the processing of Step S3350. When the voltage value of the sensor signal inputted to the signal input terminal is 0 to 5V, the flow proceeds to the processing of Step S3385.

Seventh Embodiment

Figure 43:
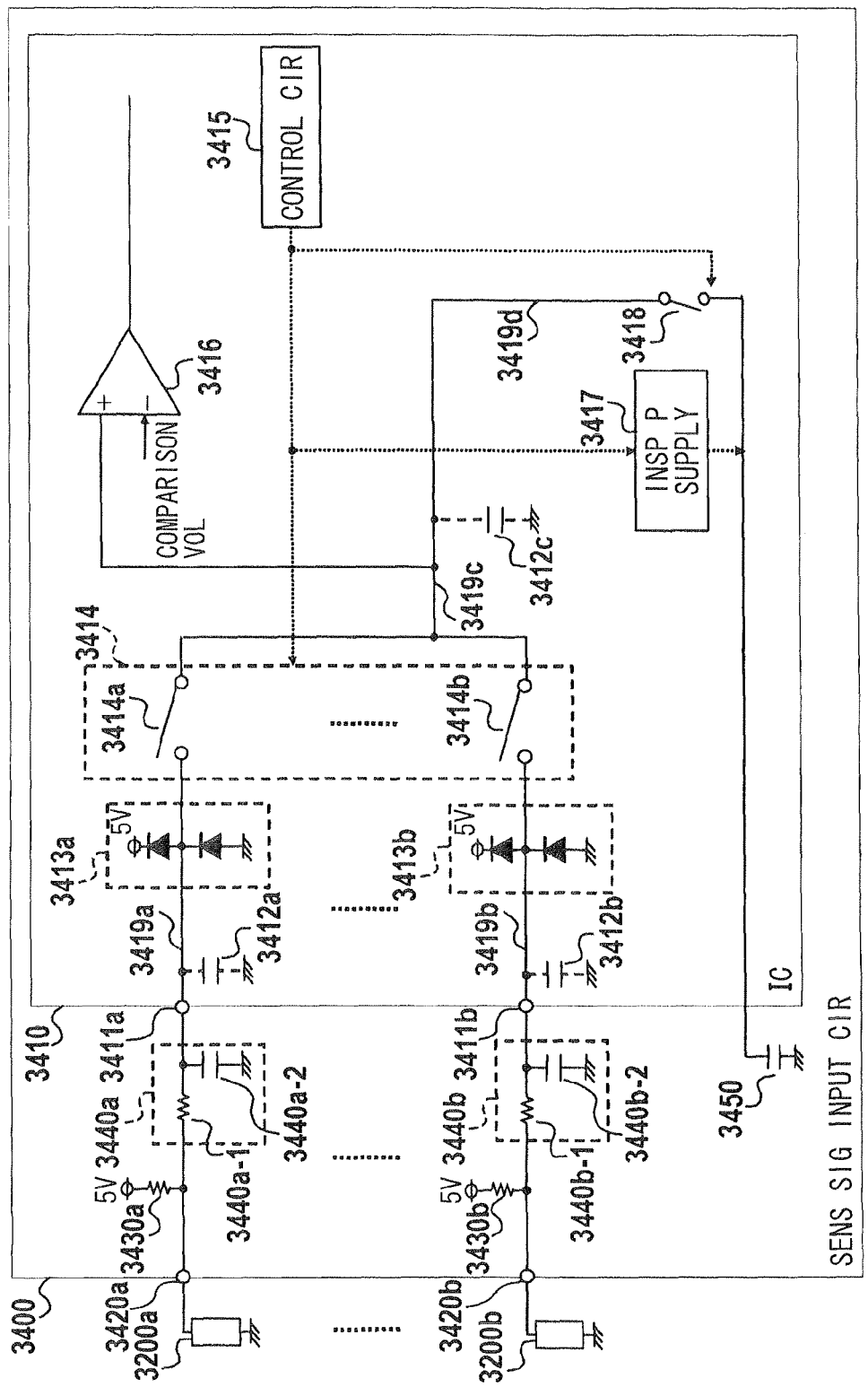
FIG. 43 is a block diagram illustrating the configuration of a sensor signal input circuit in a seventh embodiment.

Description will be given to a sensor signal input circuit in the seventh embodiment.
(Description of Configuration)
FIG. 43 is a block diagram illustrating the configuration of the sensor signal input circuit 3400 in the seventh embodiment. This sensor signal input circuit 3400 is connected with the same first to Nth sensors 3200a to 3200b as in the sixth embodiment. It carries out processing according to whether or not the voltage of a sensor signal within a range of 0V to 5V inputted from these sensors is higher than a predetermined comparison voltage (for example, 2.5V).

Specifically, the sensor signal input circuit 3400 includes: the same first to Nth external input terminals 3420a to 3420b as in the sixth embodiment; and IC 3410 having first to Nth signal input terminals 3411a to 3411b respectively connected to the first to Nth external input terminals 3420a to 3420b.

Further, the sensor signal input circuit 3400 includes: the same first to Nth resistors 3430a to 3430b, first to Nth filter circuits 3440a to 3440b, and inspection capacitor 3450 as in the sixth embodiment. The first filter circuit 3440a includes the same input-side resistor 3440a-1 and input-side capacitor 3440a-2 as in the sixth embodiment and the other filter circuits are similarly configured.

The IC 3410 includes a multiplexer 3414 having first to Nth switches 3414a to 3414b and first to Nth surge protection circuits 3413a to 3413b as in the sixth embodiment. The IC 3410 is provided with a comparator 3416 in place of the AD converter. The comparator compares the voltage of a sensor signal transmitted through a signal line 3419c with the comparison voltage. When the voltage of the sensor signal is higher than the comparison voltage, it outputs a HIGH level; and when the voltage of the sensor signal is equal to or lower than the comparison voltage, it outputs a LOW level.

Further, the IC 3410 includes: an inspection switch 3418 that is provided on the inspection line 3419d connecting the signal line 3419c and the inspection capacitor 3450 and establishes or breaks continuity in the inspection line 3419d; an inspection power supply 3417 that applies voltage to the inspection capacitor 3450; and a control circuit 3415 that controls the multiplexer 3414, comparator 3416, inspection power supply 3417, and inspection switch 3418.

In the IC 3410, parasitic capacitances 3412a to 3412c of 5 pF or so are generated between the first to Nth signal input terminals 3411a to 3411b and reference potential and between the signal line 3419c and reference potential.

The capacitance of the input-side capacitor provided in each signal input terminal is larger than the capacitance of the inspection capacitor 3450. For example, the capacitance of the input-side capacitor may be 0.1 μF and the capacitance of the inspection capacitor 3450 may be 0.01 μF.

Figure 44:
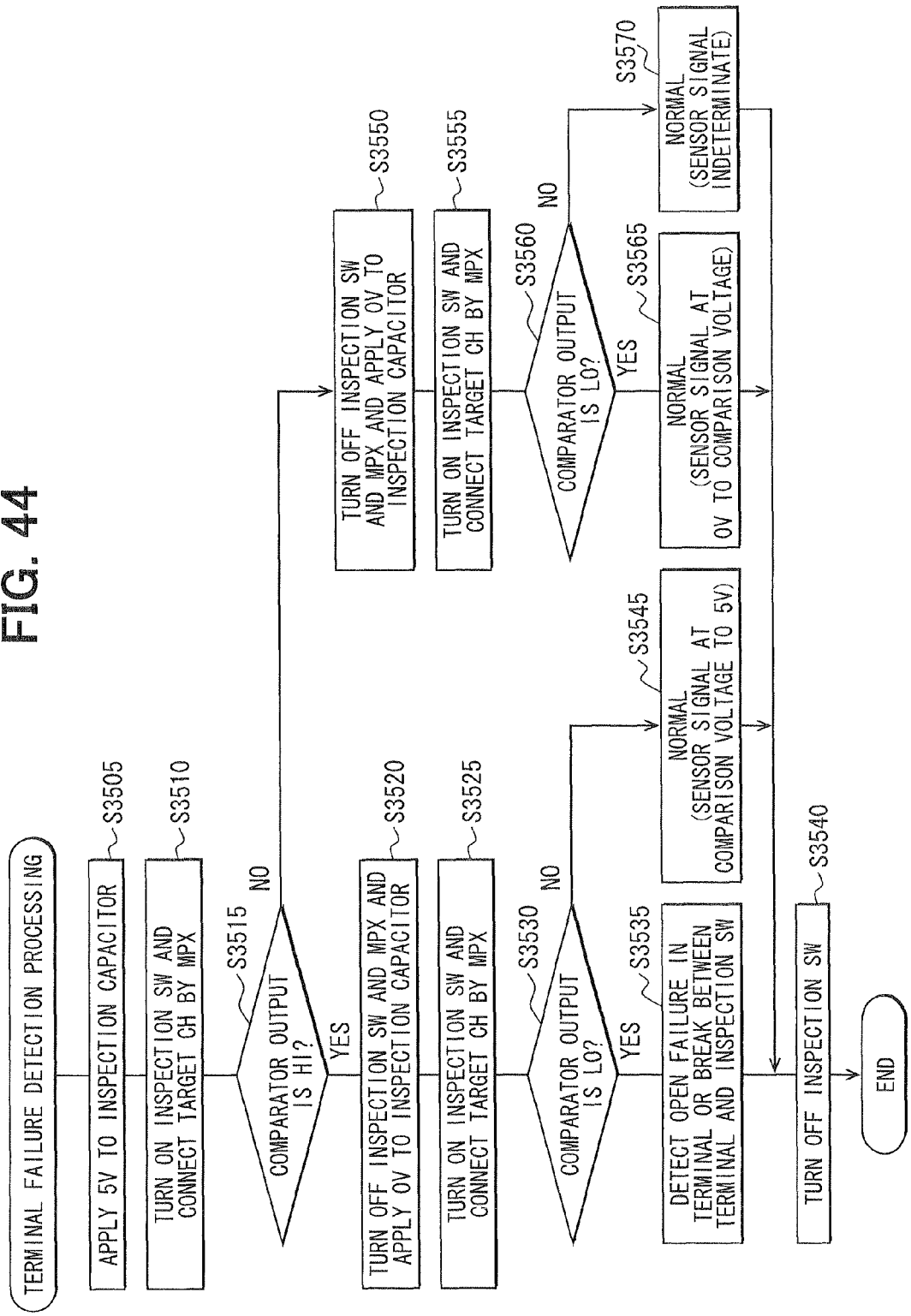
FIG. 44 is a flowchart of failure detection processing in the seventh embodiment.

The first to Nth external input terminals 3420a to 3420b will also be referred to as ch1 to chN.
(Description of Operation)
Description will be given to terminal failure detection processing carried out by the IC 3410 of the sensor signal input circuit 3400 with reference to FIG. 44. In the terminal failure detection processing, any terminal failure is detected with respect to the first to Nth signal input terminals 3411a to 3411b. This series of processing is carried out with any one signal input terminal taken as the test object and is periodically carried out with the signal input terminal as the test object changed during the operation of the sensor signal input circuit 3400.

At Step S3505, the control circuit 3415 of the IC 3410 breaks continuity between every signal input terminal and the signal line 3419c by the multiplexer 3414. Further, it turns OFF the inspection switch 3418 (that is, it breaks continuity between the inspection capacitor 3450 and the signal line 3419c). Then it applies a voltage of 5V to the inspection capacitor 450 by the inspection power supply 3417 for a predetermined period to set the voltage of the inspection capacitor 3450 to 5V and the flow proceeds to the processing of Step S3510.

At Step S3510, the control circuit 3415 turns ON the inspection switch 3418 (that is, it establishes continuity between the inspection capacitor 3450 and the signal line 3419c). Further, it establishes continuity between a signal input terminal as the test object and the signal line 3419c by the multiplexer 3414. Then it causes the comparator 3416 to compare the voltage of the signal line 3419c with the comparison voltage and the flow proceeds to the processing of Step S3515.

At Step S3515, the control circuit 3415 determines whether the output signal from the comparator 3416 is at the HIGH level or at the LOW level. When the output signal is at the HIGH level (Step S3515: Yes), the control circuit determines that the voltage of the signal line 3419c is higher than the comparison voltage and the flow proceeds to the processing of Step S3520. When the output signal is at the LOW level (Step S3515: No), meanwhile, it determines that the voltage of the signal line 3419c is equal to or lower than the comparison voltage and the flow proceeds to the processing of Step S3550.

At Step S3520, the control circuit 3415 breaks continuity between every signal input terminal and the signal line 3419c by the multiplexer 3414 and further turns OFF the inspection switch 3418. Then it applies a voltage of 0V to the inspection capacitor 3450 by the inspection power supply 3417 for a predetermined period to set the voltage of the inspection capacitor 3450 to 0V and the flow proceeds to the processing of Step S3525.

At Step S3525, the control circuit 3415 turns ON the inspection switch 3418 and further establishes continuity between the signal input terminal as the test object and the signal line 3419c by the multiplexer 3414. Then it causes the comparator 3416 to compare the voltage of the signal line 3419c with the comparison voltage and the flow proceeds to the processing of Step S3530.

At Step S3530, the control circuit 3415 determines whether the output signal from the comparator 3416 is at the LOW level or at the HIGH level. When the output signal is at the LOW level (Step S3530: Yes), the control circuit determines that the voltage of the signal line 3419c is equal to or lower than the comparison voltage and the flow proceeds to the processing of Step S3535. When the output signal is at the HIGH level (Step S3530: No), meanwhile, it determines that the voltage of the signal line 3419c is higher than the comparison voltage and the flow proceeds to the processing of Step S3545.

At Step S3535, the control circuit 3415 determines that a terminal failure has occurred in the signal input terminal as the test object and the flow proceeds to the processing of Step S3540.

At Step S3540, the control circuit 3415 turns OFF the inspection switch 418 and terminates this series of processing.

At Step S3545 to which the flow proceeds when a negative determination is made at Step S3530, the control circuit 3415 determines that a terminal failure has not occurred in the signal input terminal as the test object. Then the flow proceeds to the processing of Step S3540. When the voltage value of the sensor signal inputted to the signal input terminal is within a range of 2.5V (the voltage value of the comparison voltage) to 5V, the flow proceeds to the processing of Step S3545.

At Step S3550 to which the flow proceeds when a negative determination is made at Step S3515, the control circuit 3415 breaks continuity between every signal input terminal and the signal line 3419c by the multiplexer 3414 and further turns OFF the inspection switch 3418. Then it applies a voltage of 0V to the inspection capacitor 3450 by the inspection power supply 3417 for a predetermined period to set the voltage of the inspection capacitor 3450 to 0V and the flow proceeds to the processing of Step S3555.

At Step S3555, the control circuit 3415 turns ON the inspection switch 3418 and further establishes continuity between the signal input terminal as the test object and the signal line 3419c by the multiplexer 3414. Then it causes the comparator 3416 to compare the voltage of the signal line 3419c with the comparison voltage and the flow proceeds to the processing of Step S3560.

At Step S3560, the control circuit 3415 determines whether the output signal from the comparator 3416 is at the LOW level or at the HIGH level. When the output signal is at the LOW level (Step S3560: Yes), the control circuit determines that the voltage of the signal line 3419c is equal to or lower than the comparison voltage and the flow proceeds to the processing of Step S3565. When the output signal is at the HIGH level (Step S3560: No), meanwhile, it determines that the voltage of the signal line 3419c is higher than the comparison voltage and the flow proceeds to the processing of Step S3570.

At Step S3565, the control circuit 3415 determines that a terminal failure has not occurred in the signal input terminal as the test object and the flow proceeds to the processing of Step S3540. When the voltage value of the sensor signal inputted to the signal input terminal is within a range of 0V to 2.5V (the voltage value of the comparison voltage), the flow proceeds to the processing of Step S3565.

Also at Step S3570, the control circuit 3415 determines that a terminal failure has not occurred in the signal input terminal as the test object and the flow proceeds to the processing of Step S3540. When the voltage value of the sensor signal inputted to the signal input terminal is indeterminate in proximity to 2.5V (the voltage value of the comparison voltage), the flow proceeds to the processing of Step S3570.

Also in terminal failure detection processing in the seventh embodiment, as mentioned above, two times of voltage application, voltage application at 5V and voltage application at 0V, are carried out on the inspection capacitor 3450. After each time of voltage application, comparison of the voltage of the signal line 3419c with the comparison voltage by the comparator 3416 is carried out in place of AD conversion by the AD converter. As listed in FIG. 45, it is determined that a terminal failure has occurred in cases where: the output signal from the comparator 3416 after 5V voltage application is at the HIGH level and the output signal from the comparator 3416 after 0V voltage application is at the LOW level.

Meanwhile, it is determined that a terminal failure has not occurred in the following cases: cases where the output signals from the comparator 3416 after two times of voltage application are both at the HIGH level or at the LOW level; and cases where the output signal after 5V voltage application is at the LOW level and the output signal after 0V voltage application is at the HIGH level.

For this reason, if the voltage value of a sensor signal is close to 5V or close to 0V, erroneous detection of a terminal failure can be prevented.

(Effect)

In terminal failure detection processing carried out at the IC of the sensor signal input circuit in the sixth and seventh embodiments, the processing of setting the voltage of the inspection capacitor to 5V and the processing of setting it to 0V are carried out. After each processing, continuity is established between the inspection capacitor and a signal input terminal as the test object and the voltage value of the signal line is detected. When the voltage value of the signal line after the inspection capacitor is set to 5V is close to 5V and the voltage value of the signal line after it is set to 0V is close to 0V, it is considered that a terminal failure has occurred.

Since each signal input terminal is provided with an input-side capacitor, variation in the voltage value of the signal line can be suppressed when continuity is established between the inspection capacitor set to 5V or 0V and the signal input terminal. For this reason, variation in the voltage of a sensor signal flowing through a signal line caused by the influence of terminal failure detection processing can be suppressed when a terminal failure has not occurred.

With the sensor signal input circuits in the sixth and seventh embodiments, therefore, it is possible to suppress variation in sensor signals and detect any terminal failure.

Other Embodiments (1) In the sixth and seventh embodiments, the inspection capacitor is provided outside the IC. Even when the inspection capacitor is incorporated in the IC, the same effect can be obtained. In the above embodiments, the voltage applied to the inspection capacitor is 0V or 5V. The invention is not limited to this and the voltage can be changed within the variation range of each sensor signal. In the above embodiments, the capacitance of the input-side capacitor is 0.1 µF and the capacitance of the inspection capacitor is 0.01 µF. The invention is not limited to this and the same effect can be obtained even when a different value is set.

(2) The sixth and seventh embodiments are provided with a multiple-channel configuration and N sensor signals are inputted thereto. The invention is not limited to this and may be so configured that a single signal is inputted. Even in this case, the same effect can be obtained.

(3) In the sixth and seventh embodiments, the inspection switch is provided in the IC. The inspection switch may not be provided. Even in this case, continuity between each signal input terminal and the inspection capacitor can be controlled by the multiplexer. Electric charges can be similarly charged into the inspection capacitor and migration of electric charges between the inspection capacitor and each input-side capacitor can be similarly caused.

The sensor signal input circuit is equivalent to signal input circuit; the IC is equivalent to signal input device and integrated circuit; the inspection switch and the multiplexer are equivalent to connection unit; and the inspection power supply is equivalent to charge/discharge unit.

The control circuit 3115 and the AD converter 3116 in the sensor signal input circuit 3100 in the sixth embodiment and the control circuit 3415 and the comparator 3416 in the sensor signal input circuit 3400 in the seventh embodiment are respectively equivalent to determination processing unit.

The sensor signal is equivalent to input signal.

Step S3305, Step S3325, and Step S3360 of terminal failure detection processing is the sixth embodiment are equivalent to charge/discharge procedure and Step S3310, Step S3330, and Step S3365 thereof are equivalent to continuity establishing procedure.

Step S3505, Step S3520, and Step S3550 of terminal failure detection processing in the seventh embodiment are equivalent to charge/discharge procedure and Step S3510, Step S3525, and Step S3555 thereof are equivalent to continuity establishing procedure.

The above disclosure has the following aspects.

According to a first aspect of the present disclosure, a signal input circuit includes: a measuring device having a signal input terminal, through which an input signal is input into the measuring device, the input signal having a voltage variable within a predetermined variation range, wherein the measuring device includes: a measurement unit connected to the signal input terminal through a measurement path, and carrying out a measurement processing for measuring the voltage of the input signal, the measurement processing including a reading procedure for reading a voltage of the measurement path and a generation procedure for generating measurement data indicating a read voltage of the measurement path; an inspection capacitor having one end connected to the measurement path and the other end connected to a reference potential; an inspection switch arranged in the measuring device and connecting and disconnecting an inspection path, which connects the inspection capacitor and the measurement path; a charge and discharge unit arranged in the measuring device and charging and discharging the inspection capacitor so that a voltage between both ends of the inspection capacitor is set to be within the predetermined variation range; and a control unit arranged in the measuring device and carrying out a measurement period failure detection processing for detecting any terminal failure that occurs at the signal input terminal or a path connected to the signal input terminal. The control unit carries out the measurement period failure detection processing in parallel to the measurement processing by the measurement unit. The control unit sequentially carries out a charge and discharge procedure and a continuity establishing procedure in the measurement period failure detection processing during a period from time when the measurement unit starts to carry out the measurement processing to time when the measurement unit completes the reading procedure. In the charge and discharge procedure, the control unit controls the inspection switch to disconnect the inspection path and controls the charge and discharge unit to set the voltage between both ends of the inspection capacitor to be a predetermined terminal inspection voltage. In the continuity establishing procedure, the control unit controls the inspection switch to connect the inspection path before the measurement unit completes the reading procedure. The control unit detects the terminal failure based on data generated in the measurement processing.

Terminal failure refers to, for example, an open failure in the signal input terminal and a break in the communication path, such as the measurement path and the inspection path, for communicating input signals.

First, description will be given to detection of a terminal failure. In the measurement period failure detection processing described above, the inspection capacitor is set to a terminal inspection voltage value through the charge/discharge procedure; thereafter, continuity is established between the inspection capacitor and the signal input terminal through the continuity establishing procedure. If a terminal failure has occurred in this time, the inspection capacitor is not caused to continue to outside the measuring device and the inspection capacitor is not charged or discharged. For this reason, the voltage value of the measurement path becomes equal to the terminal inspection voltage value generated by the inspection capacitor or a voltage value close thereto. When a terminal failure has not occurred, meanwhile, the inspection capacitor is charged and discharged. The voltage value of the measurement path temporarily becomes equal to a value close to the terminal inspection voltage value generated by the inspection capacitor and thereafter becomes equal to the voltage value of an input signal. Therefore, the occurrence of any terminal failure can be detected by determining whether or not the voltage value measured by the measurement unit is equal to the terminal inspection voltage value or a value close thereto.

When the voltage value of the measurement path obtained after the continuity establishing procedure is carried out is close to the terminal inspection voltage value, it can be considered that a terminal failure has occurred. For this reason, if a voltage value is measured by sequential AD conversion in the measurement processing, it is unnecessary to wait until the generation of measurement data is completed. The presence or absence of a terminal failure can be determined based on data equivalent to a predetermined number of bits obtained in the process of AD conversion. Therefore, data related to the detection of a terminal failure refers to measurement data generated during measurement processing or data equivalent to a predetermined number of bits obtained in the process of AD conversion. Use of data equivalent to a predetermined number of bits makes it unnecessary to wait for the completion of AD conversion and makes it possible to early detect any terminal failure.

In the signal input circuit described above, the measurement unit and the signal input terminal are connected with each other through the measurement path. The inspection capacitor is connected to the measurement path through the inspection path and continuity is established or broken in the inspection path by the inspection switch. For this reason, it is possible to maintain connection between the measurement unit and the signal input terminal and establish or break continuity in the inspection path. In addition, it is possible to input input signals to the measurement unit through the signal input terminal and the measurement path and charge or discharge the inspection capacitor. That is, it is possible to simultaneously carry out both reading of the voltage of an input signal through the reading procedure in the measurement processing and setting of the voltage of the inspection capacitor. The control unit sets the inspection capacitor to the terminal inspection voltage value to establish continuity between the inspection capacitor and the measurement path by the completion of reading procedure at the latest; and it thereby carries out measurement processing and measurement period failure detection processing in parallel.

In the signal input circuit described above, as mentioned above, measurement period failure detection processing for detecting any terminal failure is carried out in parallel to measurement processing for measuring the voltage value of an input signal. With this signal input circuit, therefore, it is possible to detect an open failure in the signal input terminal and a break in the communication path for communicating an input signal without delaying detection of the voltage value of the input signal.

If the voltage value of an input signal is close to the terminal inspection voltage value, the following takes place even though a terminal failure has not occurred: the voltage value of the measurement path that underwent the continuity establishing procedure in measurement period failure detection processing becomes close to the terminal inspection voltage value. Accordingly, the control unit may set the terminal inspection voltage to be a first terminal inspection voltage, and carries out the measurement period failure detection processing with using the first terminal inspection voltage. The control unit sets the terminal inspection voltage to be a second terminal inspection voltage, which is different from the first terminal inspection voltage, and carries out the measurement period failure detection processing with using the second terminal inspection voltage, and the control unit detects the terminal failure based on data generated in the measurement processing with using each of the first terminal inspection voltage and the second terminal inspection voltage carried out in parallel to the measurement period failure detection processing. Thus it can be considered that a terminal failure has occurred in cases where: the voltage value of the measurement path obtained after measurement period failure detection processing is carried out with the first terminal inspection voltage value is close to the first terminal inspection voltage value; and at the same time, the voltage value of the measurement path obtained after measurement period failure detection processing is carried out with the second terminal inspection voltage value is close to the second terminal inspection voltage value. For this reason, erroneous detection of a terminal failure can be prevented even in the following cases: cases where a terminal failure has not occurred and the voltage value of an input signal is close to the first terminal inspection voltage value or close to the second terminal inspection voltage value.

When the voltage value of an input signal gently fluctuates, the present voltage value of the input signal can be considered to be close to the measurement value of an input signal immediately before. Accordingly, the terminal inspection voltage in the measurement period failure detection processing may be set based on a previous value that is measured as the voltage of the input signal in the measurement processing carried out immediately before the measurement period failure detection processing. Thus it is possible to make the difference between the present voltage value of the input signal and the terminal inspection voltage value sufficiently large and detect any terminal failure by a single cycle of measurement period failure detection processing.

Further, the control unit may set a threshold value that is disposed within the variation range, and further sets a first terminal inspection voltage and a second terminal inspection voltage, which are disposed within the variation range. The first terminal inspection voltage is higher than the threshold value, and the second terminal inspection voltage is lower than the threshold value. The control unit carries out the measurement period failure detection processing with using the second terminal inspection voltage as the terminal inspection voltage when the previous value is higher than the threshold value, and the control unit carries out the measurement period failure detection processing with using the first terminal inspection voltage as the terminal inspection voltage when the previous value is lower than the threshold value. Thus it is possible to reliably make the difference between the present voltage value of the input signal and the terminal inspection voltage value sufficiently large.

Alternatively, the inspection capacitor may be arranged on an outside of the measuring device. Thus it is possible to easily change the capacitance of the inspection capacitor according to the parasitic capacitance internal to the measuring device or the like.

Alternatively, a capacitance of the inspection capacitor may be substantially larger than a parasitic capacitance in the measuring device. Thus it is possible to suppress change in the voltage value of the measurement path caused by the influence of parasitic capacitance when continuity is established between the inspection capacitor with a terminal inspection voltage value set thereon and the measurement path. For this reason, the following can be implemented when a terminal failure occurs: the measurement path can be more accurately set to the terminal inspection voltage value through the continuity establishing procedure in measurement period failure detection processing and the accuracy of terminal failure detection can be enhanced.

Alternatively, the signal input circuit may further include: an input-side capacitor having one end connected to the signal input terminal and the other end connected to the reference potential. Thus it is possible to increase the capacitance between the measurement path and reference potential when a terminal failure has not occurred and suppress fluctuation in the voltage value of the measurement path caused by carrying out continuity establishing procedure. For this reason, it is possible to suppress a measurement error in the voltage value of an input signal produced by the influence of measurement period failure detection processing.

Further, a capacitance of the input-side capacitor may be larger than a capacitance of the inspection capacitor. Thus it is possible to suppress change in the voltage value of the signal input terminal and suppress fluctuation in the voltage value of an input signal caused by the influence of measurement period failure detection processing.

In cases where an input-side capacitor is not provided, the following takes place when continuity is established between the inspection capacitor set to the terminal inspection voltage value and the measurement path: the voltage value of the measurement path temporarily varies to the vicinity of the terminal inspection voltage value. Meanwhile, in cases where an input-side capacitor is provided, the capacitance between the measurement path and reference potential is increased. Then the range of variation of the voltage value of the measurement path obtained when continuity is established between the inspection capacitor set to the terminal inspection voltage value and the measurement path becomes narrower than when an input-side capacitor is not provided. Accordingly, the signal input circuit may further include: a voltage change detection unit for detecting a change of the voltage in the measurement path during a predetermined period. In the measurement period failure detection processing, the voltage change detection unit detects the change of the voltage in the measurement path during a period from a first time before the control unit carries out the continuity establishing procedure to a second time after the control unit carries out the continuity establishing procedure, and the control unit detects a failure at the input-side capacitor corresponding to the terminal failure detected in the measurement period failure detection processing, based on the change of the voltage in the measurement path.

The voltage change detection unit that detects the range of variation in the measurement path may be configured as described below. Specifically, the voltage change detection unit may include: a voltage value hold circuit for holding the voltage of the measurement path; and a difference hold circuit for detecting a difference between the voltage in the measurement path and the voltage held by the voltage value hold circuit and for storing the difference. In the measurement period failure detection processing, the control unit controls the voltage value hold circuit to store the voltage in the measurement path at the first time, and controls the difference hold circuit to store the difference between the voltage stored by the voltage value hold circuit and the voltage in the measurement path at the second time, so that the voltage change detection unit detects the change of the voltage in the measurement path between the first time and the second time. Thus it is possible to detect: to what extent the voltage value of the measurement path changes between before and after continuity establishing procedure; when the detected range of variation is equal to or larger than a certain value, consider that an open failure has occurred in a terminal of the input-side capacitor; and thus detect an open failure in the input-side capacitor in parallel to measurement processing.

When the voltage value of an input signal is close to the terminal inspection voltage value, the following takes place: even when an open failure has occurred in the input-side capacitor, the voltage value of the measurement path does not sufficiently change between before and after continuity establishing procedure; and thus the open failure in the input-side capacitor cannot be detected. Accordingly, the control unit may set the terminal inspection voltage to be a first terminal inspection voltage, and carries out the measurement period failure detection processing with using the first terminal inspection voltage. The control unit sets the terminal inspection voltage to be a second terminal inspection voltage, which is different from the first terminal inspection voltage, and carries out the measurement period failure detection processing with using the second terminal inspection voltage. The control unit detects the terminal failure based on data generated in the measurement processing carried out in parallel to the measurement period failure detection processing, and the control unit detects the failure at the input-side capacitor based on the change of the voltage in the measurement path detected in the measurement period failure detection processing with using the first terminal inspection voltage and the change of the voltage in the measurement path detected in the measurement period failure detection processing with using the second terminal inspection voltage. Thus it is possible to make sufficiently large the difference of either of the first terminal inspection voltage value and the second terminal inspection voltage value from the voltage value of an input signal. For this reason, it is possible to cause the voltage value of the measurement path to sufficiently vary between before and after continuity establishing procedure in at least either of the following when an open failure has occurred in the input-side capacitor: the measurement period failure detection processing with the first terminal inspection voltage value and the measurement period failure detection processing with the second terminal inspection voltage value. Therefore, any open failure in the input-side capacitor can be reliably detected by determining whether or not any open failure has occurred in the input-side capacitor based on the following: change in the voltage value of the measurement path detected by these pieces of measurement period failure detection processing.

The signal input circuit may be configured as a multiple-channel circuit to which multiple input signals are inputted. Specifically, the signal input circuit may further include: a plurality of selector switches. The measuring device further includes one or more signal input terminals in addition to the signal input terminal so that a plurality of signal input terminals are equipped in the measuring device. Different input signals are input through the plurality of signal input terminals, respectively. Each selector switch connects and disconnects continuity between a corresponding signal input terminal and the measurement path. The measurement unit selects one of the input signals input from one of the signal input terminals as a measuring object. The measurement unit carries out the measurement processing under a condition that a corresponding selector switch connects between the one of the signal input terminals and the measurement path and the other selector switches disconnect between the other signal input terminals and the measurement path, and the control unit carries out the measurement period failure detection processing with respect to the one of the signal input terminals. Thus it is possible to detect any terminal failure and the like in each signal input terminal provided in the measuring device.

When the voltage value of the inspection capacitor is set to a predetermined inspection voltage value and then continuity is established between any signal input terminal and the inspection capacitor, the following takes place: electric charges migrate between the input-side capacitor provided in the signal input terminal and the inspection capacitor; and the voltage of the signal input terminal is varied. Each signal input terminal of the measuring device may be provided with an input-side resistor that forms a filter circuit together with the input-side capacitor. When an open failure in such an input-side resistor has not occurred, electric charges migrate between the inspection capacitor and the input-side capacitor and an external source. Therefore, after the above voltage change occurs, the voltage value of the signal input terminal returns to the voltage value of an input signal. When an open failure has occurred in the input-side resistor, meanwhile, the migration of electric charges between the capacitors and an external source and the changed voltage is maintained. For this reason, when an open failure in an input-side resistor has occurred, the following takes place by repeating the processing of setting an inspection voltage value on the inspection capacitor and the processing of establishing continuity between the inspection capacitor and any signal input terminal: the voltage of the signal input terminal changes stepwise and approaches the inspection voltage value. Therefore, any open failure in an input-side resistor can be detected by detecting the voltage value of the signal input terminal after these pieces of processing are repeated.

However, in cases where the voltage value of an input signal is close to the inspection voltage value, the following takes place even when an open failure in an input-side resistor has not occurred: after the above pieces of processing are repeated, the signal input terminal takes a voltage value close to the inspection voltage value. Accordingly, the signal input circuit may further include: a plurality of input-side capacitors, each of which has one end connected to a corresponding signal input terminal and the other end connected to the reference potential; and a plurality of input-side resistors, each of which is connected to a corresponding signal input terminal so that the input-side resistor and the input-side capacitor provides a filter circuit. The control unit further carries out a resistor failure detection processing for detecting a resistor failure that occurs at a corresponding input-side resistor as an inspection object. In the resistor failure detection processing, the control unit carries out more than once a procedure in such a manner that continuity between the inspection capacitor and a corresponding signal input terminal connected to the input-side resistor as the inspection object is disconnected by the inspection switch and a corresponding selector switch, and then, the charge and discharge unit sets the voltage between both ends of the inspection capacitor to be a predetermined resistor inspection voltage, and then, continuity between the inspection capacitor and the corresponding signal input terminal is connected by the corresponding selector switch and the inspection switch. The control unit sets the resistor inspection voltage to be a first resistor inspection voltage, and carries out the resistor failure detection processing with using the first resistor inspection voltage. The control unit sets the resistor inspection voltage to be a second resistor inspection voltage, which is different from the first resistor inspection voltage, and carries out the resistor failure detection processing with using the second resistor inspection voltage. The control unit detects the resistor failure based on the voltage of the input signal measured in the measurement processing after each of the resistor failure detection processing with using the first resistor inspection voltage and the resistor failure detection processing with using the second resistor inspection voltage is executed. Thus it can be considered that an open failure in the input-side resistor has occurred in cases where: after resistor failure detection processing is carried out with the first resistor inspection voltage value, the voltage value of the signal input terminal is close to the first resistor inspection voltage value; and after resistor failure detection processing is carried out with the second resistor inspection voltage value, the voltage value of the signal input terminal is close to the second resistor inspection voltage value. For this reason, erroneous detection of an open failure in an input-side resistor can be prevented even in the following cases: cases where the voltage value of an input signal is close to the first resistor inspection voltage value or close to the second resistor inspection voltage value.

When the inspection switch is stuck in ON position, the inspection capacitor and the inspection path take the same voltage value. Accordingly, the control unit may further carry out an inspection switch failure detection processing in such a manner that the control unit controls the charge and discharge unit to set the voltage between both ends of the inspection capacitor to be a predetermined inspection voltage, and the control unit controls the measurement unit to carry out the measurement processing after the control unit controls the inspection switch to disconnect the inspection path, and the control unit detects a failure at the inspection switch based on the voltage of the input signal measured in the measurement processing during the inspection switch failure detection processing. Thus it is possible to detect ON sticking of the inspection switch.

Alternatively, the control unit may further carry out a charge and discharge unit failure detection processing in such a manner that the control unit controls the charge and discharge unit to set the voltage between both ends of the inspection capacitor to be a predetermined inspection voltage under a condition that the control unit controls the inspection switch to disconnect the inspection path, and then, the control unit controls the inspection switch to connect the inspection path under a condition that the control unit controls the selector switches to disconnect continuity between all the signal input terminals and the measurement path, and then, the control unit controls the measurement unit to carry out the measurement processing, and the control unit detects a failure in at least one of the charge and discharge unit, the selector switches, the inspection switch, and the inspection capacitor based on the voltage of the input signal measured in the measurement processing during the charge and discharge unit failure detection processing. More specific description will be given. At normal times, the measurement path takes the inspection voltage value when continuity is established in the inspection path by charge/discharge unit failure detection processing. However, the measurement path does not take the inspection voltage value in the following cases: cases where an inspection voltage value is not originally set on the inspection capacitor (that is, cases where a failure has occurred in the charge/discharge unit or the inspection capacitor); and cases where continuity has been established between the measurement path and an external input terminal and an input signal is inputted to the measurement path (that is, cases where the selector switch is stuck in ON position). Also when continuity is not established between the inspection capacitor and the measurement path because the inspection switch is stuck in OFF position, the measurement path does not take the inspection voltage value. With the signal input circuit described above, for this reason, the following can be implemented by comparing a voltage value measured by measurement processing in charge/discharge unit failure detection processing with the inspection voltage value or taking other like procedure: any failure can be detected in at least any one of the charge/discharge unit, selector switch, inspection switch, and inspection capacitor.

To accurately measure the voltage of an input signal with a conventional AD converter not provided with a detection function for terminal failure or the like, it is necessary to adopt, for example, the following method: one input signal is inputted to at least three AD converters to simultaneously obtain three measurement values; a deviated measurement value is excluded from these measurement values; and an average value is calculated from the remaining measurement values. With the measuring device described in the first aspect of the present disclosure, however, it is possible to determine whether or not the voltage value of an input signal obtained by measurement processing is correct based on the result of detection of a terminal failure or the like. Accordingly, the signal input circuit may further include: another measuring device; and a processor for carrying out a processing based on the voltage of the input signal measured in the measurement processing by the measuring device or the another measuring device. When one of the measuring device and the another measuring device detects a failure in the failure detection processing, the processor carries out the processing based on the voltage of the input signal measured in the measurement processing by the other of the measuring device and the another measuring device. Thus if a terminal failure or the like occurs in either measuring device and the voltage of an input signal cannot be accurately measured, it is possible to obtain a measurement value from the other measuring device. As a result, it is possible to reduce the number of devices for measuring the voltage values of input signals and accurately measure input signals.

Alternatively, the signal input circuit may further include: a transmission unit arranged in the measuring device and transmitting simultaneously both of the measurement data generated in the measurement processing and data indicating the failure detected in the measurement period failure detection processing carried out in parallel to the measurement processing. Thus a device that receives measurement data can grasp whether or not a terminal failure or the like has occurred in the measuring device. Then it can determine whether or not the voltage value indicated by the received measurement data is correct based on the presence or absence of the occurrence of a terminal failure or the like.

Alternatively, the signal input circuit may further include: a storage unit for storing the measurement data and data indicating existence or non-existence of the terminal failure detected in the measurement period failure detection processing carried out in parallel to the measurement processing, in which the measurement data is generated. Even with this configuration, it is possible to determine whether or not the voltage value indicated by measurement data is correct based on the presence or absence of the occurrence of a terminal failure or the like.

According to a second aspect of the present disclosure, an integrated circuit having a signal input terminal, through which an input signal is input into the integrated circuit, the input signal having a voltage variable within a predetermined variation range, the integrated circuit includes: a measurement unit connected to the signal input terminal through a measurement path, and carrying out a measurement processing for measuring the voltage of the input signal, the measurement processing including a reading procedure for reading a voltage of the measurement path and a generation procedure for generating measurement data indicating a read voltage of the measurement path; a charge and discharge unit for charging and discharging an inspection capacitor so that a voltage between both ends of the inspection capacitor is set to be within the predetermined variation range, wherein the inspection capacitor has one end connected to the measurement path and the other end connected to a reference potential, and is arranged on an outside of the integrated circuit; an inspection switch for connecting and disconnecting an inspection path, which connects the inspection capacitor and the measurement path; and a control unit for carrying out a measurement period failure detection processing for detecting a terminal failure that occurs at the signal input terminal or a path connected to the signal input terminal. The control unit carries out the measurement period failure detection processing in parallel to the measurement processing by the measurement unit. The control unit sequentially carries out a charge and discharge procedure and a continuity establishing procedure in the measurement period failure detection processing during a period from time when the measurement unit starts to carry out the measurement processing to time when the measurement unit completes the reading procedure. In the charge and discharge procedure, the control unit controls the inspection switch to disconnect the inspection path and controls the charge and discharge unit to set the voltage between both ends of the inspection capacitor to be a predetermined terminal inspection voltage. In the continuity establishing procedure, the control unit controls the inspection switch to connect the inspection path before the measurement unit completes the reading procedure. The control unit detects the terminal failure based on data generated in the measurement processing.

In the integrated circuit described above, measurement period failure detection processing for detecting any terminal failure is carried out in parallel to measurement processing for measuring the voltage value of an input signal. With this integrated circuit, therefore, it is possible to detect an open failure in the signal input terminal and a break in the communication path for communicating an input signal without delaying detection of the voltage value of the input signal.

According to a third aspect of the present disclosure, an integrated circuit having a signal input terminal, through which an input signal is input into the integrated circuit, the input signal having a voltage variable within a predetermined variation range, the integrated circuit includes: a measurement unit connected to the signal input terminal through a measurement path, and carrying out a measurement processing for measuring the voltage of the input signal, the measurement processing including a reading procedure for reading a voltage of the measurement path and a generation procedure for generating measurement data indicating a read voltage of the measurement path; an inspection capacitor having one end connected to the measurement path and the other end connected to a reference potential; a charge and discharge unit for charging and discharging the inspection capacitor so that a voltage between both ends of the inspection capacitor is set to be within the predetermined variation range; an inspection switch for connecting and disconnecting an inspection path, which connects the inspection capacitor and the measurement path; and a control unit for carrying out a measurement period failure detection processing for detecting a terminal failure that occurs at the signal input terminal or a path connected to the signal input terminal. The control unit carries out the measurement period failure detection processing in parallel to the measurement processing by the measurement unit. The control unit sequentially carries out a charge and discharge procedure and a continuity establishing procedure in the measurement period failure detection processing during a period from time when the measurement unit starts to carry out the measurement processing to time when the measurement unit completes the reading procedure. In the charge and discharge procedure, the control unit controls the inspection switch to disconnect the inspection path and controls the charge and discharge unit to set the voltage between both ends of the inspection capacitor to be a predetermined terminal inspection voltage. In the continuity establishing procedure, the control unit controls the inspection switch to connect the inspection path before the measurement unit completes the reading procedure, and the control unit detects the terminal failure based on data generated in the measurement processing.

In the integrated circuit described above, measurement period failure detection processing for detecting any terminal failure is carried out in parallel to measurement processing for measuring the voltage value of an input signal. With this integrated circuit, therefore, it is possible to detect an open failure in the signal input terminal and a break in the communication path for communicating an input signal without delaying detection of the voltage value of the input signal.

According to a fourth aspect of the present disclosure, a signal input circuit includes: a signal input device having a signal input terminal, through which an input signal is input into the signal input device, the input signal having a voltage variable within a predetermined variation range; an inspection capacitor having one end connected to the signal input terminal and the other end connected to a reference potential; a connection unit arranged in the signal input device and connecting and disconnecting an inspection path, which connects the inspection capacitor and the signal input terminal; a charge and discharge unit arranged in the signal input device and charging and discharging the inspection capacitor so that a voltage between both ends of the inspection capacitor is set to be within the predetermined variation range; and a determination processing unit arranged in the signal input device and carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit sets the terminal inspection voltage to be a first terminal inspection voltage, and carries out the terminal failure detection processing with using the first terminal inspection voltage. The determination processing unit sets the terminal inspection voltage to be a second terminal inspection voltage, which is different from the first terminal inspection voltage, and carries out the terminal failure detection processing with using the second terminal inspection voltage. The determination processing unit detects the terminal failure based on a voltage of the inspection path after each of the terminal failure detection processing with using the first terminal inspection voltage and the terminal failure detection processing with using the second terminal inspection voltage is executed. The terminal failure occurs at the signal input terminal or a communication path of the input signal input from the signal input terminal.

Terminal failure refers to, for example, an open failure in a signal input terminal and a break in a communication path, such as the inspection path, for communicating input signals.

The determination processing unit may include, for example, an AD conversion circuit and it may detect any terminal failure by detecting the voltage value of the inspection path by AD conversion. The determination processing unit may include a circuit for detecting change in the voltage of the inspection path. It may detect any terminal failure by detecting to what extent the voltage value of the inspection path has changed between before and after the continuity establishing procedure.

In the terminal failure detection processing described above, the inspection capacitor is set to the terminal inspection voltage value through the charge/discharge procedure; thereafter, continuity is established between the inspection capacitor and the signal input terminal through the continuity establishing procedure. When a terminal failure has occurred at this time, the inspection capacitor is not connected to a source external to the measuring device and the inspection capacitor is not charged or discharged. For this reason, the voltage value of the inspection path becomes equal to the terminal inspection voltage value generated by the inspection capacitor or a value close thereto. When a terminal failure has not occurred, the inspection capacitor is charged or discharged and the voltage value of the inspection path temporarily becomes equal to a value close to the terminal inspection voltage value generated by the inspection capacitor. Thereafter, however, it becomes equal to the voltage value of the input signal. Therefore, any terminal failure can be detected based on the voltage value of the inspection path after the continuity establishing procedure.

However, if the voltage value of an input signal is close to the terminal inspection voltage value, the following takes place even though a terminal failure has not occurred: the voltage value of the inspection path that underwent the continuity establishing procedure is close to the terminal inspection voltage value and there is a possibility that a terminal failure is erroneously detected.

Consequently, the signal input circuit described above carries out terminal failure detection processing with a first terminal inspection voltage value and terminal failure detection processing with a second terminal inspection voltage value; then it detects any terminal failure based on the voltage value of the inspection path after the execution of each terminal failure detection processing. Thus, for example, the following measure can be taken: it is considered that a terminal failure has occurred in cases where: the voltage value of the inspection path after the execution of terminal failure detection processing with the first terminal inspection voltage value is close to the first terminal inspection voltage value; and at the same time, the voltage value of the inspection path after the execution of terminal failure detection processing with the second terminal inspection voltage value is close to the second terminal inspection voltage value. Therefore, erroneous detection of a terminal failure can be prevented even when the voltage value of the input signal is close to the first terminal inspection voltage value or the second terminal inspection voltage value.

In the signal input circuit described above, as mentioned above, any terminal failure is detected by setting a voltage value within the variation range of an input signal on the inspection capacitor. This makes it unnecessary to make the range of voltage that can be detected by the signal input device wider than the variation range of the input signal. It is possible to prevent complication of the configuration and increase in the size of the signal input device. Or, it is unnecessary to make the variation range of an input signal narrower than the range of voltage that can be detected with the signal input device and it is possible not to impose limitations on an input signal generating source.

With the signal input circuit described above, therefore, the following can be implemented without imposing limitations on an input signal generating source or complication of configuration or increase in size: it is possible to detect any open failure in the signal input terminal to which the input signal is inputted and any break in a communication path for communicating the input signal.

Alternatively, a capacitance of the inspection capacitor may be sufficiently larger than a parasitic capacitance produced in the signal input device. Thus variation in the voltage value of the inspection path caused by the influence of the parasitic capacitance can be suppressed when continuity is established between the inspection capacitor with the terminal inspection voltage value set thereon and the inspection path. For this reason, when a terminal failure occurs, the voltage of the inspection path can be accurately made equal to the terminal inspection voltage value through the continuity establishing procedure in the terminal failure detection processing and the accuracy of terminal failure detection can be enhanced.

Alternatively, the inspection capacitor may be arranged on an outside of the signal input device. This makes it possible to easily change the capacitance of the inspection capacitor according to the parasitic capacitance in the signal input device or the like.

The signal input device may be configured as a multiple-channel device to which multiple input signals are inputted. Specifically, the signal input device may further include one or more signal input terminals in addition to the signal input terminal so that a plurality of signal input terminals are equipped in the signal input device. The connection unit includes an inspection switch and a selector switch. The inspection switch simultaneously connects and disconnects all of inspection paths, each of which connects the inspection capacitor and a corresponding signal input terminal. The selector switch individually connects and disconnects each terminal path between a corresponding signal input terminal and the inspection switch. The inspection switch and the selector switch connect and disconnect continuity of the inspection path with respect to each signal input terminal. The determination processing unit controls the connection unit to disconnect the inspection path with respect to all of the signal input terminals in the charge and discharge procedure. The determination processing unit controls the connection unit to connect the inspection path with respect to one of the signal input terminals and to disconnect the inspection path with respect to other signal input terminals in the continuity establishing procedure. The determination processing unit carries out the terminal failure detection processing with respect to the one of the signal input terminals as an inspection object. The determination processing unit detects the terminal failure with respect to the one of the signal input terminals based on the voltage of the inspection path corresponding to the one of the signal input terminals after the determination processing unit executes the terminal failure detection processing. Thus a terminal failure can be detected in each signal input terminal provided in the signal input device.

Alternatively, the signal input circuit may further include: a plurality of input-side capacitors, each of which is arranged between a corresponding signal input terminal and the reference potential. This makes it possible to increase the capacitance between the inspection path and reference potential when a terminal failure has not occurred and prevent variation in the voltage value of the inspection path caused by carrying out the continuity establishing procedure. For this reason, variation in the voltage value of an input signal caused by the influence of terminal failure detection processing can be suppressed.

Alternatively, a capacitance of each input-side capacitor may be larger than a capacitance of the inspection capacitor. This makes it possible to suppress variation in the voltage value of a signal input terminal and suppress variation in the voltage value of an input signal caused by the influence of terminal failure detection processing.

In cases where an input-side capacitor is not provided, the following takes place when continuity is established between the inspection capacitor set to the predetermined inspection voltage value and the inspection path: the voltage value of the inspection path temporarily varies to the vicinity of the inspection voltage value. Meanwhile, in cases where an input-side capacitor is provided, the capacitance between the inspection path and reference potential is increased. Then the range of variation in the voltage value of the inspection path obtained when continuity is established between the inspection capacitor set to the inspection voltage value and the inspection path becomes narrower than when an input-side capacitor is not provided. Accordingly, the determination processing unit may include: a voltage change detecting device for detecting a change of a voltage of each terminal path as an inspection section between a corresponding signal input terminal and the inspection switch during a predetermined period. The determination processing unit selects one input-side capacitor as an inspection object connected to a corresponding signal input terminal, and carries out a capacitor failure detection processing for detecting a capacitor failure that occurs at the selected input-side capacitor. The determination processing unit controls the charge and discharge unit to set the voltage between both ends of the inspection capacitor to be a predetermined capacitor inspection voltage after the determination processing unit controls the connection unit to disconnect the inspection path with respect to all of the signal input terminals, and then, the determination processing unit carries out the continuity establishing procedure for the corresponding signal input terminal connected to the one input-side capacitor, so that the voltage change detecting device detects the change of the voltage of a corresponding terminal path with respect to the one input-side capacitor between a first time and a second time. The first time is set before the continuity establishing procedure, and the second time is set after the continuity establishing procedure. The determination processing unit detects the capacitor failure based on the change of the voltage in the corresponding terminal path detected in the capacitor failure detection processing. Capacitor failure refers to, for example, an open failure in an input-side capacitor. Thus any open failure in an input-side capacitor can be detected.

in cases where the voltage value of an input signal is close to the capacitor inspection voltage value, the following takes place even though an open failure has occurred in an input-side capacitor: the voltage value of the inspection section does not sufficiently vary between before and after continuity is established in the inspection path and an open failure in the input-side capacitor cannot be detected. Accordingly, the determination processing unit may set the capacitor inspection voltage to be a first capacitor inspection voltage, and carries out the capacitor failure detection processing with using the first capacitor inspection voltage with respect to the one input-side capacitor as the inspection object. The determination processing unit sets the capacitor inspection voltage to be a second capacitor inspection voltage, which is different from the first capacitor inspection voltage, and carries out the capacitor failure detection processing with using the second capacitor inspection voltage with respect to the one input-side capacitor. The determination processing unit detects the capacitor failure based on the change of the voltage in the corresponding terminal path with respect to the one input-side capacitor in each of the capacitor failure detection processing with using the first capacitor inspection voltage and the second capacitor inspection voltage. This makes it possible to make sufficiently large the difference between either the first capacitor inspection voltage value or the second capacitor inspection voltage value and the voltage value of an input signal. For this reason, the following can be implemented with respect to at least either of capacitor failure detection processing with the first capacitor inspection voltage value and capacitor failure detection processing with the second capacitor inspection voltage value: when an open failure has occurred in an input-side capacitor, it is possible to largely change the voltage value of the inspection section between before and after continuity is established in the inspection path. Therefore, it is possible to reliably detect any open failure in the input-side capacitor.

Alternatively, the voltage change detecting device may include: a voltage value hold circuit that holds the voltage of each terminal path; and a difference hold circuit that detects a difference between the voltage of the inspection section and the voltage held by the voltage value hold circuit, and holds the difference. In the capacitor failure detection processing, the determination processing unit controls the voltage value hold circuit to hold the voltage of each terminal path at the first time, and controls the difference hold circuit to hold the difference between the voltage held by the voltage value hold circuit and the voltage of a corresponding terminal path at the second time, so that the determination processing unit detects the change of the voltage of the corresponding inspection section between the first time and the second time. With this configuration, it is possible to reliably detect to what extent the voltage value of an inspection section has changed.

When the voltage value of the inspection capacitor is set to an inspection voltage value and then continuity is established between any signal input terminal and the inspection capacitor, the following takes place: electric charges migrate between the input-side capacitor provided in the signal input terminal and the inspection capacitor; and the voltage of the signal input terminal is varied. Each signal input terminal of the signal input device may be provided with an input-side resistor that forms a filter circuit together with the input-side capacitor. When an open failure in such an input-side resistor has not occurred, electric charges migrate between the inspection capacitor and the input-side capacitor and an external source. Therefore, after the above voltage change occurs, the voltage value of the signal input terminal returns to the voltage value of an input signal. When an open failure has occurred in the input-side resistor, meanwhile, the migration of electric charges between the capacitors and an external source is not caused and the changed voltage is maintained.

For this reason, when an open failure in an input-side resistor has occurred, the following takes place by repeating the processing of setting an inspection voltage value on the inspection capacitor and the processing of establishing continuity between the inspection capacitor and any signal input terminal: the voltage of the signal input terminal changes stepwise and approaches the inspection voltage value. Therefore, any open failure in an input-side resistor can be detected by detecting the voltage value of the signal input terminal after these pieces of processing are repeated. Accordingly, the signal input circuit may further include: a plurality of input-side resistors, each of which is connected to a corresponding signal input terminal so that the input-side resistor and the input-side capacitor provides a filter circuit. The determination processing unit selects one input-side resistor as an inspection object, and carries out a resistor failure detection processing for detecting a resistor failure that occurs at the one input-side resistor. In the resistor failure detection processing, the determination processing unit carries out a certain procedure more than once. In the certain procedure, the determination processing unit controls the connection unit to disconnect the inspection path corresponding to the one input-side resistor, controls the charge and discharge unit to set the voltage between both ends of the inspection capacitor to be a predetermined resistor inspection voltage, and then, controls the connection unit to connect the inspection path. The determination processing unit detects the resistor failure based on the voltage of the inspection path after the resistor failure detection processing. Resistor failure refers to, for example, an open failure in an input-side resistor and the like. Thus any open failure in an input-side resistor can be detected.

In cases where the voltage value of an input signal is close to the resistor inspection voltage value, the following takes place even though an open failure has not occurred in an input-side resistor: after the above processing is repeated, the signal input terminal takes a voltage value close to the resistor inspection voltage value. Accordingly, the determination processing unit may select one input-side resistor as an inspection object. The determination processing unit sets the resistor inspection voltage to be a first resistor inspection voltage, and carries out the resistor failure detection processing with using the first resistor inspection voltage. The determination processing unit sets the resistor inspection voltage to be a second resistor inspection voltage, which is different from the first resistor inspection voltage, and carries out the resistor failure detection processing with using the second resistor inspection voltage. The determination processing unit detects the resistor failure based on the voltage of the inspection path after each of the resistor failure detection processing with using the first resistor inspection voltage and the resistor failure detection processing with using the second resistor inspection voltage is executed. Thus it can be considered that an open failure has occurred in the input-side resistor in cases where: the voltage value of the signal input terminal after the execution of resistor failure detection processing with the first resistor inspection voltage value is close to the first resistor inspection voltage value; and at the same time, the voltage value of the signal input terminal after the execution of resistor failure detection processing with the second resistor inspection voltage value is close to the second resistor inspection voltage value. For this reason, erroneous detection of an open failure in an input-side resistor can be prevented even when the voltage value of the input signal is close to the first resistor inspection voltage value or the second resistor inspection voltage value.

When the inspection switch has been stuck in ON position and continuity is constantly established in the inspection path, the inspection capacitor and the inspection path take an identical voltage value. Accordingly, the determination processing unit may carry out an inspection switch failure detection processing. In the inspection switch failure detection processing, the determination processing unit controls the inspection switch to disconnect the inspection path, and controls the charge and discharge unit to set the voltage between both ends of the inspection capacitor to be a predetermined inspection voltage. The determination processing unit detects a failure in the inspection switch based on the voltage of the inspection path after the determination processing unit carries out the inspection switch failure detection processing. This makes it possible to detect ON sticking of the inspection switch.

Alternatively, the determination processing unit may carry out a charge and discharge unit failure detection processing. In the charge and discharge unit failure detection processing, the determination processing unit controls the inspection switch to disconnect the inspection path, controls the selection switch to disconnect all of the terminal paths with respect to all of the signal input terminals, controls the charge and discharge unit to set the voltage between both ends of the inspection capacitor to be a predetermined inspection voltage, and then, controls the inspection switch to connect the inspection path. The determination processing unit detects a failure with respect to at least one of the charge and discharge unit, the connection unit, and the inspection capacitor based on the voltage of the inspection path after the determination processing unit carries out the charge and discharge unit failure detection processing. More specific description will be given. At normal times, the inspection path takes the inspection voltage value when continuity is established in the inspection path by charge/discharge unit failure detection processing. However, there is a possibility that the inspection path does not take the inspection voltage value in the following cases: cases where an inspection voltage value is not originally set on the inspection capacitor (that is, cases where a failure has occurred in the charge/discharge unit or the inspection capacitor); and cases where continuity has been established in a terminal path and an input signal is inputted to the inspection path (that is, cases where the selector switch is stuck in ON position). Also when the inspection switch is stuck in OFF position and the inspection path is constantly interrupted, there is a possibility that the inspection path does not take the inspection voltage value. With the signal input circuit described above, the following can be implemented by comparing the voltage value of the inspection path after the execution of charge/discharge unit failure detection processing with the inspection voltage value or taking other like procedure: any failure can be detected in at least any one of the charge/discharge unit, selector switch, inspection switch, and inspection capacitor.

According to a fifth aspect of the present disclosure, an integrated circuit having a signal input terminal, through which an input signal is input into the integrated circuit, the input signal having a voltage variable within a predetermined variation range, the integrated circuit includes: a connection unit for connecting and disconnecting an inspection path, which connects an inspection capacitor and the signal input terminal, the inspection capacitor arranged on an outside of the integrated circuit and having one end connected to a reference potential; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit sets the terminal inspection voltage to be a first terminal inspection voltage, and carries out the terminal failure detection processing with using the first terminal inspection voltage. The determination processing unit sets the terminal inspection voltage to be a second terminal inspection voltage, which is different from the first terminal inspection voltage, and carries out the terminal failure detection processing with using the second terminal inspection voltage. The determination processing unit detects the terminal failure based on a voltage of the inspection path after each of the terminal failure detection processing with using the first terminal inspection voltage and the terminal failure detection processing with using the second terminal inspection voltage is executed. The terminal failure occurs at the signal input terminal or a communication path of the input signal input from the signal input terminal.

With the integrated circuit described above, the following can be implemented without imposing limitations on an input signal generating source or complication of configuration or increase in size: it is possible to detect any open failure in the signal input terminal to which the input signal is inputted and any break in a communication path for communicating the input signal.

According to a sixth aspect of the present disclosure, an integrated circuit having a signal input terminal, through which an input signal is input into the integrated circuit, the input signal having a voltage variable within a predetermined variation range, the integrated circuit includes: an inspection capacitor having one end connected to the signal input terminal and the other end connected to a reference potential; a connection unit for connecting and disconnecting an inspection path, which connects the inspection capacitor and the signal input terminal; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit sets the terminal inspection voltage to be a first terminal inspection voltage, and carries out the terminal failure detection processing with using the first terminal inspection voltage. The determination processing unit sets the terminal inspection voltage to be a second terminal inspection voltage, which is different from the first terminal inspection voltage, and carries out the terminal failure detection processing with using the second terminal inspection voltage. The determination processing unit detects the terminal failure based on a voltage of the inspection path after each of the terminal failure detection processing with using the first terminal inspection voltage and the terminal failure detection processing with using the second terminal inspection voltage is executed. The terminal failure occurs at the signal input terminal or a communication path of the input signal input from the signal input terminal.

With the integrated circuit described above, the following can be implemented without imposing limitations on an input signal generating source or complication of configuration or increase in size: it is possible to detect any open failure in the signal input terminal to which the input signal is inputted and any break in a communication path for communicating the input signal.

According to a seventh aspect of the present disclosure, a signal input circuit includes: a signal input device having a signal input terminal, through which an input signal is input into the signal input device, the input signal having a voltage variable within a predetermined variation range; an input-side capacitor arranged between the signal input terminal and a reference potential; an inspection capacitor having one end connected to the signal input terminal and the other end connected to the reference potential; a connection unit arranged in the signal input device and connecting and disconnecting an inspection path between the inspection capacitor and the signal input terminal; a charge and discharge unit arranged in the signal input device and charging and discharging the inspection capacitor so that a voltage between both ends of the inspection capacitor is set to be within the predetermined variation range; and a determination processing unit arranged in the signal input device and carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed. The terminal failure occurs at the signal input terminal or a communication path of the input signal input from the signal input terminal.

In the terminal failure detection processing described above, the inspection capacitor is set to a terminal inspection voltage value through the charge/discharge procedure; and thereafter, continuity is established between the inspection capacitor and the signal input terminal through the continuity establishing procedure. When a terminal failure has occurred at this time, the inspection capacitor is not connected to a source external to the measuring device and the inspection capacitor is not charged or discharged. For this reason, the voltage value of the inspection path becomes equal to the terminal inspection voltage value generated by the inspection capacitor or a value close thereto.

When a terminal failure has not occurred, meanwhile, the inspection capacitor is charged and discharged and the voltage value of the inspection path temporarily becomes equal to a value close to the terminal inspection voltage value generated by the inspection capacitor; and it thereafter becomes equal to the voltage value of the input signal. Therefore, any terminal failure can be detected based on the voltage value of the inspection path after the continuity establishing procedure. In the signal input circuit described above, the input-side capacitor is provided in the signal input terminal and it is possible to increase the capacitance of the capacitor provided between the inspection path and reference potential. This makes it possible to suppress variation in the voltage value of an input signal flowing through the inspection path when the continuity establishing procedure is carried out. Further, a CR filter provided in the signal input terminal can be formed of the input-side capacitor. With the signal input circuit described above, it is possible to change the capacitance of the inspection capacitor to the time constant of the CR filter and flexibly change the accuracy and time of terminal failure detection.

With the signal input circuit described above, therefore, it is possible to suppress variation in the voltage of an input signal and detect any open failure in the signal input terminal to which an input signal is inputted and any break in a communication path for transmitting input signals.

The signal input device may be configured as a multiple-channel device to which multiple input signals are inputted. Accordingly, the signal input device may further include one or more signal input terminals in addition to the signal input terminal so that a plurality of signal input terminals are equipped in the signal input device. Different input signals are input through the plurality of signal input terminals, respectively. The connection unit connects and disconnects the inspection path corresponding to each signal input terminal. The determination processing unit carries out the terminal failure detection processing with respect to one of the signal input terminals as an inspection object. The determination processing unit controls the connection unit to disconnect the inspection path with respect to all of the signal input terminals in the charge and discharge procedure. The determination processing unit controls the connection unit to connect the inspection path with respect to the one of the signal input terminals in the continuity establishing procedure. This makes it possible to detect any terminal failure with respect to each signal input terminal provided in the signal input device.

Alternatively, a capacitance of the inspection capacitor may be sufficiently larger than a parasitic capacitance produced in the signal input device. This makes it possible to suppress change in the voltage value of an inspection path caused by the influence of parasitic capacitance when continuity is established between the inspection capacitor with the terminal inspection voltage value set thereon and the inspection path. When a terminal failure occurs, for this reason, it is possible to more accurately bring the inspection path to the terminal inspection voltage value through the continuity establishing procedure in terminal failure detection processing and enhance the accuracy of terminal failure detection.

Alternatively, a capacitance of the input-side capacitor may be larger than a capacitance of the inspection capacitor. This makes it possible to suppress change in the voltage value of a signal input terminal and suppress variation in the voltage value of an input signal caused by the influence of terminal failure detection processing.

Alternatively, the inspection capacitor may be arranged on an outside of the signal input device. This makes it possible to easily change the capacitance of the inspection capacitor according to an input-side capacitor, the parasitic capacitance in the signal input device, or the like.

If the voltage value of an input signal is close to the terminal inspection voltage value, the following takes place even though a terminal failure has not occurred: the voltage value of the inspection path that underwent the continuity establishing procedure is close to the terminal inspection voltage value and there is a possibility that a terminal failure is erroneously detected. Accordingly, the charge and discharge unit may change the voltage between both ends of the inspection capacitor. This makes it possible to set the inspection voltage value to a value different from the voltage value of an input signal; and thus any failure can be detected by failure detection processing whatever value the voltage value of an input signal is.

Alternatively, the determination processing unit may set the terminal inspection voltage to be a first terminal inspection voltage, and carry out the terminal failure detection processing with using the first terminal inspection voltage. The determination processing unit sets the terminal inspection voltage to be a second terminal inspection voltage, which is different from the first terminal inspection voltage, and carries out the terminal failure detection processing with using the second terminal inspection voltage. The determination processing unit detects the terminal failure based on a voltage of the inspection path after each of the terminal failure detection processing with using the first terminal inspection voltage and the terminal failure detection processing with using the second terminal inspection voltage is executed. This makes it possible to consider that a terminal failure has occurred in the following cases or take other like measures: cases where the voltage value of the inspection path after the execution of terminal failure detection processing with the first terminal inspection voltage value is close to the first terminal inspection voltage value; and at the same time, the voltage value of the inspection path after the execution of terminal failure detection processing with the second terminal inspection voltage value is close to the second terminal inspection voltage value. Therefore, it is possible to prevent erroneous detection of a terminal failure even when the voltage value of an input signal is close to the first terminal inspection voltage value or close to the second terminal inspection voltage value.

According to a eighth aspect of the present disclosure, an integrated circuit having a signal input terminal, through which an input signal is input into the integrated circuit, the input signal having a voltage variable within a predetermined variation range, the integrated circuit includes: an input-side capacitor arranged between the signal input terminal and a reference potential; a connection unit for connecting and disconnecting an inspection path, which connects an inspection capacitor and the signal input terminal, the inspection capacitor arranged on an outside of the integrated circuit and having one end connected to the reference potential; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed. The terminal failure occurs at the signal input terminal or a communication path of the input signal input from the signal input terminal.

With the integrated circuit described above, it is possible to suppress variation in the voltage of an input signal and detect any open failure in the signal input terminal to which an input signal is inputted and any break in a communication path for transmitting input signals.

According to a ninth aspect of the present disclosure, an integrated circuit having a signal input terminal, through which an input signal is input into the integrated circuit, the input signal having a voltage variable within a predetermined variation range, the integrated circuit includes: an input-side capacitor arranged between the signal input terminal and a reference potential; an inspection capacitor having one end connected to the signal input terminal and the other end connecting to the reference potential; a connection unit for connecting and disconnecting an inspection path, which connects the inspection capacitor and the signal input terminal; a charge and discharge unit for charging and discharging the inspection capacitor so that a voltage between both ends of the inspection capacitor is set to be within the predetermined variation range; and a determination processing unit for carrying out a terminal failure detection processing. The determination processing unit sequentially carries out a charge and discharge procedure and a continuity establishing procedure in the terminal failure detection processing. In the charge and discharge procedure, the determination processing unit controls the connection unit to disconnect the inspection path and controls the charge and discharge unit to set the voltage between both ends of the inspection capacitor to be a predetermined terminal inspection voltage. In the continuity establishing procedure, the determination processing unit controls the connection unit to connect the inspection path. The determination processing unit detects the terminal failure based on a voltage of the inspection path after the terminal failure detection processing is executed. The terminal failure occurs at the signal input terminal or a communication path of the input signal input from the signal input terminal.

With the integrated circuit described above, it is possible to suppress variation in the voltage of an input signal and detect any open failure in the signal input terminal to which an input signal is inputted and any break in a communication path for transmitting input signals.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A signal input circuit comprising:
a signal input device having a signal input terminal, through which an input signal is input into the signal input device, the input signal having a voltage variable within a predetermined variation range;
an inspection capacitor having one end connected to the signal input terminal and the other end connected to a reference potential;
a connection unit arranged in the signal input device and connecting and disconnecting an inspection path between the inspection capacitor and the signal input terminal;
a charge and discharge unit arranged in the signal input device and charging and discharging the inspection capacitor so that a voltage between both ends of the inspection capacitor is set to be within the predetermined variation range; and
a determination processing unit arranged in the signal input device and carrying out a terminal failure detection processing,
wherein the determination processing unit sequentially carries out a charge and discharge procedure and a continuity establishing procedure in the terminal failure detection processing,
wherein, in the charge and discharge procedure, the determination processing unit controls the connection unit to disconnect the inspection path and controls the charge and discharge unit to set the voltage between both ends of the inspection capacitor to be a predetermined terminal inspection voltage,
wherein, in the continuity establishing procedure, the determination processing unit controls the connection unit to connect the inspection path,
wherein the determination processing unit detects the terminal failure based on a voltage of the inspection path after the terminal failure detection processing is executed, and
wherein the terminal failure occurs at the signal input terminal or a communication path of the input signal input from the signal input terminal.

2. The signal input circuit of claim 1,
wherein the signal input device further includes one or more signal input terminals in addition to the signal input terminal so that a plurality of signal input terminals are equipped in the signal input device,
wherein different input signals are input through the plurality of signal input terminals, respectively,
wherein the connection unit connects and disconnects the inspection path corresponding to each signal input terminal,
wherein the determination processing unit carries out the terminal failure detection processing with respect to one of the signal input terminals as an inspection object, and
wherein the determination processing unit controls the connection unit to disconnect the inspection path with respect to all of the signal input terminals in the charge and discharge procedure, and
wherein the determination processing unit controls the connection unit to connect the inspection path with respect to the one of the signal input terminals in the continuity establishing procedure.

3. The signal input circuit of claim 1,
wherein a capacitance of the inspection capacitor is sufficiently larger than a parasitic capacitance produced in the signal input device.

4. The signal input circuit of claim 1, further comprising:
an input-side capacitor arranged between the signal input terminal and the reference potential;
wherein a capacitance of the input-side capacitor is larger than a capacitance of the inspection capacitor.

5. The signal input circuit of claim 1,
wherein the inspection capacitor is arranged on an outside of the signal input device.

6. The signal input circuit of claim 1,
wherein the charge and discharge unit changes the voltage between both ends of the inspection capacitor.

7. The signal input circuit of claim 6,
wherein the determination processing unit sets the terminal inspection voltage to be a first terminal inspection voltage, and carries out the terminal failure detection processing with using the first terminal inspection voltage, and wherein the determination processing unit sets the terminal inspection voltage to be a second terminal inspection voltage, which is different from the first terminal inspection voltage, and carries out the terminal failure detection processing with using the second terminal inspection voltage, wherein the determination processing unit detects the terminal failure based on a voltage of the inspection path after each of the terminal failure detection processing with using the first terminal inspection voltage and the terminal failure detection processing with using the second terminal inspection voltage is executed.

8. The signal input circuit of claim 2, wherein the connection unit includes an inspection switch and a selector switch, wherein the inspection switch simultaneously connects and disconnects all of inspection paths, each of which connects the inspection capacitor and a corresponding signal input terminal, wherein the selector switch individually connects and disconnects each terminal path between a corresponding signal input terminal and the inspection switch, wherein the inspection switch and the selector switch connect and disconnect continuity of the inspection path with respect to each signal input terminal, wherein the determination processing unit controls the connection unit to connect the inspection path with respect to the one of the signal input terminals and to disconnect the inspection path with respect to other signal input terminals in the continuity establishing procedure, and wherein the determination processing unit detects the terminal failure with respect to the one of the signal input terminals based on the voltage of the inspection path corresponding to the one of the signal input terminals after the determination processing unit executes the terminal failure detection processing.

9. The signal input circuit of claim 8, further comprising:
a plurality of input-side capacitors, each of which is arranged between a corresponding signal input terminal and the reference potential.

10. The signal input circuit of claim 9, wherein the determination processing unit includes:
  a voltage change detecting device for detecting a change of a voltage of each terminal path as an inspection section between a corresponding signal input terminal and the inspection switch during a predetermined period, wherein the determination processing unit selects one input-side capacitor as an inspection object connected to a corresponding signal input terminal, and carries out a capacitor failure detection processing for detecting a capacitor failure that occurs at the selected input-side capacitor, wherein the determination processing unit controls the charge and discharge unit to set the voltage between both ends of the inspection capacitor to be a predetermined capacitor inspection voltage after the determination processing unit controls the connection unit to disconnect the inspection path with respect to all of the signal input terminals, and then, the determination processing unit carries out the continuity establishing procedure for the corresponding signal input terminal connected to the one input-side capacitor, so that the voltage change detecting device detects the change of the voltage of a corresponding terminal path with respect to the one input-side capacitor between a first time and a second time, wherein the first time is set before the continuity establishing procedure, and the second time is set after the continuity establishing procedure, and wherein the determination processing unit detects the capacitor failure based on the change of the voltage in the corresponding terminal path detected in the capacitor failure detection processing.

11. The signal input circuit of claim 10, wherein the determination processing unit sets the capacitor inspection voltage to be a first capacitor inspection voltage, and carries out the capacitor failure detection processing with using the first capacitor inspection voltage with respect to the one input-side capacitor as the inspection object, wherein the determination processing unit sets the capacitor inspection voltage to be a second capacitor inspection voltage, which is different from the first capacitor inspection voltage, and carries out the capacitor failure detection processing with using the second capacitor inspection voltage with respect to the one input-side capacitor, and wherein the determination processing unit detects the capacitor failure based on the change of the voltage in the corresponding terminal path with respect to the one input-side capacitor in each of the capacitor failure detection processing with using the first capacitor inspection voltage and the second capacitor inspection voltage.

12. The signal input circuit of claim 10, wherein the voltage change detecting device includes:
  a voltage value hold circuit that holds the voltage of each terminal path; and
  a difference hold circuit that detects a difference between the voltage of the inspection section and the voltage held by the voltage value hold circuit, and holds the difference, and wherein, in the capacitor failure detection processing, the determination processing unit controls the voltage value hold circuit to hold the voltage of each terminal path at the first time, and controls the difference hold circuit to hold the difference between the voltage held by the voltage value hold circuit and the voltage of a corresponding terminal path at the second time, so that the determination processing unit detects the change of the voltage of the corresponding inspection section between the first time and the second time.

13. The signal input circuit of claim 9, further comprising:
a plurality of input-side resistors, each of which is connected to a corresponding signal input terminal so that the input-side resistor and the input-side capacitor provides a filter circuit, wherein the determination processing unit selects one input-side resistor as an inspection object, and carries out a resistor failure detection processing for detecting a resistor failure that occurs at the one input-side resistor, wherein, in the resistor failure detection processing, the determination processing unit carries out a certain procedure more than once, wherein, in the certain procedure, the determination processing unit controls the connection unit to disconnect the inspection path corresponding to the one input-side resistor, controls the charge and discharge unit to set the voltage between both ends of the inspection capacitor to be a predetermined resistor inspection voltage, and then, controls the connection unit to connect the inspection path, and wherein the determination processing unit detects the resistor failure based on the voltage of the inspection path after the resistor failure detection processing.

14. The signal input circuit of claim 13, wherein the determination processing unit selects one input-side resistor as an inspection object, wherein the determination processing unit sets the resistor inspection voltage to be a first resistor inspection voltage, and carries out the resistor failure detection processing with using the first resistor inspection voltage, wherein the determination processing unit sets the resistor inspection voltage to be a second resistor inspection voltage, which is different from the first resistor inspection voltage, and carries out the resistor failure detection processing with using the second resistor inspection voltage, and wherein the determination processing unit detects the resistor failure based on the voltage of the inspection path after each of the resistor failure detection processing with using the first resistor inspection voltage and the resistor failure detection processing with using the second resistor inspection voltage is executed.

15. The signal input circuit of claim 9, wherein the determination processing unit carries out an inspection switch failure detection processing, wherein, in the inspection switch failure detection processing, the determination processing unit controls the inspection switch to disconnect the inspection path, and controls the charge and discharge unit to set the voltage between both ends of the inspection capacitor to be a predetermined inspection voltage, and wherein the determination processing unit detects a failure in the inspection switch based on the voltage of the inspection path after the determination processing unit carries out the inspection switch failure detection processing.

16. The signal input circuit of claim 9, wherein the determination processing unit carries out a charge and discharge unit failure detection processing, wherein, in the charge and discharge unit failure detection processing, the determination processing unit controls the inspection switch to disconnect the inspection path, controls the selection switch to disconnect all of the terminal paths with respect to all of the signal input terminals, controls the charge and discharge unit to set the voltage between both ends of the inspection capacitor to be a predetermined inspection voltage, and then, controls the inspection switch to connect the inspection path, and wherein the determination processing unit detects a failure with respect to at least one of the charge and discharge unit, the connection unit, and the inspection capacitor based on the voltage of the inspection path after the determination processing unit carries out the charge and discharge unit failure detection processing.

17. The signal input circuit of claim 7, wherein the determination processing unit includes a measurement unit and a control unit, wherein the measurement unit is connected to the signal input terminal through the inspection path, and carries out a measurement processing for measuring the voltage of the input signal, the measurement processing including a reading procedure for reading a voltage of the inspection path and a generation procedure for generating measurement data indicating a read voltage of the inspection path, wherein the control unit is arranged in the measuring device and carries out the termination failure detection processing, wherein the control unit carries out the termination failure detection processing in parallel to the measurement processing by the measurement unit, wherein the control unit sequentially carries out the charge and discharge procedure and the continuity establishing procedure in the termination failure detection processing during a period from time when the measurement unit starts to carry out the measurement processing to time when the measurement unit completes the reading procedure, wherein, in the continuity establishing procedure, the control unit controls the connection unit to connect the inspection path before the measurement unit completes the reading procedure, and wherein the control unit detects the terminal failure based on data generated in the measurement processing.

18. The signal input circuit of claim 17, wherein the terminal inspection voltage in the termination failure detection processing is set based on a previous value that is measured as the voltage of the input signal in the measurement processing carried out immediately before the termination failure detection processing.

19. The signal input circuit of claim 18, wherein the control unit sets a threshold value that is disposed within the variation range, and further sets the first terminal inspection voltage and the second terminal inspection voltage, which are disposed within the variation range, wherein the first terminal inspection voltage is higher than the threshold value, and the second terminal inspection voltage is lower than the threshold value, wherein the control unit carries out the termination failure detection processing with using the second terminal inspection voltage as the terminal inspection voltage when the previous value is higher than the threshold value, and wherein the control unit carries out the termination failure detection processing with using the first terminal inspection voltage as the terminal inspection voltage when the previous value is lower than the threshold value.

20. The signal input circuit of claim 17, further comprising:

another signal input device; and a processor for carrying out a processing based on the voltage of the input signal measured in the measurement processing by the signal input device or the another signal input device, wherein, when one of the signal input device and the another signal input device detects a failure in the terminal failure detection processing, the processor carries out the processing based on the voltage of the input signal measured in the measurement processing by the other of the signal input device and the another signal input device.

21. The signal input circuit of claim 17, further comprising:

a transmission unit arranged in the signal input device and transmitting simultaneously both of the measurement data generated in the measurement processing and data indicating the failure detected in the terminal failure detection processing carried out in parallel to the measurement processing.

22. The signal input circuit of claim 17, further comprising:
a storage unit for storing the measurement data and data indicating existence or non-existence of the terminal failure detected in the terminal failure detection processing carried out in parallel to the measurement processing, in which the measurement data is generated.

23. An integrated circuit having a signal input terminal, through which an input signal is input into the integrated circuit, the input signal having a voltage variable within a predetermined variation range, the integrated circuit comprising:
an input-side capacitor arranged between the signal input terminal and a reference potential;
a connection unit for connecting and disconnecting an inspection path, which connects an inspection capacitor and the signal input terminal, the inspection capacitor arranged on an outside of the integrated circuit and having one end connected to the reference potential;
a charge and discharge unit for charging and discharging the inspection capacitor so that a voltage between both ends of the inspection capacitor is set to be within the predetermined variation range; and
a determination processing unit for carrying out a terminal failure detection processing,
wherein the determination processing unit sequentially carries out a charge and discharge procedure and a continuity establishing procedure in the terminal failure detection processing,
wherein, in the charge and discharge procedure, the determination processing unit controls the connection unit to disconnect the inspection path and controls the charge and discharge unit to set the voltage between both ends of the inspection capacitor to be a predetermined terminal inspection voltage,
wherein, in the continuity establishing procedure, the determination processing unit controls the connection unit to connect the inspection path,
wherein the determination processing unit detects the terminal failure based on a voltage of the inspection path after the terminal failure detection processing is executed, and
wherein the terminal failure occurs at the signal input terminal or a communication path of the input signal input from the signal input terminal.

24. The integrated circuit of claim 23,
wherein the determination processing unit includes a measurement unit and a control unit,
wherein the measurement unit is connected to the signal input terminal through the inspection path, and carries out a measurement processing for measuring the voltage of the input signal, the measurement processing including a reading procedure for reading a voltage of the inspection path and a generation procedure for generating measurement data indicating a read voltage of the inspection path,
wherein the control unit carries out the terminal failure detection processing for detecting the terminal failure,
wherein the control unit carries out the terminal failure detection processing in parallel to the measurement processing by the measurement unit,
wherein the control unit sequentially carries out the charge and discharge procedure and the continuity establishing procedure in the terminal failure detection processing during a period from time when the measurement unit starts to carry out the measurement processing to time when the measurement unit completes the reading procedure,
wherein, in the continuity establishing procedure, the control unit controls the connection unit to connect the inspection path before the measurement unit completes the reading procedure, and
wherein the control unit detects the terminal failure based on data generated in the measurement processing.

25. An integrated circuit having a signal input terminal, through which an input signal is input into the integrated circuit, the input signal having a voltage variable within a predetermined variation range, the integrated circuit comprising:
an input-side capacitor arranged between the signal input terminal and a reference potential;
an inspection capacitor having one end connected to the signal input terminal and the other end connecting to the reference potential;
a connection unit for connecting and disconnecting an inspection path, which connects the inspection capacitor and the signal input terminal;
a charge and discharge unit for charging and discharging the inspection capacitor so that a voltage between both ends of the inspection capacitor is set to be within the predetermined variation range; and
a determination processing unit for carrying out a terminal failure detection processing,
wherein the determination processing unit sequentially carries out a charge and discharge procedure and a continuity establishing procedure in the terminal failure detection processing,
wherein, in the charge and discharge procedure, the determination processing unit controls the connection unit to disconnect the inspection path and controls the charge and discharge unit to set the voltage between both ends of the inspection capacitor to be a predetermined terminal inspection voltage,
wherein, in the continuity establishing procedure, the determination processing unit controls the connection unit to connect the inspection path,
wherein the determination processing unit detects the terminal failure based on a voltage of the inspection path after the terminal failure detection processing is executed, and
wherein the terminal failure occurs at the signal input terminal or a communication path of the input signal input from the signal input terminal.

26. The integrated circuit of claim 25,
wherein the determination processing unit includes a measurement unit and a control unit,
wherein the measurement unit is connected to the signal input terminal through the inspection path, and carries out a measurement processing for measuring the voltage of the input signal, the measurement processing including a reading procedure for reading a voltage of the measurement path and a generation procedure for generating measurement data indicating a read voltage of the inspection path,
wherein the control unit carries out the terminal failure detection processing for detecting the terminal failure,
wherein the control unit carries out the terminal failure detection processing in parallel to the measurement processing by the measurement unit,
wherein the control unit sequentially carries out the charge and discharge procedure and the continuity establishing procedure in the terminal failure detection processing during a period from time when the measurement unit starts to carry out the measurement processing to time when the measurement unit completes the reading procedure, wherein, in the continuity establishing procedure, the control unit controls the connection unit to connect the inspection path before the measurement unit completes the reading procedure, and wherein the control unit detects the terminal failure based on data generated in the measurement processing.

* * * * *